(12) United States Patent
Sakai et al.

(10) Patent No.: US 11,976,227 B2
(45) Date of Patent: May 7, 2024

(54) FABRICATION PROCESS FOR A/M/X MATERIALS

(71) Applicant: OXFORD UNIVERSITY INNOVATION LIMITED, Oxford (GB)

(72) Inventors: Nobuya Sakai, Oxford (GB); Bernard Wenger, Oxford (GB); Henry James Snaith, Oxford (GB)

(73) Assignee: OXFORD UNIVERSITY INNOVATION LIMITED, Oxford (GB)

(*) Notice: Subject to any disclaimer, the term of this patent is extended or adjusted under 35 U.S.C. 154(b) by 360 days.

(21) Appl. No.: 17/259,712

(22) PCT Filed: Jul. 12, 2019

(86) PCT No.: PCT/GB2019/051961
§ 371 (c)(1),
(2) Date: Jan. 12, 2021

(87) PCT Pub. No.: WO2020/012193
PCT Pub. Date: Jan. 16, 2020

(65) Prior Publication Data
US 2021/0230480 A1 Jul. 29, 2021

(30) Foreign Application Priority Data
Jul. 13, 2018 (GB) ...................................... 1811539

(51) Int. Cl.
C09K 11/66 (2006.01)
C01G 21/16 (2006.01)
(Continued)

(52) U.S. Cl.
CPC ............ *C09K 11/665* (2013.01); *C01G 21/16* (2013.01); *C07F 1/005* (2013.01); *C09K 11/06* (2013.01);
(Continued)

(58) Field of Classification Search
CPC . C09K 11/0827; C09K 11/0833; C09K 11/61; C09K 11/615; C09K 11/616; C09K 11/665
See application file for complete search history.

(56) References Cited

U.S. PATENT DOCUMENTS 9,880,458 B1 1/2018 Irwin et al.
2016/0122634 A1 5/2016 Ren
2018/0298278 A1* 10/2018 Zhong .................... H10K 59/00

FOREIGN PATENT DOCUMENTS

CN 104505462 A 4/2015
CN 107099290 A 8/2017
(Continued)

OTHER PUBLICATIONS

Wikipedia. Dimethylacetamide. Retrieved on Mar. 9, 2023 from en.wikipedia.org/wiki/Dimethylacetamide.*
(Continued)

*Primary Examiner* — Matthew E. Hoban
(74) *Attorney, Agent, or Firm* — Quarles & Brady LLP

(57) ABSTRACT

The invention relates to a process for producing a crystalline A/M/X material, which crystalline A/M/X material comprises a compound of formula $[A]_a[M]_b[X]_c$ wherein: [A] comprises one or more A cations; [M] comprises one or more M cations which are metal or metalloid cations; [X] comprises one or more X anions; a is a number from 1 to 6; b is a number from 1 to 6; and c is a number from 1 to 18. The process is capable of producing crystalline A/M/X materials while precisely controlling their stoichiometry,
(Continued)

leading to products with finely tunable optical properties such as peak emission wavelength. The invention also relates to process for producing a thin film comprising the crystalline A/M/X material of the invention, and to a thin film obtainable by the process of the invention. An optoelectronic device comprising the thin film is also provided.

25 Claims, 20 Drawing Sheets

(51) Int. Cl.
    *C07F 1/00*     (2006.01)
    *C09K 11/06*     (2006.01)
    *C09K 11/08*     (2006.01)
    *H01L 31/055*     (2014.01)
    *H01L 33/50*     (2010.01)

(52) U.S. Cl.
    CPC .......... *H01L 31/055* (2013.01); *H01L 33/502* (2013.01); *C01P 2002/72* (2013.01); *C01P 2004/03* (2013.01); *C01P 2006/40* (2013.01); *C09K 2211/10* (2013.01)

(56) References Cited

FOREIGN PATENT DOCUMENTS

| | | | |
|---|---|---|---|
| CN | 107887510 A | | 4/2018 |
| WO | 2013171517 A1 | | 11/2013 |
| WO | 2013171518 A1 | | 11/2013 |
| WO | 2013171520 A1 | | 11/2013 |
| WO | 2014045021 A1 | | 3/2014 |
| WO | 2015092397 A1 | | 6/2015 |
| WO | WO2016180364 | * | 5/2016 |
| WO | 2017089819 A1 | | 11/2016 |
| WO | 2017017441 A1 | | 2/2017 |
| WO | 2017037448 A1 | | 3/2017 |
| WO | 2017176038 A1 | | 10/2017 |

OTHER PUBLICATIONS

Baek et al., Development of Mixed-Cation CsxRb1-xPbX3 Perovskite Quantum Dots and Their Full-Color Film with High Stability and Wide Color Gamut, Advanced Optical Materials, 2018, 6:1800295, pp. 1-6.
Duan et al., Identification and Characterization of a New Intermediate to Obtain High Quality Perovskite Films with Hydrogen Halides as Additives, Inorganic Chemistry Frontiers, 2017, 4(3):473-480.
Amgar, D., et al. "Near ultra-violet to mid-visible band gap tuning of mixed cation Rb x Cs 1- x PbX 3 (X=Ci or Br) perovskite nanoparticles." Nanoscale 10.13 (2018): 6060-6068.
Andrews, R. H., et al. "Solid-state properties of materials of the type Cs 4 MX 6 (where M=Sn or Pb and X=Ci or Br)." Journal of the Chemical Society, Dalton Transactions 4 (1983): 767-770.
Ashurov, N., et al. "Current state and perspectives for organo-halide perovskite solar cells. Part 1. Crystal structures and thin film formation, morphology, processing, degradation, stability improvement by carbon nanotubes. A review." Modern Electronic Materials 3.1 (2017): 1-25.
Barkhouse, D. A. R., et al. "Device characteristics of a 10.1% hydrazine-processed Cu2ZnSn (Se, S) 4 solar cell." Progress in Photovoltaics: Research and Applications 20.1 (2012): 6-11.
Chilvery, A., et al. "A perspective on the recent progress in solution-processed methods for highly efficient perovskite solar cells." Science and Technology of advanced Materials 17.1 (2016): 650-658.
Du, Y., et al. "Flexible Perovskite Solar Cells onto Plastic Substrate Exceeding 13% Efficiency Owing to the Optimization of CH3NH3PbI3-x CI x Film via H2O Additive." ACS Sustainable Chemistry & Engineering 6.1 (2018): 1083-1090.
Hirade, M. et al. "Small molecular organic photovoltaic cells with exciton blocking layer at anode interface for improved device performance." Applied Physics Letters 99.15 (2011): 153302.
International Searching Authority. International Search Report and Written Opinion for application PCT/GB2019/051961. dated Sep. 18, 2019. 9 pages.
Kondo, S., et al. "Localized optical absorption in Cs4PbBr6." Journal of Physics: Condensed Matter 14.8 (2002): 2093.
Linaburg, M. R., et al. "Cs1-x Rb x PbCI3 and Cs1-x Rb x PbBr3 Solid Solutions: Understanding Octahedral Tilting in Lead Halide Perovskites." Chemistry of Materials 29.8 (2017): 3507-3514.
Onoda-Yamamuro, N. et al. "Calorimetric and IR spectroscopic studies of phase transitions in methylammonium trihalogenoplumbates (II)." Journal of Physics and Chemistry of Solids 51.12 (1990): 1383-1395.
Park, J. P., et al. "Formation of bright-green-color-emitting perovskite CsPbBr3 in a bulk state using a simple recrystallization process." Dyes and Pigments 144 (2017): 151-157.
Peumans, P., et al. (2003). Small molecular weight organic thin-film photodetectors and solar cells. Journal of Applied Physics, 93(7), 3693-3723.
Poglitsch, A. et al. "Dynamic disorder in methylammoniumtrihalogenoplumbates (II) observed by millimeter-wave spectroscopy." The Journal of chemical physics 87.11 (1987): 6373-6378.
Quan, L. N., et al. "Highly emissive green perovskite nanocrystals in a solid state crystalline matrix." Advanced Materials 29.21 (2017): 1605945.
Rouquerol, J., et al. "Recommendations for the characterization of porous solids (Technical Report)." Pure and applied chemistry 66.8 (1994): 1739.
Saidaminov, M. I., et al. "Pure Cs4PbBr6: highly luminescent zero-dimensional perovskite solids." ACS Energy Letters 1.4 (2016): 840-845.
Tauc, J., et al. "Optical properties and electronic structure of amorphous germanium." physica status solidi (b) 15.2 (1966): 627-637.
Weber, D. "CH3NH3PbX3, ein Pb (II)-system mit kubischer perowskitstruktur/CH3NH3PbX3, a Pb (II)-system with cubic perovskite structure." Zeitschrift für naturforschung B 33.12 (1978): 1443-1445. With English abstract.
Xu, C., et al. "Mechanochemical synthesis of advanced nanomaterials for catalytic applications." Chemical communications 51.31 (2015): 6698-6713.
Yang, H., et al. "Room-temperature engineering of all-inorganic perovskite nanocrsytals with different dimensionalities." Chemistry of Materials 29.21 (2017): 8978-8982.
Chen et al. "Centimeter-sized Cs4PbBr6 crystals with embedded CsPbBr3 nanocrystals showing superior photoluminescence: nonstoichiometry induced transformation and light-emitting applications." Advanced Functional Materials 28.16 (2018): 1706567. 1-7.
Korea Office Action of related application No. 10-2021-7004317, mailed Mar. 14, 2024. 9 pages.

* cited by examiner

FABRICATION PROCESS FOR A/M/X MATERIALS

CROSS-REFERENCE TO RELATED APPLICATIONS

This application is a national stage entry of PCT International Application No. PCT/GB2019/051961, filed Jul. 12, 2019, which claims priority to Great Britain Application No. 1811539.4, filed Jul. 13, 2018, both of which are incorporated herein by reference as if set forth in their entirety for all purposes.

The project leading to this application has received funding from the European Union's Horizon 2020 research and innovation programme under the Marie Sklodowska-Curie grant agreement no: 706552.

FIELD OF THE INVENTION

The invention provides a process for producing a crystalline A/M/X material comprising a compound of formula $[A]_a[M]_b[X]_c$, where a is a number from 1 to 6, b is a number from 1 to 6, and c is a number from 1 to 18. In particular, the invention provides a process for producing a thin film of said crystalline compound. Also provided are a thin film obtainable or obtained by the process of the invention, and an optoelectronic device (such as an LED or solar cell) comprising said thin film.

BACKGROUND TO THE INVENTION

There is great demand worldwide for photoactive semiconductor materials which convert electrical energy into light and vice versa. Such materials are useful in a wide range of semiconductor devices. For instance, light-emitting materials are useful in applications such as the production of luminescent screens and light-emitting diodes (LEDs). Light-absorbing materials are in high demand for the production of solar cells.

Organic species are currently widely used in fabricating light-emitting materials. However, organic species suffer from the disadvantage that they often emit weakly in the blue region of the visible spectrum. For example, organic LEDs (OLEDs) typically have a conversion efficiency of up to 20% in the red and green regions of the visible emission spectrum. However, they can often only achieve conversion efficiencies of up to 10% in the blue region of the visible spectrum. One key reason for this is that efficient red and green emission in OLEDs relies on the radiative recombination of all single and triplet excitons. Triplet-triplet electron transitions, which are generally spin-forbidden in organic emitters, is made possible by the introduction of phosphorescent metal complexes. However, such metal complexes are not available or lack stability and efficiency in the blue region of the spectrum.

Lead halide perovskites are desirable candidates as photoactive materials as they are highly emissive semiconductor materials. Highly emitting perovskites is taken to mean perovskites with a radiative external quantum efficiency of 20% or more in a thin film. Lead halide perovskites are materials of formula $APbX_3$, wherein X is a halide.

Metal halide perovskites and particularly lead halide perovskites are particularly promising semiconductor materials as it has been shown that the band gap of such perovskites can be tuned by adjusting their chemical composition. For instance, a study carried out by Linaburg et al ("$Cs_{1-x}Rb_xPbCl_3$ and $Cs_{1-x}Rb_xPbBr_3$ solid solutions: understanding octahedral tilting in lead halide perovskites", Chem. Mater., vol. 29, pp 3507-3514, 2017) shows that varying Rb content in a ceasium lead halide perovskite can change the band gap significantly. A tunable band gap is advantageous for semiconductor materials used in optoelectronic applications as it allows precise engineering of the wavelength at which the material absorbs or emits light.

In order to precisely control the band gap of the perovskite, it is important to obtain high quality perovskite materials in the solid state and to accurately control their stoichiometry. The known processes for producing perovskite materials leave room for improvement in this regard. A typical wet process used to synthesise thin films is described by Poglitsch and Weber in "Dynamic disorder in methylammonium trihalogenplumbates (II) observed by millimetre-wave spectroscopy", J. Chem. Phys., Vol. 87(11), pp 6373-6378, 1987). Separate chemical precursors (in this instance $CH_3NH_2$ and $PbX_2$ wherein X is a halide) are dissolved in a concentrated aqueous solution of the hydrohalic acid HX. The solution is then cooled, causing crystals to grow due to supersaturation of the solute occurring as the temperature drops.

A particular difficulty with these wet processes is that the solubility of the various chemical precursors in the crystal-forming solution can be very dissimilar. Difficulties are therefore encountered in fixing the concentration of each precursor in the crystal-forming solution at the desired value, particularly if the precursors' solubility varies with temperature. Often, the optimal composition of a solvent for the purposes of dissolving the precursors will differ from the optimal composition of a solvent for crystallisation (by cooling, spin-coating or other crystallisation methods). Compromises must often therefore be made, necessitating the choice of a solvent with less than optimal properties for the purpose of dissolving the precursors and for promoting crystal growth.

It is therefore very difficult to achieve precise stoichiometric control using these known wet processes. Imperfect control of stoichiometry leads to crystalline products and thin films with a poor definition of the band. It renders controlling the band gap through precise compositional control highly difficult. In addition, poor control of stoichiometry can lead to crystals with a high density of crystal defects, such as vacancies, interstitials and anti-sites, which can lead to a high density of electronic defects in the material.

Moreover, compromise on the temperature or solvent used during crystallisation in order to improve solubility of the precursors can lead to sub-optimal crystallisation conditions and reduced quality of the crystals and thin films thus obtained. Poorer-quality crystals and thin films may contain more defects, leading to poorer optoelectronic properties, and may be more susceptible to degradation.

The problem of differing solubilities of precursors has previously been addressed using vapour phase deposition techniques. However, these processes are inconvenient as they are slow and require complex equipment.

Consequently, there remains a need for a process which is simple to perform but which can provide crystalline products and particularly thin films of high quality and with precisely-controlled stoichiometry, and hence with a precisely tunable band gap.

SUMMARY OF THE INVENTION

In general, the salts used as precursors in the fabrication of crystalline A/M/X materials have different solubilities.

For example, the solubility limit of inorganic halide salts (e.g. halide salts of $Cs^+$ and $Rb^+$) is generally lower than the solubility of halide salts of organic cations (e.g. halide salts of $CH_3NH_3^+$ and $CH(NH_2)_2^+$) in organic polar solvents. These different solubilities complicate the synthetic route to crystalline A/M/X species, especially where two or more different cations are required in the crystalline A/M/X product. Moreover, the optimal solvent composition for the dissolution of the of the precursors is often different than for the crystallisation during the spin-coating process. As a result of these difficulties, it is generally difficult to precisely control the stoichiometry of the crystalline A/M/X product.

To overcome these problems, the inventors have provided a new synthetic route which includes treating an aqueous solution comprising one or more A cation precursors with an M cation precursor in an organic polar solvent, which organic solvent typically also contains a concentrated hydrohalic acid. On such treatment, the stoichiometric crystalline A/M/X material precipitates. The invention therefore provides a process for producing a crystalline A/M/X material, which crystalline A/M/X material comprises a compound of formula:

$[A]_a[M]_b[X]_c$ wherein:
[A] comprises one or more A cations;
[M] comprises one or more M cations which are metal or metalloid cations;
[X] comprises one or more X anions;
a is a number from 1 to 6;
b is a number from 1 to 6; and
c is a number from 1 to 18,
the process comprising:
a) contacting an aqueous solution comprising an A precursor and an aqueous solvent with an organic solution comprising an M precursor and an organic solvent; and
b) allowing a precipitate to form when the said aqueous and organic solutions are contacted.

The above method advantageously allows excellent control of the stoichiometry of the $[A]_a[M]_b[X]_c$ product. The above method is associated with surprisingly lower instance of side-reactions, which form unwanted A/M/X side-products and affect the molar ratio of the A, M and X species during the process. In consequence, the above method yields crystalline A/M/X materials which have reduced contamination with undesired A/M/X side-products compared to the methods of the prior art. Thus, the process of the invention produces a product with high purity and good yield having precisely-controlled stoichiometry.

Further, it has been surprisingly found that, by taking the product of the above process and using that product as a starting material to form a thin film, the thin film thus produced has very finely tunable optical properties.

Thus the process is typically a process for preparing a thin film of said crystalline A/M/X material, and the process typically further comprises: (c) optionally washing the precipitate; (d) vapourising the precipitate, or dissolving the precipitate in an organic solvent to form a film-forming solution; and (e) disposing the vapourised precipitate, or disposing the film-forming solution, on a substrate. Typically step (e) comprises depositing the vapourised precipitate on a substrate or dispersing the film-forming solution on a substrate.

In a first preferred embodiment, the process of the invention further comprises:
c) optionally washing the precipitate;
d) dissolving the precipitate in an organic solvent to form a film-forming solution; and
e) dispersing the film-forming solution on a substrate.

In an alternative preferred embodiment of the invention, the process further comprises:
c') optionally washing the precipitate;
d') vapourising the precipitate; and
e') depositing the vapourised precipitate on a substrate.

Without wishing to be bound by theory, it is speculated that the direct product of step (b) typically contains not only the precipitate but also species such as residual precursor compounds or side-products. It is suggested that by removing these additional components, for example by washing, the thin film formed from the precipitate obtained in step (b) is less susceptible to regional stoichiometric variation of the A/M/X material caused by such sources of A, M and X.

The process of the invention, which provides a crystalline A/M/X material comprising a compound of formula $[A]_a[M]_b[X]_c$, is applicable to a wide variety of compounds. In some embodiments, the compound of formula $[A]_a[M]_b[X]_c$ is a compound of formula $[A][M][X]_3$. In some embodiments, the compound of formula $[A]_a[M]_b[X]_c$ is a compound of formula $[A]_2[M][X]_6$. In yet other embodiments, the compound of formula $[A]_a[M]_b[X]_c$ is a compound of formula $[A]_4[M][X]_6$.

The process of the invention is particularly valuable for producing A/M/X materials comprising multiple types of cation or anion, where it is even harder to control stoichiometry by conventional methods. Accordingly, in preferred aspects of the invention, [A] comprises two or more different A cations and/or [X] comprises two or more different X anions.

The invention further provides a thin film obtainable or obtained by a process for producing a thin film as defined herein.

The invention further provides an optoelectronic device, for example a light-emitting device or a photovoltaic device, comprising a thin film as defined herein.

BRIEF DESCRIPTION OF THE FIGURES

FIGS. 3(a) and (b) show steady-state photoluminescence spectra of $Cs_{1-x}Rb_xPbBr_3$ powders;

FIG. 18(a) shows the spectra of such powders obtained (i) by the method of the invention wherein DMSO was used as the solvent for the lead precursor, and (ii) by a method wherein hydrobromic acid was used as the solvent for the lead precursor. FIG. 18(b) shows the same spectra, normalised.

FIG. 20(a) shows the spectra of such powders obtained (i) by the method of the invention wherein DMSO was used as the solvent for the lead precursor, and (ii) by a method wherein hydrobromic acid was used as the solvent for the lead precursor. FIG. 20(b) shows the same spectra, normalised.

DETAILED DESCRIPTION OF THE INVENTION

Figure 1:
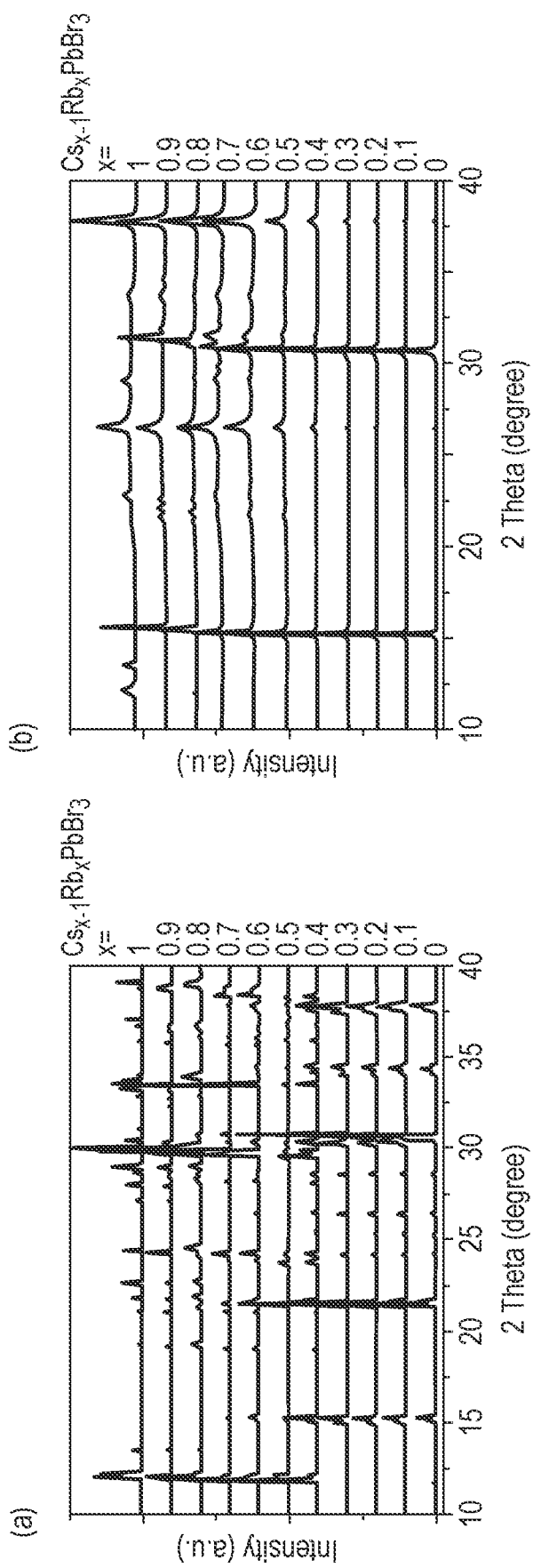
FIG. 1(a) shows X-ray diffraction patterns of $Cs_{1-x}Rb_xPbBr_3$ powders (with varying x).
FIG. 1(b) shows the X-ray diffraction patterns for thin films of the corresponding materials.

Hereafter are described aspects of the process of the invention, and aspects of the products (e.g. powders or thin films) obtainable by the process of the invention. It should be understood that a description of an aspect of the process of the invention relates also to the product of the invention insofar as it is relevant, and vice versa.

Definitions

The term "crystalline" as used herein indicates a crystalline compound, which is a compound having an extended 3D crystal structure. A crystalline compound is typically in the form of crystals or, in the case of a polycrystalline compound, crystallites (i.e. a plurality of crystals having particle sizes of less than or equal to 1 m). The crystals together often form a layer. The crystals of a crystalline material may be of any size. Where the crystals have one or more dimensions in the range of from 1 nm up to 1000 nm, they may be described as nanocrystals.

The terms "organic compound" and "organic solvent" as used herein have their typical meaning in the art and would readily be understood by the skilled person.

The term "disposing on", as used herein, refers to the making available or placing of one component on another component. The first component may be made available or placed directly on the second component, or there may be a third component which intervenes between the first and second component. For instance, if a first layer is disposed on a second layer, this includes the case where there is an intervening third layer between the first and second layers. Typically, however, "disposing on" refers to the direct placement of one component on another.

The term "porous", as used herein, refers to a material within which pores are arranged. Thus, for instance, in a porous material the pores are volumes within the scaffold where there is no material. Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994. Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. The term "non-porous" as used herein, refers to a material without any porosity, i.e. without open porosity and also without closed porosity.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "band gap", as used herein, refers to the energy difference between the top of the valence band and the bottom of the conduction band in a material. The skilled person of course is readily able to measure the band gap of a semiconductor (including that of a perovskite) by using well-known procedures which do not require undue experimentation. For instance, the band gap of a semiconductor can be estimated by constructing a photovoltaic diode or solar cell from the semiconductor and determining the photovoltaic action spectrum. Alternatively the band gap can be estimated by measuring the light absorption spectra either via transmission spectrophotometry or by photo thermal deflection spectroscopy. The band gap can be determined by making a Tauc plot, as described in Tauc, J., Grigorovici, R. & Vancu, a. Optical Properties and Electronic Structure of Amorphous Germanium. Phys. Status Solidi 15, 627-637 (1966) where the square of the product of absorption coefficient times photon energy is plotted on the Y-axis against photon energy on the x-axis with the straight line intercept of the absorption edge with the x-axis giving the optical band gap of the semiconductor. Alternatively, the optical band gap may be estimated by taking the onset of the incident photon-to-electron conversion efficiency, as described in [Barkhouse D A R, Gunawan O, Gokmen T, Todorov T K, Mitzi D B. Device characteristics of a 10.1% hydrazineprocessed Cu2ZnSn(Se,S)4 solar cell. Progress in Photovoltaics: Research and Applications 2012; published online DOI: 10.1002/pip.1160.]

The term "semiconductor" or "semiconducting material", as used herein, refers to a material with electrical conductivity intermediate in magnitude between that of a conductor and a dielectric. A semiconductor may be an negative (n)-type semiconductor, a positive (p)-type semiconductor or an intrinsic (i) semiconductor. A semiconductor may have a band gap of from 0.5 to 3.5 eV, for instance from 0.5 to 2.5 eV or from 1.0 to 2.0 eV (when measured at 300 K).

The term "n-type region", as used herein, refers to a region of one or more electron-transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type region", as used herein, refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "electrode material", as used herein, refers to any material suitable for use in an electrode. An electrode material will have a high electrical conductivity. The term "electrode" as used herein indicates a region or layer consisting of, or consisting essentially of, an electrode material.

As used herein, the term "optionally substituted" means that the group at issue may or may not bear substituents, i.e. it may be unsubstituted or substituted. For instance, the group may bear 0, 1, 2, 3 or more substituents; typically 0, 1 or 2 substituents. The substituents may typically be selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, and sulfonyl.

As used herein, an alkyl group can be a substituted or unsubstituted, linear or branched chain saturated radical, it is often a substituted or an unsubstituted linear chain saturated radical, more often an unsubstituted linear chain saturated radical. An alkyl group typically comprises 1 to 20 carbon atoms, usually 1 to 10 carbon atoms. A $C_{1-10}$alkyl group is an unsubstituted or substituted, straight or branched chain saturated hydrocarbon radical, having from 1 to 10 carbon atoms. A $C_{1-6}$ alkyl group is an unsubstituted or substituted, straight or branched chain saturated hydrocarbon radical, having from 1 to 6 carbon atoms. Typically it is, for example, methyl, ethyl, propyl, i-propyl, n-propyl, butyl, t-butyl, s-butyl, n-butyl, pentyl, or hexyl. Often an alkyl group is a $C_{1-4}$ alkyl group. If the term "alkyl" is used without a prefix specifying the number of carbons anywhere herein, it generally has from 1 to 20 carbons (and this also applies to any other organic group referred to herein).

As used herein, an alkenyl group can be a substituted or unsubstituted, linear or branched chain unsaturated radical, it is often a substituted or an unsubstituted linear chain unsaturated radical, more often an unsubstituted linear chain unsaturated radical. An alkenyl group can comprise one or more carbon-carbon double bonds, for example one, two or three double bonds. Typically, an alkenyl group comprises one double bond. An alkenyl group typically comprises 2 to 20 carbon atoms, usually 2 to 10 carbon atoms. A $C_{2-10}$ alkenyl group is an unsubstituted or substituted, straight or branched chain unsaturated hydrocarbon radical, having from 2 to 10 carbon atoms. A $C_{2-6}$ alkenyl group is an unsubstituted or substituted, straight or branched chain unsaturated hydrocarbon radical, having from 2 to 6 carbon atoms. Typically it is, for example, vinyl, propenyl, prop-1-enyl, prop-2-enyl, butenyl, but-1-enyl, but-2-enyl, but-4- enyl, pentenyl, pent-1-enyl, pent-2-enyl, pent-3-enyl, pent-4-enyl, hexenyl, hex-1-enyl, hex-2-enyl, hex-3-enyl, hex-4-eny, or hex-5-enyl.

As used herein, a cycloalkyl group can be a substituted or unsubstituted, cyclic saturated radical, and it is often an unsubstituted cyclic saturated radical. A cycloalkyl group typically comprises from 3 to 20 carbon atoms. A $C_{3-10}$ cycloalkyl group is an unsubstituted or substituted, cyclic saturated hydrocarbon radical, having from 3 to 10 carbon atoms. A $C_{3-6}$ cycloalkyl group is an unsubstituted or substituted, cyclic saturated hydrocarbon radical, having from 3 to 6 carbon atoms Typically it is, for example, cyclopropyl, cyclobutyl, cyclopentyl or cyclohexyl.

As used herein, a cycloalkenyl group can be a substituted or unsubstituted, cyclic unsaturated radical, and it is often an unsubstituted cyclic unsaturated radical. A cycloalkenyl group typically comprises from 3 to 20 carbon atoms. A cycloalkenyl group may comprise one or more double bonds (dependent on the number of carbon atoms present in the ring). A $C_{4-10}$ cycloalkenyl group is an unsubstituted or substituted, cyclic unsaturated hydrocarbon radical, having from 4 to 10 carbon atoms. A $C_{4-10}$ cycloalkenyl group is an unsubstituted or substituted, cyclic unsaturated hydrocarbon radical, having from 3 to 6 carbon atoms Typically it is, for example, cyclobutenyl, cyclopentenyl or cyclohexenyl.

As used herein, an alkyloxy group is a radical comprising an alkyl group as defined herein bound to an oxygen radical. That is, an alkoxy group has the formula —O-alkyl, wherein the alkyl radical is as defined herein. A $C_{1-10}$alkyloxy group is therefore a radical of formula —O-alkyl wherein the alkyl radical is a $C_{1-10}$alkyl radical as defined herein. As used herein, an alkenyloxy group is a radical comprising an alkenyl group as defined herein bound to an oxygen radical. That is, an alkenyloxy group has the formula —O-alkenyl, wherein the alkenyl radical is as defined herein. A $C_{4-10}$ alkenyloxy group is therefore a radical of formula —O-alkenyl wherein the alkenyl radical is a $C_{1-10}$ alkenyl radical as defined herein.

The term "halide" as used herein indicates the singly charged anion of an element in group VIII of the periodic table. "Halide" includes fluoride, chloride, bromide and iodide.

The term "halo" as used herein indicates a halogen atom. Exemplary halo species include fluoro, chloro, bromo and iodo species.

As used herein, an aryl group is a substituted or unsubstituted, monocyclic or bicyclic aromatic group which typically contains from 6 to 14 carbon atoms, often from 6 to 12 carbon atoms and preferably from 6 to 10 carbon atoms in the ring portion. A $C_{6-12}$ aryl group is a substituted or unsubstituted, monocyclic or bicyclic aromatic group which contains from 6 to 12 carbon atoms. Examples include phenyl, naphthyl, indenyl and indanyl groups.

As used herein, an amino group is a radical of formula —$NR_2$, wherein each R is a substituent. R is usually selected from hydrogen, alkyl, alkenyl, cycloalkyl, or aryl, wherein each of alkyl, alkenyl, cycloalkyl and aryl are as defined herein. Typically, each R is selected from hydrogen, $C_{1-10}$ alkyl, $C_{2-10}$ alkenyl, and $C_{3-10}$ cycloalkyl. Preferably, each R is selected from hydrogen, $C_{1-6}$ alkyl, $C_{2-6}$ alkenyl, and $C_{3-6}$ cycloalkyl. More preferably, each R is selected from hydrogen and $C_{1-6}$ alkyl.

A typical amino group is an alkylamino group, which is a radical of formula —$NR_2$ wherein at least one R is an alkyl group as defined herein. A $C_{1-6}$ alkylamino group is an alkylamino group comprising 1 to 6 carbon atoms.

As used herein, an imino group is a radical of formula $R_2C=N—$ or —$C(R)=NR$, wherein each R is a substituent. That is, an imino group is a radical comprising a C=N moiety, having the radical moiety either at the N atom or attached to the C atom of said C=N bond. R is as defined herein: that is, R is usually selected from hydrogen, alkyl, alkenyl, cycloalkyl, or aryl, wherein each of alkyl, alkenyl, cycloalkyl and aryl are as defined herein. Typically, each R is selected from hydrogen, $C_{1-10}$ alkyl, $C_{2-10}$ alkenyl, and $C_{3-10}$ cycloalkyl. Preferably, each R is selected from hydrogen, $C_{1-6}$ alkyl, $C_{2-6}$ alkenyl, and $C_{3-6}$ cycloalkyl. More preferably, each R is selected from hydrogen and $C_{1-6}$ alkyl.

A typical imino group is an alkylimino group, which is a radical of formula $R_2C=N—$ or —$C(R)=NR$ wherein at least one R is an alkyl group as defined herein. A $C_{1-6}$ alkylimino group is an alkylimino group wherein the R substituents comprise from 1 to 6 carbon atoms.

The term "ester" as used herein indicates an organic compound of the formula alkyl-C(=O)—O-alkyl, wherein the alkyl radicals are the same or different and are as defined herein. The alkyl radicals may be optionally substituted.

The term "ether" as used herein indicates an oxygen atom substituted with two alkyl radicals as defined herein. The alkyl radicals may be optionally substituted, and may be the same or different.

As used herein, the term "ammonium" indicates an organic cation comprising a quaternary nitrogen. An ammonium cation is a cation of formula $R^1R^2R^3R^4N^+$. $R^1$, $R^2$, $R^3$, and $R^4$ are substituents. Each of $R^1$, $R^2$, $R^3$, and $R^4$ are typically independently selected from hydrogen, or from optionally substituted alkyl, alkenyl, aryl, cycloalkyl, cycloalkenyl and amino; the optional substituent is preferably an amino or imino substituent. Usually, each of $R^1$, $R^2$, $R^3$, and $R^4$ are independently selected from hydrogen, and optionally substituted $C_{1-10}$ alkyl, $C_{2-10}$ alkenyl, $C_{3-10}$ cycloalkyl, $C_{3-10}$ cycloalkenyl, $C_{6-12}$ aryl and $C_{1-6}$ amino; where present, the optional substituent is preferably an amino group; particularly preferably $C_{1-6}$ amino. Preferably, each of $R^1$, $R^2$, $R^3$, and $R^4$ are independently selected from hydrogen, and unsubstituted $C_{1-10}$ alkyl, $C_{2-10}$ alkenyl, $C_{3-10}$ cycloalkyl, $C_{3-10}$ cycloalkenyl, $C_{6-12}$ aryl and $C_{1-6}$ amino. In a particularly preferred embodiment, $R^1$, $R^2$, $R^3$, and $R^4$ are independently selected from hydrogen, $C_{1-10}$ alkyl, and $C_{2-10}$ alkenyl and $C_{1-6}$ amino. Further preferably, $R^1$, $R^2$, $R^3$, and $R^4$ are independently selected from hydrogen, $C_{1-6}$ alkyl, $C_{2-6}$ alkenyl and $C_{1-6}$ amino.

As used herein, the term "iminium" indicates an organic cation of formula $(R^1R^2C=NR^3R^4)^+$, wherein $R^1$, $R^2$, $R^3$, and $R^4$ are as defined in relation to the ammonium cation. Thus, in a particularly preferred embodiment, of the iminium cation, $R^1$, $R^2$, $R^3$, and $R^4$ are independently selected from hydrogen, $C_{1-10}$ alkyl, $C_{2-10}$ alkenyl and $C_{1-6}$ amino. In a further preferable embodiment of the iminium cation, $R^1$, $R^2$, $R^3$, and $R^4$ are independently selected from hydrogen, $C_{1-6}$ alkyl, $C_{2-6}$ alkenyl and $C_{1-6}$ amino.

The term "perovskite", as used herein, refers to a material with a three-dimensional crystal structure related to that of $CaTiO_3$ or a material comprising a layer of material, which layer has a structure related to that of $CaTiO_3$. A material with a three-dimensional crystal structure related to that of $CaTiO_3$ may be referred to as being a perovskite having a "3D perovskite structure", or as being a "3D perovskite". The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. These are referred to in the art as "2D layered perovskites", being different in structure from the above-mentioned 3D perovskites. 2D layered perovskites can be represented by the formula $[A]_2[M][X]_4$, wherein [A] is at least one cation, [M] is at least one cation of a different size to the cation(s) A and [X] is at least one anion.

The skilled person will appreciate that a 3D perovskite material can be represented by the formula $[A][B][X]_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "metal halide perovskite", as used herein, refers to a perovskite, the formula of which contains at least one metal cation and at least one halide anion.

The term "mixed halide perovskite" as used herein refers to a perovskite or mixed perovskite which contains at least two types of halide anion.

The term "mixed cation perovskite" as used herein refers to a perovskite of mixed perovskite which contains at least two types of A cation.

The term "hexahalometallate", as used herein, refers to a compound which comprises an anion of the formula $[MX_6]^{n-}$, wherein M is a metal atom, each X is independently a halide anion and n is an integer from 1 to 4.

The term "optoelectronic device", as used herein, refers to devices which source, control, detect or emit light. Light is understood to include any electromagnetic radiation. Examples of optoelectronic devices include photovoltaic devices, photodiodes, solar cells, photodetectors, phototransistors, photomultipliers, photoresistors, chromogenic devices, light-sensitive transistors, light emitting devices, light emitting diodes and charge injection lasers.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Process

The invention provides a process for producing a crystalline A/M/X material, which crystalline A/M/X material comprises a compound of formula:

wherein:
[A] comprises one or more A cations;
[M] comprises one or more M cations which are metal or metalloid cations;
[X] comprises one or more X anions, which are typically one or more halide anions;
a is a number from 1 to 6;
b is a number from 1 to 6; and
c is a number from 1 to 18,
the process comprising:
a) contacting an aqueous solution comprising an A precursor and an aqueous solvent with an organic solution comprising an M precursor and an organic solvent; and
b) allowing a precipitate to form when the said aqueous and organic solutions are contacted.

In the process of the invention, "contacting" an aqueous solution with an organic solution means that the said solutions are brought into contact. There is no particular limitation as to how this step is performed. For instance, the aqueous solution may be added to the organic solution, or the organic solution may be added to the aqueous solution. For example, the process may comprise providing the organic solution in a reaction vessel and adding the aqueous solution to the reaction vessel, or providing the aqueous solution in a reaction vessel and adding the organic solution to the reaction vessel. In other embodiments, the aqueous solution and the organic solution may be added to one another, for example by providing both solutions to a reaction vessel at the same time.

The contacting step may be performed rapidly or slowly. For instance, the contacting step may be performed by adding the aqueous solution gradually (e.g. dropwise) to the organic solution, or by adding the organic solution gradually (e.g. dropwise) to the aqueous solution.

The aqueous solution typically comprises at least 50% water by weight of the aqueous solution. Preferably, the aqueous solution comprises at least 60% water by weight of the aqueous solution, for example at least 70% or at least 80% or at least 90% water by weight of the aqueous solution.

The aqueous solution comprises an A precursor and an aqueous solvent. Of course, the aqueous solution may comprise other species. For example, the aqueous solution may comprise dissolved compounds (typically dissolved ionic compounds) such as impurities, stabilising agents, pH controlling agents and so on. Moreover, the aqueous solution may comprise additional solvents.

In some embodiments, the aqueous solution is substantially free of organic solvents. The term "organic solvents" takes its usual meaning in the art. For example, in some embodiments the aqueous solution comprises 1% or less of organic solvents by weight of the aqueous solution, preferably 0.5% or less of organic solvents by weight of the aqueous solution; e.g. 0.1% or less, or 0.01% or less of organic solvents by weight of the aqueous solution.

As the skilled reader will appreciate, by the term solution it is implied that the aqueous solution is a liquid. However, the skilled reader will also appreciate that in practice the aqueous solution may comprise solid impurities in small quantities. A typical example of such solid impurities includes small quantities of one or more undissolved A precursor compound(s). However, it is preferred that these solid impurities are minimised. Accordingly, it is preferred that the aqueous solution comprises less than 1% of solid by weight of the aqueous solution, preferably 0.5% or less by weight of solid by weight of the aqueous solution; e.g. 0.1% or less, or 0.01% or less by weight of solid by weight of the aqueous solution.

The aqueous solution comprises an A precursor and an aqueous solvent. As is discussed in more detail below, an A precursor is a compound comprising one or more A cations present in [A]. Where [A] (that is, [A] in the compound of formula $[A]_a[M]_b[X]_c$) comprises only one type of A cation, only one A precursor is necessary in the process of the invention.

Where [A] comprises two or more cations, a number of options are available in the process of the invention. For example, if an A precursor comprising the two or more A cations is available, that A precursor comprising the two or more A cations present in [A] may be present in the aqueous solution. Alternatively, step (a) of the process may involve contacting a plurality of aqueous solutions, each comprising an A precursor and an aqueous solvent, with an organic solution comprising an M precursor and an organic solvent. In yet another alternative, the aqueous solution utilised in step (a) of the process may comprise a plurality of A precursors.

For simplicity, it may be preferred in the process of the invention that a single aqueous solution is contacted with an organic solution. In particular, it may be preferred in the process of the invention that a single aqueous solution is contacted with a single organic solution.

Accordingly, it may be preferred that the aqueous solution comprises each of the one or more A cations present in [A]. As discussed herein, where [A] comprises two or more A cations, an aqueous solution comprising all A cations present in [A] may be achieved by an aqueous solution comprising one A precursor, wherein the said A precursor comprises each of the one or more A cations present in [A]; or by an aqueous solution comprising a plurality of A precursors, wherein each A precursor comprises one or more A cations present in [A] and the said plurality of A precursors comprises all of the A cations present in [A].

The organic solution typically comprises at least 50% organic solvent(s) by weight of the organic solution. Preferably, the organic solution comprises at least 60% organic solvents by weight of the organic solution, for example at least 70% or at least 80% or at least 90% organic solvents by weight of the organic solution.

The organic solution comprises an M precursor and an organic solvent. Of course, the organic solution may comprise other species. For example, the organic solution may comprise dissolved compounds (which may for instance be dissolved ionic compounds or organic compounds) such as impurities, stabilising agents, pH controlling agents and so on. Moreover, the organic solution may comprise additional solvents.

In some embodiments, the organic solution is substantially free of water. For example, in some embodiments the organic solution comprises 5% or less of water by weight of the organic solution, preferably 1% or less of water by weight of the organic solution; e.g. 0.5% or less, or 0.1% or less of water by weight of the organic solution.

As the skilled reader will appreciate, by the term solution it is implied that the organic solution is a liquid. However, the skilled reader will also appreciate that in practice the organic solution may comprise solid impurities in small quantities. A typical example of such solid impurities includes small quantities of one or more undissolved M precursor compound(s). However, it is preferred that these solid impurities are minimised. Accordingly, it is preferred that the organic solution comprises less than 1% of solid by weight of the organic solution, preferably 0.5% or less by weight of solid by weight of the organic solution; e.g. 0.1% or less, or 0.01% or less by weight of solid by weight of the organic solution.

The organic solution comprises an M precursor and an organic solvent. As is discussed in more detail below, an M precursor is a compound comprising one or more M cations present in [M]. Where [M] (that is, [M] in the compound of formula $[A]_a[M]_b[X]_c$) comprises only one type of M cation, only one M precursor is necessary in the process of the invention.

Where [M] comprises two or more cations, a number of options are available in the process of the invention. For example, if an M precursor comprising the two or more M cations is available, that M precursor comprising the two or more M cations present in [M] may be present in the organic solution. Alternatively, step (a) of the process may involve contacting a plurality of organic solutions, each comprising an M precursor and an organic solvent, with an aqueous solution comprising an A precursor and an organic solvent. In yet another alternative, the organic solution utilised in step (a) of the process may comprise a plurality of M precursors.

For simplicity, it may be preferred in the process of the invention that a single organic solution is contacted with an aqueous solution. In particular, it may be preferred in the process of the invention that a single aqueous solution is contacted with a single organic solution.

Accordingly, it may be preferred that the organic solution comprises each of the one or more M cations present in [M]. As discussed herein, where [M] comprises two or more M cations, an organic solution comprising all M cations present in [M] may be achieved by an organic solution comprising one M precursor, wherein the said M precursor comprises each of the one or more M cations present in [M]; or by an organic solution comprising a plurality of M precursors, wherein each M precursor comprises one or more M cations present in [M] and the said plurality of M precursors comprises all of the M cations present in [M]. Thus, in a preferred embodiment, the process comprises:

a) contacting an aqueous solution comprising one or more A precursors and an aqueous solvent with an organic solution comprising one or more M precursors and an organic solvent, wherein the one or more A precursors together comprise all the cations present in [A] and the one or more M precursors together comprise all the cations present in [M]; and b) allowing a precipitate to form when the said aqueous and organic solutions are contacted.

As regards the source of X anions in the process of the invention, it may not be necessary to provide a separate X precursor in the process of the invention. This is because in some embodiments, the A precursor (or where the process involves a plurality of A precursors, at least one of them) and/or the M precursor (or where the process involves a plurality of M precursors, at least one of them) is a halide salt. In a preferred embodiment, the A precursor (or where present the plurality of A precursors) and the M precursor (or where present the plurality of M precursors) together comprise each of the X cations present in [X].

In some embodiments, a compound comprising an X anion is provided during the process of the invention. Where [X] comprises a single X anion, a compound comprising that X anion may be provided. Where [X] comprises a plurality of X anions, a compound comprising one or more, e.g. all of, the said plurality of X anions may be provided during the process of the invention. Equally, a plurality of compounds each comprising one or more of the said plurality of X anions may be provided during the process of the invention. A compound which comprises one or more X anions but does not comprise any A cations or M cations may be referred to as an X precursor. Typically, an X precursor is a hydrohalic acid comprising an X anion; that is, a compound of formula HX'.

In some embodiments, an X precursor may be provided in a separate solution. For instance, in some embodiments the process may comprise:
a) contacting an aqueous solution comprising an A precursor and an aqueous solvent with an organic solution comprising an M precursor and an organic solvent, and also with a further solution comprising a further solvent and an X precursor; and
b) allowing a precipitate to form when the said aqueous solution, organic solution and further solution are contacted.

The further solvent is not particularly limited. It may be an aqueous solvent or an organic solvent. Where it is an aqueous solvent, it may or may not be the same aqueous solvent as is present in the aqueous solution. Where it is an organic solvent, it may or may not be the same organic solvent as is present in the organic solution. The further solution may comprise one or more solvent(s) in addition to the further solvent.

However, for simplicity it may be preferred that the number of solutions contacted during the reaction is small. Accordingly, where an X precursor is used in the process of the invention it may be preferred that said X precursor is present in at least one of the aqueous solution and the organic solution. For example, the process of the invention may comprise:
a) contacting an aqueous solution comprising an A precursor and an aqueous solvent with an organic solution comprising an M precursor and an organic solvent, wherein the aqueous solution and/or the organic solution comprises an X precursor; and
b) allowing a precipitate to form when the said aqueous solution and organic solution are contacted.

Typically, the organic solution comprises the one or more X precursors (where used). Accordingly, in a preferred embodiment, the organic solution comprises an X precursor. In a particularly preferred embodiment, the organic solution comprises a hydrohalic acid.

For example, the organic solution may comprise one or more hydrohalic acids of formula HX', wherein each X' is the halide anion X or one of the halide anions X (which are present in [X]). Preferably, the organic solution comprises a hydrohalic acid of formula HX' corresponding to each of the X anions present in [X].

The process of the invention thus comprises:
a) contacting: one or more aqueous solutions, each comprising one or more A precursors, one or more organic solutions, each comprising one or more M precursors, and one or more X anions; and
b) allowing a precipitate to form when the one or more A precursors, one or more M precursors and one or more X anions are contacted.

When the A, M and (where present) X precursors are brought into contact, they can form an $[A]_a[M]_b[X]_c$ compound which generally has poor solubility in both the aqueous solvent and the organic solvent. Accordingly, a precipitate comprising the $[A]_a[M]_b[X]_c$ compound generally forms regardless of the relative quantities of A, M and X ions in the initial solutions and in the reaction mixture.

However, it may assist with control of the stoichiometry of the $[A]_a[M]_b[X]_c$ compound to ensure that the A, M and X ions contacted in step (a) of the process are present in molar ratios relative to one another that approximately reflect the relative molar ratios of those ions in the desired $[A]_a[M]_b[X]_c$ product.

Often, therefore the molar ratio [A]:[M] in the aqueous solution or solutions and the organic solution or solutions is approximately equal the [A]:[M] ratio in the product. That is, the total molar concentration of A cation(s) in the aqueous solution(s) divided by the total molar concentration of the M cation(s) in the organic solution(s) is generally equal to a divided by b, wherein a and b are as in the $[A]_a[M]_b[X]_c$ compound.

In a preferred embodiment, where the $[A]_a[M]_b[X]_c$ compound comprises two or more A cations, in the process of the invention the aqueous solution comprises the two or more A cations in a molar ratio approximately equivalent to their molar ratio in the desired product. The two or more different A cations may be indicated by, for instance, $A^I$ and $A^{II}$. Accordingly, by way of example, where the $[A]_a[M]_b[X]_c$ compound comprises $A^I$ and $A^{II}$ in a 3:1 molar ratio (that is, the $[A]_a[M]_b[X]_c$ compound may be $[A^I_{0.75}A^{II}_{0.25}]_a[M]_b[X]_c$), the aqueous solution may comprise $A^I$ cations and $A^{II}$ cations in a molar ratio of about 3:1. For instance, the invention provides a process for producing a crystalline A/M/X material, which crystalline A/M/X material comprises a compound of formula:

wherein:
[A] comprises two cations $A^I$ and $A^{II}$;
[M] comprises one or more M cations which are metal or metalloid cations;
[X] comprises one or more X anions which are halide anions;
a is a number from 1 to 6;
b is a number from 1 to 6; and
c is a number from 1 to 18,
the process comprising:
a) contacting an aqueous solution comprising an $A^I$ precursor, an $A^{II}$ precursor and an aqueous solvent with an organic solution comprising an M precursor and an organic solvent; and
b) allowing a precipitate to form when the said aqueous and organic solutions are contacted,
wherein the molar ratio of $A^I:A^{II}$ in the aqueous solution is approximately the same as the molar ratio of $A^I:A^{II}$ in the compound of formula $[A]_a[M]_b[X]_c$.

Similarly, in another preferred embodiment, where the $[A]_a[M]_b[X]_c$ compound comprises two or more M cations, in the process of the invention the organic solution comprises the two or more M cations in a molar ratio approximately equivalent to their molar ratio in the desired product. The two or more different M cations may be indicated by, for instance, $M^I$ and $M^{II}$. Accordingly, by way of example, where the $[A]_a[M]_b[X]_c$ compound comprises $M^I$ and $M^{II}$ in a 1:1 molar ratio (that is, the $[A]_a[M]_b[X]_c$ compound may be $[A]_a[M^I_{0.5}M^{II}_{0.5}]_b[X]_c$), the organic solution may comprise $M^I$ cations and $M^{II}$ cations in a molar ratio of about 1:1.

Also similarly, where the $[A]_a[M]_b[X]_c$ compound comprises two or more X anions, in the process of the invention the molar ratio of the two or more X anions in the aqueous solution and the organic solution combined is generally approximately equivalent to the molar ratio of the X anions in the desired product. The two or more different X cations may be indicated by, for instance, $X^I$ and $X^{II}$. Accordingly, by way of example, where the $[A]_a[M]_b[X]_c$ compound comprises $X^I$ and $X^{II}$ in a 1:4 molar ratio (that is, the $[A]_a[M]_b[X]_c$ compound may be $[A]_a[M]_b[X^I_{0.2}X^{II}_{0.8}]_c$), the molar ratio of $X^I$ anions to $X^{II}$ anions in the aqueous solution and the organic solution together may be about 1:4.

In some embodiments of the invention, therefore, the relative molar amounts of each of said one or more A cations, said one or more M cations and said one or more X anions in the aqueous solution together with the organic solution are equal to the relative molar amounts of each of said one or more A cations, said one or more M cations and said one or more X anions in the compound of formula $[A]_a[M]_b[X]_c$. It is preferred in this embodiment that the process involves one aqueous solution comprising the or each A precursor and one organic solution comprising the or each M precursor, and optionally the or each X precursor.

In a preferred aspect of this embodiment, [X] comprises a first X anion and a second X anion and the molar ratio of the first X anion to the second X anion is the same in each of:
  (i) the aqueous solution;
  (ii) the organic solution; and
  (iii) the compound of formula $[A]_a[M]_b[X]_c$.

The process of contacting an organic solution and an aqueous solution (and where necessary any additional solutions) forms a reaction mixture. The "reaction mixture" comprises the aqueous solution and the organic solution of step (a) in contact. The reaction mixture may optionally comprise additional components, for instance a further solution comprising an X precursor. Immediately after an organic solution and an aqueous solution are brought into contact to form a reaction mixture, the reaction mixture will typically comprise an A precursor and an M precursor. After some precipitation has occurred, the reaction mixture will comprise a precipitate comprising solid crystalline A/M/X material. Additionally, the quantity of A precursor and M precursor in the reaction mixture will be reduced compared to their amounts at the time when the aqueous solution and organic solution were brought into contact.

In the process of the invention, a precipitate is allowed to form when the said aqueous and organic solutions are contacted. "Allowing" a precipitate to form may not require action. Simply bringing the precursors into contact by contacting an organic solution and an aqueous solution (and where necessary any additional solutions) is generally sufficient to cause a precipitate to form. However, in some embodiments, "allowing" a precipitate to form may optionally comprise agitating the reaction mixture, for instance mixing the aqueous solution and the organic solution. "Allowing" a precipitate to form may optionally comprise heating the reaction mixture.

The process of the invention may therefore comprise:
  a) contacting an aqueous solution comprising an A precursor and an aqueous solvent with an organic solution comprising an M precursor and an organic solvent to form a reaction mixture comprising said aqueous solution and said organic solution; and
  b) allowing a precipitate to form when the said aqueous and organic solutions are contacted, which process optionally comprises agitating the reaction mixture.

Suitable methods of agitating the reaction mixture would be well known to the person skilled in the art, for instance stirring the reaction mixture e.g. with a stirrer bar.

During the step of allowing a precipitate to form, the process may comprise heating the reaction mixture. For example step (b) may comprise heating the reaction mixture to a temperature of from 25° C. to 120° C., preferably to a temperature of from 30° C. to 100° C.; more preferably to a temperature of from 40° C. to 80° C. Heating the reaction mixture may be desirable where one or more of the precursors involved has poor solubility. However, heating the reaction mixture may discourage precipitation of the A/M/X product and so in some embodiments step (b) does not comprise heating the reaction mixture.

The precipitate formed in step (b) comprises crystals of a crystalline A/M/X material. The said crystals are typically very small. For instance, the said crystals generally have a diameter of 1000 nm or less, for example 100 nm or less, or 10 nm or less. By "diameter" is meant the diameter of the largest sphere that fits entirely inside the crystal. Crystal size can conveniently be measured by standard techniques such as SEM, TEM or DLS (that is, dynamic light scattering). Typically crystal size is measured by SEM.

In some embodiments, therefore, at least 80% or at least 90% of the crystals of the precipitate have a diameter of 100 nm or less, and preferably at least 80% or at least 90% of the crystals of the precipitate have a diameter of 10 nm or less.

In some embodiments, the precipitate comprises crystals having a diameter of 2 nm to 1000 nm; e.g. from 10 nm to 100 nm. For instance, in some embodiments at least 80% or at least 90% of the crystals of the precipitate have a diameter of from 2 nm to 1000 nm; preferably at least 80% or at least 90% of the crystals of the precipitate have a diameter of 10 nm to 100 nm.

In some embodiments, the process may comprise reducing the size of the precipitate after it is formed. This step may be performed after step (b) and/or after step (c) or step (c'). Typical methods for reducing the size of the precipitate are mechanical methods, for example ball grinding. Ball grinding is described in "Mechanochemical synthesis of advanced nanomaterials for catalytic applications", Xu et al., Chem. Commun., 2015, 51, 6698.

After grinding, the precipitate may comprise somewhat smaller particulates. For instance, after grinding, at least 80% or at least 90% of the crystals of the precipitate typically have a diameter of from 2 to 100 nm, e.g. from 5 to 50 nm.

Figure 13A:
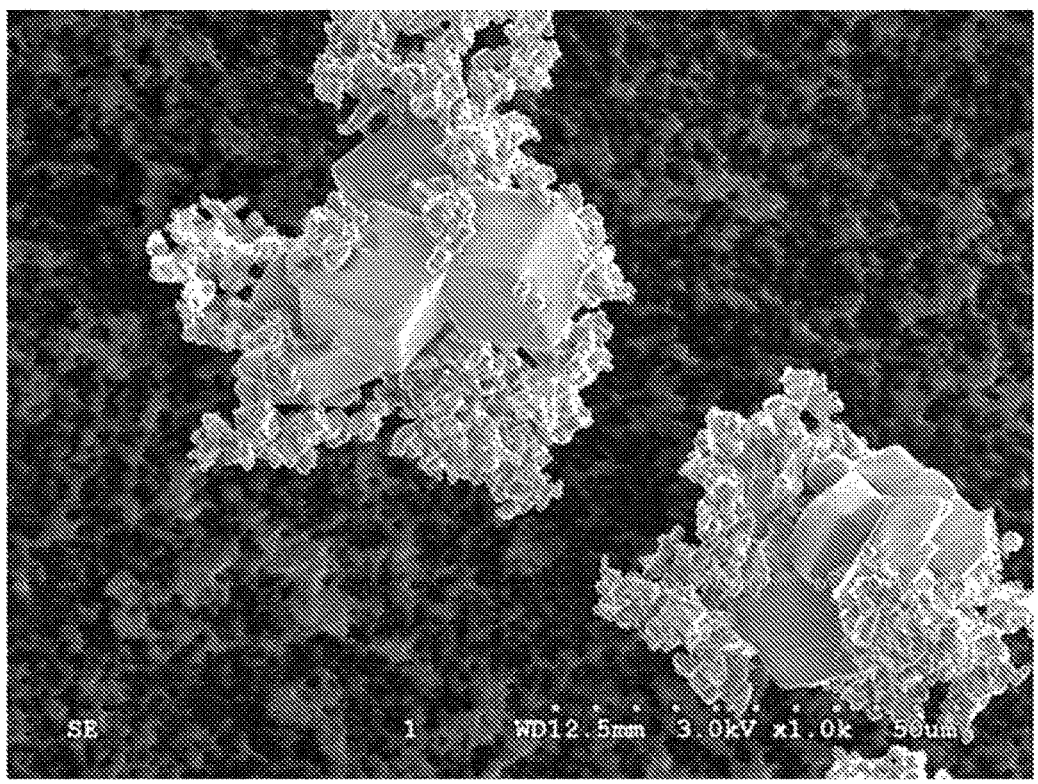
FIG. 13 shows an SEM image of a powder comprising $CsPbBr_3$ prepared according to the invention, with a 1:1 Cs:Pb ratio. The dark background is a carbon tape coating the SEM sample holder. The brighter regions in the image are the $CsPbBr_3$ powder. 13A shows this powder at magnification of 1,000 times, while 13B shows this powder at a magnification of 10,000 times.
Figure 13B:
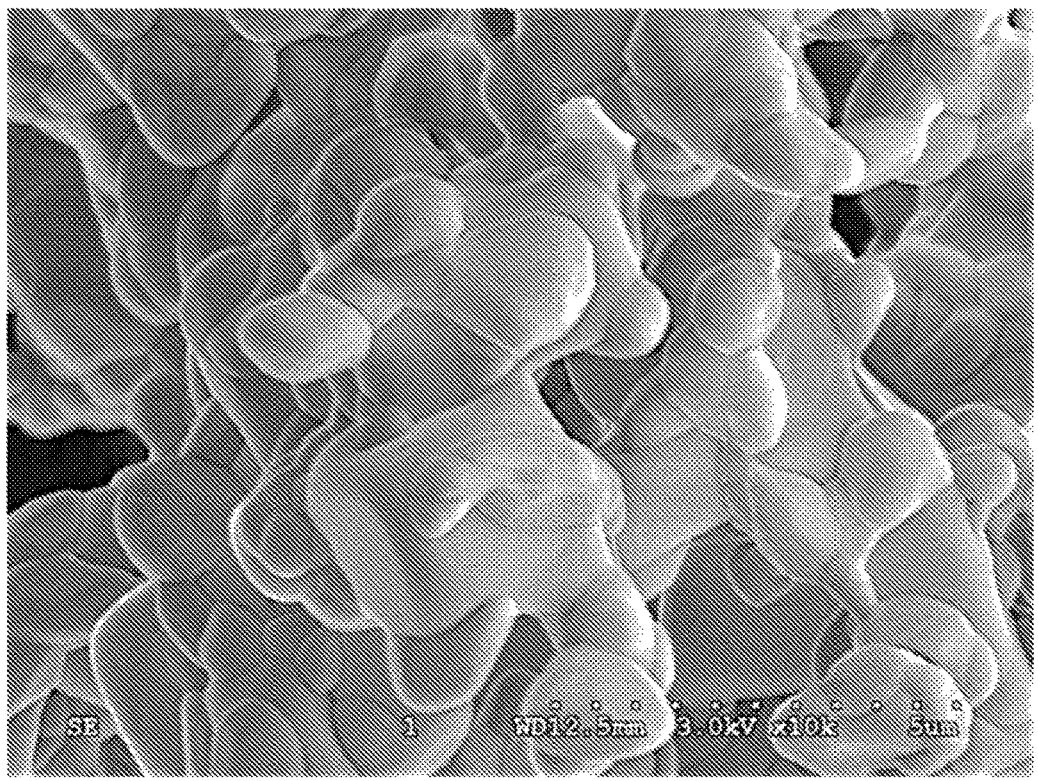
Figure 14A:
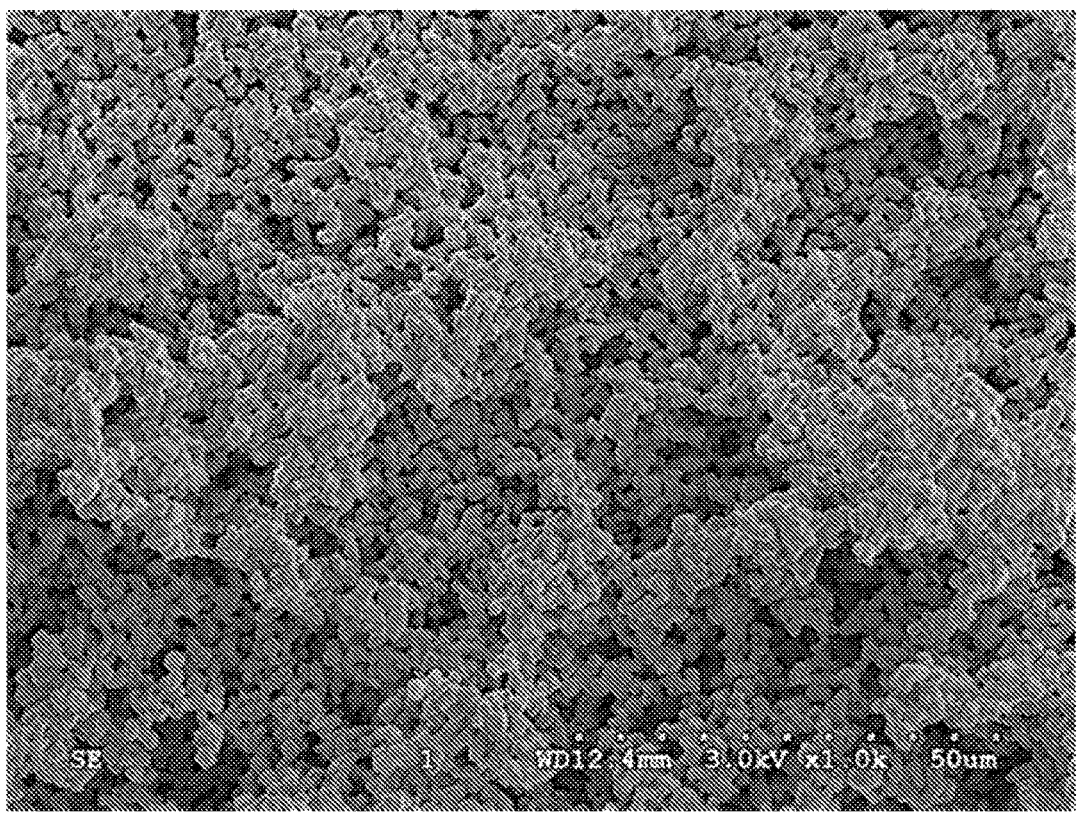
FIG. 14 shows an SEM image of powder comprising $CsPb(Br_{0.7}Cl_{0.3})_3$. 14A shows this powder at magnification of 1,000 times, while 14B shows this powder at a magnification of 20,000 times.
Figure 14B:
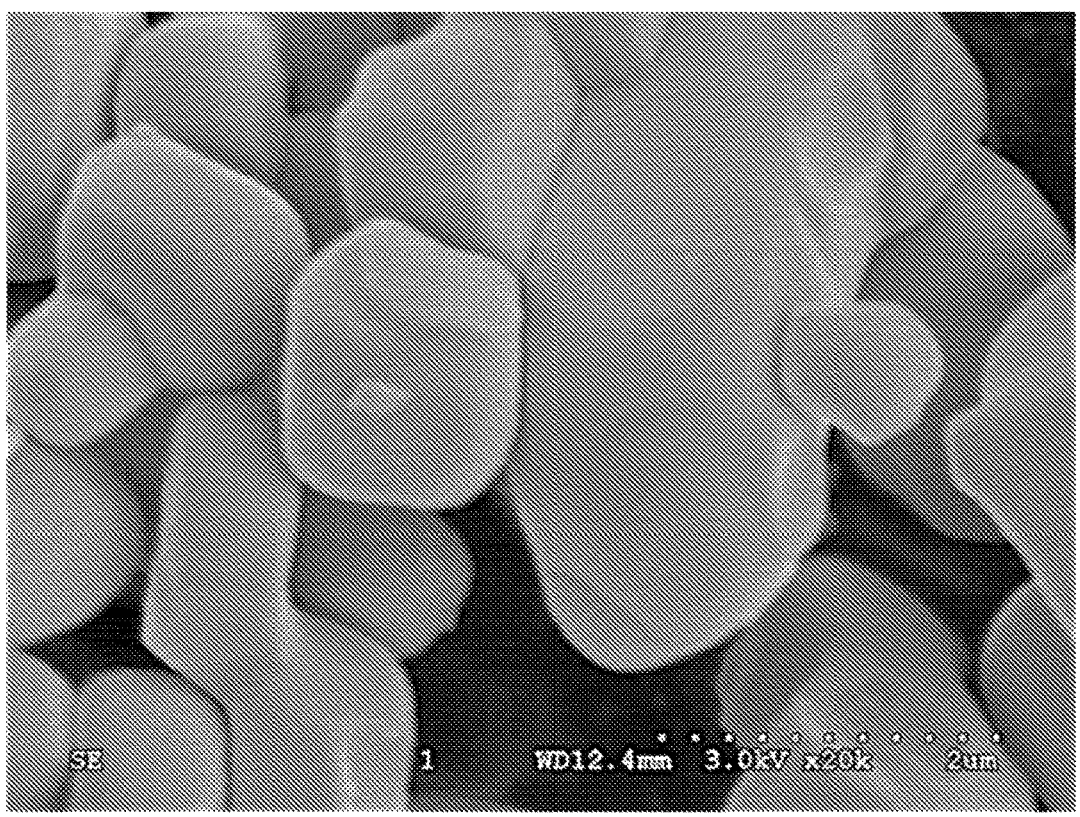
Figure 15A:
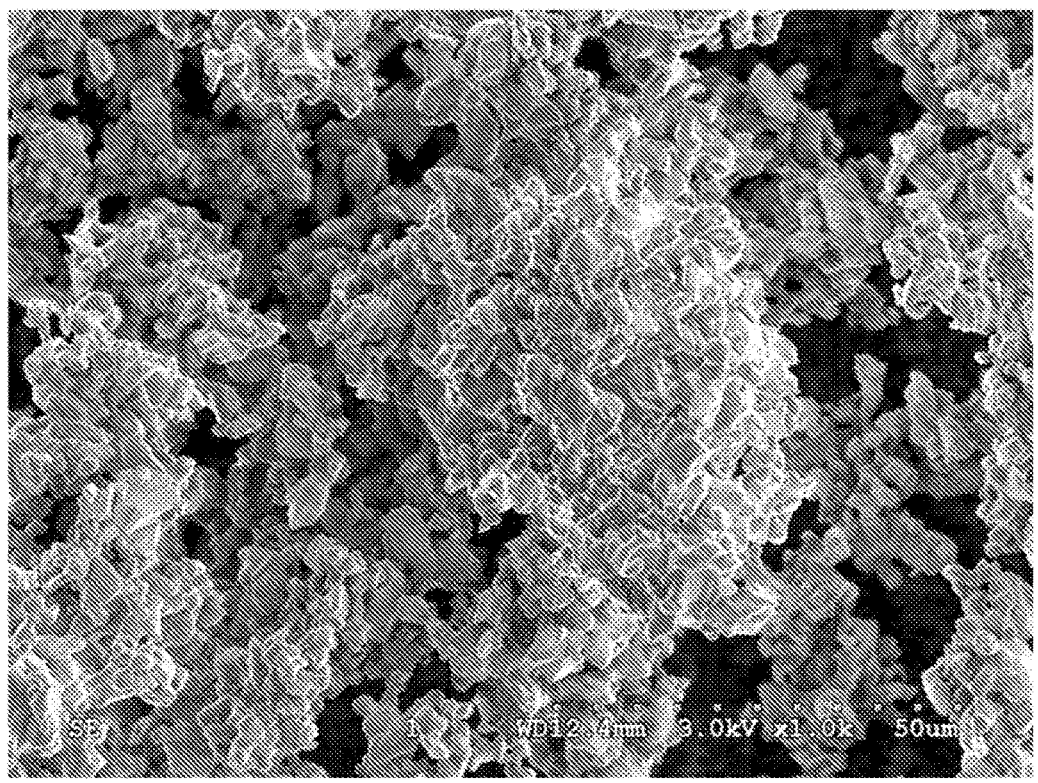
FIG. 15 shows a powder comprising $Cs_4PbBr_6$, produced via the method of this invention from a starting solution Cs:Pb ratio of 10:1. 15A shows this powder at magnification of 1,000 times, while 15B shows this powder at a magnification of 5,000 times.
Figure 15B:
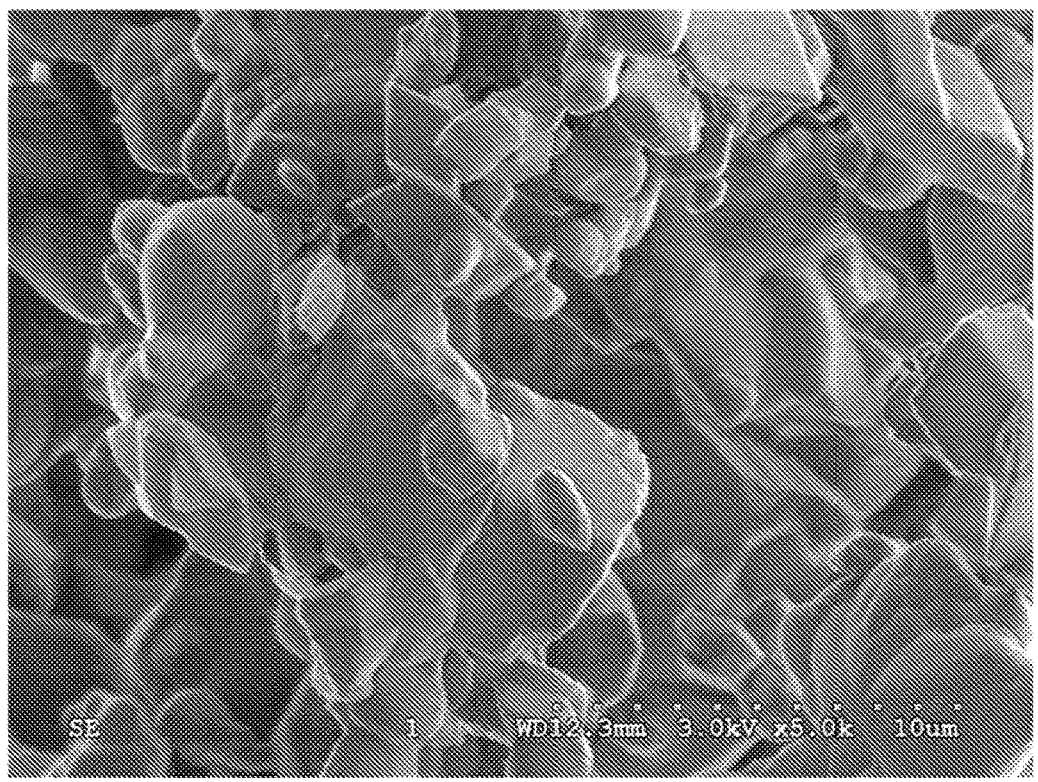

The precipitate may be in the form of a powder. Exemplary powders in accordance with the invention are shown in FIGS. 13, 14 and 15.

Due to the small size of the crystals in the precipitate, the precipitate may often be referred to as a powder. The precipitate may often be referred to as a nanopowder, if the average particle size is from 5 to 50 nm.

Preparation of Aqueous and Organic Solutions

The process of the invention involves at least one organic solution and at least one aqueous solution. In some embodiments of the invention, the process comprises preparing the aqueous solution, or preparing the organic solution, or preparing the aqueous solution and the organic solution.

The aqueous solution comprises an aqueous solvent and an A precursor. Typically, therefore, the aqueous solution can be prepared by dissolving the said A precursor in the said aqueous solvent.

In some embodiments, the compound of formula $[A]_a[M]_b[X]_c$ comprises two or more A cations. In a preferred aspect of this embodiment, the process comprising contacting a single aqueous solution comprising one or more A precursors as necessary to provide each of the A cations with an organic solution as defined herein.

Where a single A precursor comprising each of the said two or more A cations is available, an aqueous solution for use in the invention may be prepared by dissolving that A precursor comprising each of the two or more A cations in an aqueous solvent. However, where such a precursor is not available, it may be necessary to prepare an aqueous solution comprising two or more A precursors. This may be done by dissolving a plurality of A precursors in a single solvent (typically an aqueous solvent). Alternatively, this may be done by dissolving one or more A precursors in each of two or more solvents, and subsequently combining the resulting solutions.

In some embodiments, therefore, wherein [A] comprises two or more different A cations, the process comprises prior to step (a), a step of preparing an aqueous solution by combining a solution of a first A precursor with a solution of a second A precursor,
wherein:
the first A precursor comprises a first A cation; and
the second A precursor comprises a second A cation.

The first A precursor comprises "a first A cation", which may conveniently referred to using the notation $A^I$. Accordingly, the first A precursor or "$A^I$ precursor" comprises a cation $A^I$. The second A precursor comprises "a second A cation", which may conveniently be referred to using the notation $A^{II}$ to indicate an A cation different to $A^I$. Accordingly, the second A precursor or $A^I$ precursor" comprises a cation $A^{II}$. The solution of the first A precursor is typically an aqueous solution as defined herein. The solution of the second A precursor is also typically an aqueous solution as defined herein.

Each solution of each A precursor is typically prepared by dissolving the A precursor in an aqueous solvent.

The invention therefore provides a process for producing a crystalline A/M/X material, which crystalline A/M/X material comprises a compound of formula:

$$[A]_a[M]_b[X]_c$$

wherein:
[A] comprises an $A^I$ cation and an $A^{II}$ cation;
[M] comprises one or more M cations which are metal or metalloid cations;
[X] comprises one or more X anions which are halide anions;
a is a number from 1 to 6;
b is a number from 1 to 6; and
c is a number from 1 to 18,
the process comprising combining a first aqueous solution comprising an $A^I$ precursor and a first aqueous solvent with a second aqueous solution comprising an $A^{II}$ precursor and a second aqueous solvent (which may be the same as or different to the first aqueous solvent) to form an aqueous solution, and:
a) contacting the aqueous solution with an organic solution comprising an M precursor and an organic solvent; and
b) allowing a precipitate to form when the said aqueous and organic solutions are contacted.

In some embodiments, the compound of formula $[A]_a[M]_b[X]_c$ comprises two or more M cations. In a preferred aspect of this embodiment, the process comprising contacting a single organic solution comprising one or more M precursors as necessary to provide each of the M cations with an aqueous solution as defined herein.

Where a single M precursor comprising each of the said two or more M cations is available, an organic solution for use in the invention may be prepared by dissolving that M precursor comprising each of the two or more M cations in an organic solvent. However, where such a precursor is not available, it may be necessary to prepare an organic solution comprising two or more M precursors. This may be done by dissolving a plurality of M precursors in a single solvent (typically an organic solvent). Alternatively, this may be done by dissolving one or more M precursors in each of two or more solvents, and subsequently combining the resulting solutions.

In some embodiments, therefore, wherein [M] comprises two or more different M cations, the process comprises prior to step (a), a step of preparing an organic solution by combining a solution of a first M precursor with a solution of a second M precursor,
wherein:
the first M precursor comprises a first M cation; and
the second M precursor comprises a second M cation.

The first M precursor comprises "a first M cation", which may conveniently referred to using the notation $M^I$. Accordingly, the first M precursor or "$M^I$ precursor" comprises a cation $M^I$. The second M precursor comprises "a second M cation", which may conveniently be referred to using the notation $M^{II}$ to indicate an M cation different to $M^I$. Accordingly, the second M precursor or "$M^{II}$ precursor" comprises a cation Mr. The solution of the first M precursor is typically an organic solution as defined herein. The solution of the second M precursor is also typically an organic solution as defined herein.

Each solution of each M precursor is typically prepared by dissolving the M precursor in an organic solvent. Each of the organic solvents may comprise one or more X precursors. For instance, each of the organic solvents may comprise a hydrohalic acid of formula HX', where X' is one of the X anions present in [X].

The invention therefore provides a process for producing a crystalline A/M/X material, which crystalline A/M/X material comprises a compound of formula:

$$[A]_a[M]_b[X]_c$$

wherein:
[A] comprises one or more A cations;
[M] comprises an $M^1$ cation and an $M^{II}$ cation which are both metal or metalloid cations;
[X] comprises one or more X anions which are halide anions;
a is a number from 1 to 6;
b is a number from 1 to 6; and
c is a number from 1 to 18,
the process comprising combining a first organic solution comprising an $M^1$ precursor, a first organic solvent and optionally a hydrohalic acid with a second organic solution comprising an $M^{II}$ precursor, a second organic solvent (which may be the same as or different to the first organic solvent) and optionally a hydrohalic acid to form an organic solution, and:
a) contacting an aqueous solution comprising an A precursor and an aqueous solvent with the said organic solution; and
b) allowing a precipitate to form when the said aqueous and organic solutions are contacted.

In one embodiment, the invention provides a process for producing a crystalline A/M/X material, which crystalline A/M/X material comprises a compound of formula:

$$[A]_a[M]_b[X]_c$$

wherein:
[A] comprises an $A^I$ cation and an $A^{II}$ cation;
[M] comprises an $M^I$ cation and an $M^{II}$ cation which are both metal or metalloid cations;
[X] comprises one or more X anions which are halide anions;
a is a number from 1 to 6;
b is a number from 1 to 6; and
c is a number from 1 to 18, the process comprising:
combining a first organic solution comprising an $M^I$ precursor, a first organic solvent and optionally a hydrohalic acid with a second organic solution comprising an $M^{II}$ precursor, a second organic solvent (which may be the same as or different to the first organic solvent) and optionally a hydrohalic acid to form an organic solution;
combining a first aqueous solution comprising an $A^I$ precursor and a first aqueous solvent with a second aqueous solution comprising an $A^{II}$ precursor and a second aqueous solvent (which may be the same as or different to the first aqueous solvent) to form an aqueous solution, and:
  a) contacting the said aqueous solution with the said organic solution; and
  b) allowing a precipitate to form when the said aqueous and organic solutions are contacted.

In some embodiments, the compound of formula $[A]_a[M]_b[X]_c$ comprises two or more X anions. In a preferred aspect of this embodiment, the process comprises contacting a single organic solution with a single aqueous solution which together contain the relevant X anions. In this embodiment, it may optionally be preferred that the aqueous solution and/or the organic solution each comprise the two or more X anions present in the compound of formula $[A]_a[M]_b[X]_c$. This may assist with finely balancing the stoichiometry of the precipitate.

In such an embodiment, where a single A precursor comprising each of the said two or more X anions is available, an aqueous solution for use in the invention may be prepared by dissolving that A precursor comprising each of the two or more X anions in an aqueous solvent. Similarly, where a single M precursor comprising each of the said two or more X anions is available, an organic solution for use in the invention may be prepared by dissolving that M precursor comprising each of the two or more X anions in an organic solvent. However, where such precursors are not available, it may be necessary to prepare an aqueous solution and/or and organic solution comprising two or more A precursors or M precursors respectively. In the case of the aqueous solution, this may be done by dissolving a plurality of A precursors, each comprising one or more X anions, in a single solvent (typically an aqueous solvent). Alternatively, this may be done by dissolving one or more A precursors each comprising one or more X anions in each of two or more solvents, and subsequently combining the resulting solutions. Similarly, in the case of the organic solution, this may be done by dissolving a plurality of M precursors (each comprising one or more X anions) in a single solvent (typically an organic solvent). Alternatively, this may be done by dissolving one or more M precursors (each comprising one or more X anions) in each of two or more solvents, and subsequently combining the resulting solutions.

For example, the invention provides a process for producing a crystalline A/M/X material, which crystalline A/M/X material comprises a compound of formula:

wherein:
  [A] comprises an A cation;
  [M] comprises an M cation which are both metal or metalloid cations;
  [X] comprises an $X^I$ anion and an $X^{II}$ anion which are halide anions;
  a is a number from 1 to 6;
  b is a number from 1 to 6; and
  c is a number from 1 to 18,
the process comprising:
combining a first organic solution comprising an M precursor which contains an $X^I$ anion, a first organic solvent and optionally a hydrohalic acid with a second organic solution comprising an M precursor which contains an $X^{II}$ anion, a second organic solvent (which may be the same as or different to the first organic solvent) and optionally a hydrohalic acid to form an organic solution;
combining a first aqueous solution comprising an A precursor (which contains an $X^I$ anion) and a first aqueous solvent with a second aqueous solution comprising an A precursor (which contains an $X^{II}$ anion) and a second aqueous solvent (which may be the same as or different to the first aqueous solvent) to form an aqueous solution, and:
  a) contacting the said aqueous solution with the said organic solution; and
  b) allowing a precipitate to form when the said aqueous and organic solutions are contacted.

The skilled person will appreciate that by combining different A precursors and M precursors to create an aqueous solution and an organic solution each containing a variety of ions, any compound of formula $[A]_a[M]_b[X]_c$ may be created in the process of the invention by contacting only one aqueous solution with only one organic solution.

Processing of Precipitate

The precipitate produced by the process of the invention comprises a compound of formula $[A]_a[M]_b[X]_c$. The precipitate is itself therefore a crystalline A/M/X material. However, the precipitate when it is initially formed is present in a reaction mixture comprising an aqueous solvent and an organic solvent. The reaction mixture may also comprise one or more A precursors, M precursors or X precursors, either in solution or as solid particles.

Typically, it is desirable to separate the solid precipitate from the liquid components of the reaction mixture. This may be referred to as recovering the precipitate. Typically, therefore, the process comprises recovering the precipitate. For example, the process may comprise one or more further steps to recover the precipitate.

In some embodiments, therefore, the process may further comprise filtering the reaction mixture to obtain the solid precipitate. In other embodiments, the process may comprise centrifuging the reaction mixture and decanting most or all of the liquid from the centrifuged reaction mixture to obtain the solid precipitate. Alternatively the precipitate may be allowed to settle without centrifugation before most or all of the liquid is decanted off the solid precipitate. A mixture of these techniques may be used to remove the liquid components of the reaction mixture from the solid precipitate.

If the precipitate is merely separated from the reaction mixture, the crystalline A/M/X material therein may be contaminated with residues of solvent, with side-products, with solid particles of residual A precursor or M precursor or any other component. It is preferable therefore to remove such contaminants from the precipitate before the precipitate is used in any downstream application such as the manufacture of an optoelectronic device. Removal of contaminants from the precipitate may be referred to as purifying the precipitate.

An exemplary method of purifying the precipitate is to wash it. Washing of the precipitate involves exposing the precipitate to a solvent in which it is sparingly soluble or insoluble at the temperature of the process, and then removing the washing solvent from the precipitate (e.g. by decanting or filtration as described herein).

The precipitate may be washed before or after the precipitate is recovered from the reaction mixture. For example, the reaction mixture may be diluted with a solvent and subsequently the precipitate may be recovered. Alternatively or additionally, the precipitate may be recovered before it is washed.

Washing of the precipitate may be repeated multiple times, e.g. once, twice, three times, four times or five times.

In a preferred embodiment, the process of the invention comprises:
- c) contacting an aqueous solution comprising an A precursor and an aqueous solvent with an organic solution comprising an M precursor and an organic solvent to form a reaction mixture;
- d) allowing a precipitate to form when the said aqueous and organic solutions are contacted; and
- recovering the precipitate from the reaction mixture and then washing the precipitate.

Formation of a Thin Film

The precipitate formed by the process of the invention can be used directly in a variety of applications. However, in a particularly preferred embodiment of the invention, the process involves optionally purifying the precipitate and using the precipitate as a starting material for the formation of a thin film comprising a crystalline A/M/X material. The inventors have surprisingly found that thin films of crystalline A/M/X material formed from a starting material comprising a precipitate of the same crystalline A/M/X material have finely tunable properties such as peak emission wavelength and emission intensity.

One method by which the precipitate can be used as a starting material in the creation of a thin film is to dissolve the precipitate in an organic solvent to form a film-forming solution, and then prepare a thin film from the film-forming solution.

Accordingly, the process of the invention is preferably a process for preparing a thin film of said crystalline A/M/X material, the process further comprising:
- c) optionally washing the precipitate;
- d) dissolving the precipitate in an organic solvent to form a film-forming solution; and
- e) dispersing the film-forming solution on a substrate.

The organic solvent in which the precipitate is dissolved may be the same as or different to the organic solvent present in the organic solution containing an M precursor. Usually, however, these two organic solvents are different.

The step of washing the precipitate is optional. It is possible to prepare a film-forming solution directly from the precipitate recovered from the reaction mixture. However, washing removes traces of A precursor, M precursor and (where present) X precursor, as well as solvents. This may assist with ensuring precise control of the stoichiometry of the crystalline A/M/X material in the thin film. It is therefore preferable to wash the precipitate before preparing a thin film therefrom.

In a preferred embodiment, the process of the invention is a process for producing a thin film of a crystalline A/M/X material, the process comprising:
- a) contacting an aqueous solution comprising an A precursor and an aqueous solvent with an organic solution comprising an M precursor and an organic solvent;
- b) allowing a precipitate to form when the said aqueous and organic solutions are contacted;
- c) recovering and washing the precipitate;
- d) dissolving the precipitate in an organic solvent to form a film-forming solution; and
- e) dispersing the film-forming solution on a substrate.

The film-forming solution may be dispersed, or disposed, on a substrate by any method. The film-forming solution may for instance be poured or dropped on the substrate. However, according to established techniques for formation of thin films it is convenient to spin-coat a substrate with a film-forming solution to promote thin film formation. Accordingly it is preferred that step (e) comprises spin-coating the film-forming solution on the substrate.

Once the film-forming solution has been disposed on a substrate, a thin crystalline film is allowed to form. This may be allowed to occur passively. For example, the substrate and film-forming solution disposed or dispersed thereon may simply be left, in ambient conditions (e.g. room temperature). A thin crystal film will generally gradually form. To obtain a thin film, though, it is preferable to remove the solvent entirely from the film-forming solution, leaving the thin film in the absence of solvent.

In a preferred embodiment, therefore, the process further comprises:
- f) removing the organic solvent from the film-forming solution on the substrate, preferably by evaporation, preferably at a temperature of 15 to 150° C., also preferably for at least 1 minute.

This process can be rather slow and it may be preferred to accelerate the process by heating. Accordingly, in a preferred embodiment step (f) is performed at a temperature of at least 20° C., for example at least 50° C. For example, the organic solvent may be removed in step (f) at a temperature of from 50° C. to 120° C.

Other methods of accelerating solvent loss and formation of a thin film include applying a reduced pressure, for instance a pressure of 0.5 to 0.99 atm.

In another embodiment, rather than preparing a film-forming solution from which a thin film can be created, the thin film may be created by a vapour deposition process. In a further embodiment of the process of the invention, therefore, the process is a process for preparing a thin film of said crystalline A/M/X material, the process further comprising:
- c') optionally washing the precipitate;
- d') vapourising the precipitate; and
- e') depositing the vapourised precipitate on a substrate.

As was explained above, the step of washing the precipitate is optional as it is possible to prepare a film-forming solution directly from the precipitate recovered from the reaction mixture. However, washing removes traces of A precursor, M precursor and (where present) X precursor, as well as solvents. This may assist with ensuring precise control of the stoichiometry of the crystalline A/M/X material in the thin film. It is therefore preferable to wash the precipitate before preparing a thin film therefrom.

Consequently, in another preferred embodiment, the process of the invention is a process for producing a thin film of a crystalline A/M/X material, the process comprising:
- a) contacting an aqueous solution comprising an A precursor and an aqueous solvent with an organic solution comprising an M precursor and an organic solvent;
- b) allowing a precipitate to form when the said aqueous and organic solutions are contacted;
- c') recovering and washing the precipitate;
- d') vapourising the precipitate; and
- e') depositing the vapourised precipitate on a substrate.

Methods of vapourising the precipitate and disposing them on a substrate are known in the art. Typically, the process comprises heating an evacuated chamber comprising the optionally washed precipitate, to form a vapour, and then allowing that vapour to come into contact with the substrate.

Compound of Formula $[A]_a[M]_b[X]_c$

The process of the invention produces a crystalline A/M/X material comprising a compound of formula $[A]_a[M]_b[X]_c$. The compound of formula $[A]_a[M]_b[X]_c$ is crystalline. Within this compound, [A] comprises one or more A cations; [M] comprises one or more M cations; [X] comprises one or more X anions; a is a number from 1 to 6; b is a number from 1 to 6; and c is a number from 1 to 18. a is often a number from 1 to 4, b is often a number from 1 to 3, and c is often a number from 1 to 8.

Each of a, b and c may or may not be an integer. For instance, a, b or c may not be an integer where the compound adopts a structure having vacancies such that the crystal lattice is not completely filled. The method of the invention provides very good control over stoichiometry of the product and so is well-suited for forming structures where a, b or c is not an integer (for instance a structure having vacancies in one or more of the A, M or X sites). Accordingly, in some embodiments, one or more of a, b and c is a non-integer value. For example, one of a, b and c may be a non-integer value. In one embodiment, a is a non-integer value. In another embodiment, b is a non-integer value. In yet another embodiment, c is a non-integer value.

In other embodiments, each of a, b and c are integer values. Thus, in some embodiments, a is an integer from 1 to 6; b is an integer from 1 to 6; and c is an integer from 1 to 18. a is often an integer from 1 to 4, b is often an integer from 1 to 3, and c is often an integer from 1 to 8.

In the compound of formula $[A]_a[M]_b[X]_c$, generally:

[A] comprises one or more A cations, which A cations may for instance be selected from alkali metal cations or organic monocations;

[M] comprises one or more M cations which are metal or metalloid cations selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Bi^{3+}$, $Sb^{3+}$, $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$, preferably $Sn^{2+}$, $Pb^{2+}$, $Cu^{2+}$, $Ge^{2+}$, and $Ni^{2+}$; particularly preferably $Pb^{2+}$;

[X] comprises one or more X anions selected from halide anions (e.g. $Cl^-$, $Br^-$, and $I^-$), $O^{2-}$, $S^{2-}$, $Se^{2-}$, and $Te^{2-}$;

a is a number from 1 to 4;
b is a number from 1 to 3; and
c is a number from 1 to 8.

Preferably the compound of formula $[A]_a[M]_b[X]_c$ comprises a perovskite. The compound of formula $[A]_a[M]_b[X]_c$ often comprises a metal halide perovskite.

In general, said one or more A cations are monocations and said one or more M cations are dications. However, other ionic charges are possible, as is apparent from the various exemplary embodiments of the compound of formula $[A]_a[M]_b[X]_c$ discussed below.

Typically, a=1, b=1 and c=3. Thus, typically, the crystalline A/M/X material comprises: a perovskite of formula (I):

$$[A][M][X]_3 \quad (I)$$

wherein: [A] comprises one or more A cations which are monocations; [M] comprises one or more M cations which are metal or metalloid dications; and [X] comprises one or more anions which are halide anions.

[A] comprises one or more A cations which may be organic and/or inorganic monocations. Where an A species is an organic monocation, A is typically selected from $C_{1-10}$ alkylammonium, $C_{2-10}$ alkenylammonium, $C_{1-10}$ alkylim-inium, $C_{3-10}$ cycloalkylammonium and $C_{3-10}$ cycloalkyliminium optionally substituted with one or more substituents selected from amino, $C_{1-6}$ alkylamino, imino, $C_{1-6}$ alkylimino, $C_{1-6}$ alkyl, $C_{2-6}$ alkenyl, $C_{3-6}$ cycloalkyl and $C_{6-12}$ aryl. For example, A may be selected from $(CH_3NH_3)^+$, $(CH_3CH_2NH_3)^+$, $(CH_3CH_2CH_2NH_3)^+$, $(N(CH_3)_4)^+$, $(H_2N—C(H)=NH_2)^+$ and $(H_2N—C(CH_3)=NH_2)^+$. Where an A species is an inorganic monocation, A is typically an alkali metal monocation (that is, a monocation of a metal found in Group 1 of the periodic table), for example $Cs^+$ or $Rb^+$.

[A] usually comprises one, two or three A monocations. Preferably, A comprises a single cation selected from $(CH_3NH_3)^+$, $(CH_3CH_2NH_3)^+$, $(CH_3CH_2CH_2NH_3)^+$, $(N(CH_3)_4)^+$, $(H_2N—C(H)=NH_2)^+$, $(H_2N—C(CH_3)=NH_2)^+$, $Cs^+$ and $Rb^+$. Alternatively, [A] may comprise two cations selected from this group, for instance $Cs^+$ and $(H_2N—C(CH_3)=NH_2)^+$, or $Cs^+$ and $(H_2N—C(H)=NH_2)^+$, or for instance $Cs^+$ and $Rb^+$.

[M] comprises one or more M cations which are metal or metalloid dications. For instance, [M] may comprise an M cation selected from $Ca^2$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. [M] typically comprises one or two M cations, and these are generally selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$; preferably $Pb^{2+}$.

[X] comprises one or more X anions. For instance, [X] may comprise an anion selected from $F^-$, $Br^-$, $Cl^-$ and $I^-$. [X] typically comprises one, two or three X anions and these are generally selected from $Br^-$, $Cl^-$ and $I^-$. [X] may for instance consist of two X anions, such as Cl and Br, or Br and I, or Cl and I.

In one embodiment, the perovskite is a perovskite of the formula (IA):

$$[A^I_x A^{II}_{1-x}]MX_3 \quad (IA)$$

wherein $A^I$ and $A^{II}$ are as defined above with respect to A, wherein M and X are as defined above and wherein x is greater than 0 and less than 1. In a preferred embodiment, $A^I$ and $A^{II}$ are each selected from $(CH_3NH_3)^+$, $(CH_3CH_2NH_3)^+$, $(CH_3CH_2CH_2NH_3)^+$, $(N(CH_3)_4)^+$, $(H_2N—C(H)=NH_2)^+$, $(H_2N—C(CH_3)=NH_2)^+$, $Cs^+$ and $Rb^+$; M is $Pb^{2+}$ and X is selected from $Br^-$, $Cl^-$ and $I^-$. $A^I$ and $A^{II}$ may for instance be $(H_2N—C(CH_3)=NH_2)^+$ and $Cs^+$ respectively, or they may be $Cs^+$ and $(H_2N—C(H)=NH_2)^+$ respectively. Alternatively, they may be $Cs^+$ and $Rb^+$ respectively.

In one embodiment, the perovskite is a perovskite compound of the formula (IB):

$$AM[X^I_y X^{II}_{1-y}]_3 \quad (IA)$$

wherein A and M are as defined above, wherein $X^I$ and $X^{II}$ are as defined above in relation to X and wherein y is greater than 0 and less than 1. In a preferred embodiment, A is selected from $(CH_3NH_3)^+$, $(CH_3CH_2NH_3)^+$, $(CH_3CH_2CH_2NH_3)^+$, $(N(CH_3)_4)^+$, $(H_2N—C(H)=NH_2)^+$, $(H_2N—C(CH_3)=NH_2)^+$, $Cs^+$ and $Rb^+$; M is $Pb^{2+}$ and $X^I$ and $X^{II}$ are each selected from $Br^-$, $Cl^-$ and $I^-$.

In a particularly preferred embodiment, the perovskite is a perovskite of the formula (IC):

$$[A^I_x A^{II}_{1-x}]M[X^I_y X^{II}_{1-y}]_3 \quad (IC)$$

wherein $A^I$ and $A^{II}$ are as defined above with respect to A, M is as defined above, $X^I$ and $X^{II}$ are as defined above in relation to X and wherein x and y are both greater than 0 and less than 1. In a preferred embodiment, $A^I$ and $A^{II}$ are each selected from $(CH_3NH_3)^+$, $(CH_3CH_2NH_3)^+$, $(CH_3CH_2CH_2NH_3)^+$, $(N(CH_3)_4)^+$, $(H_2N-C(H)=NH_2)^+$, $(H_2N-C(CH_3)=NH_2)^+$, $Cs^+$ and $Rb^+$; M is $Pb^{2+}$ and $X^I$ and $X^{II}$ are each selected from $Br^-$, $Cl^-$ and $I^-$.

Generally, in the above, x is from 0.01 to 0.99. For example, x may be from 0.05 to 0.95 or 0.1 to 0.9. Similarly, in the above, y is generally from 0.01 to 0.99. For example, y may be from 0.05 to 0.95 or 0.1 to 0.9. In an exemplary embodiment, x and y are both from 0.1 to 0.9.

In exemplary embodiments, the compound of formula $[A]_a[M]_b[X]_c$ is selected from $CsPbBr_3$, $CsPbCl_3$, $CsPbI_3$, $CsPb(Br_yCl_{1-y})_3$, $CsPb(Br_yI_{1-y})_3$, $CsPb(Cl_yI_{1-y})_3$, $(Cs_xRb_{1-x})PbBr_3$, $(Cs_xRb_{1-x})PbCl_3$, $(Cs_xRb_{1-x})PbI_3$, $(Cs_xRb_{1-x})Pb(Br_yCl_{1-y})_3$, $(Cs_xRb_{1-x})Pb(Br_yI_{1-y})_3$, and $(Cs_xRb_{1-x})Pb(Cl_yI_{1-y})_3$, wherein x and y are both greater than 0 and less than 1. Preferably, in these embodiments, x is from 0.01 to 0.99 and y is from 0.01 to 0.99; more preferably, x is from 0.05 to 0.95 and y is from 0.05 to 0.95.

In one embodiment, a=2, b=1 and c=4. In that embodiment, the crystalline A/M/X material comprises a compound (a "2D layered perovskite") of formula (II):

$$[A]_2[M][X]_4 \qquad (II)$$

wherein: [A] comprises one or more A cations which are monocations; [M] comprises one or more M cations which are metal or metalloid dications; and [X] comprises one or more X anions which are halide anions. In this embodiment, the A and M cations, and the X anions, are as defined above in relation to the perovskite of formula (I).

In another embodiment, a=2, b=1 and c=6. In that embodiment, the crystalline A/M/X material may in that case comprise a hexahalometallate of formula (III):

$$[A]_2[M][X]_6 \qquad (III)$$

wherein: [A] comprises one or more A cations which are monocations; [M] comprises one or more M cations which are metal or metalloid tetracations; and [X] comprises one or more X anions which are halide anions.

The hexahalometallate of formula (III) may in a preferred embodiment be a mixed monocation hexahalometallate. In a mixed monocation hexahalometallate, [A] comprises at least two A cations which are monocations; [M] comprises at least one M cation which is a metal or metalloid tetracation (and typically [M] comprises a single M cation which is a metal or metalloid tetracation); and [X] comprises at least one X anion which is a halide anion (and typically [X] comprises a single halide anion or two types of halide anion). In a mixed metal hexahalometallate, [A] comprises at least one monocation (and typically [A] is a single monocation or two types of monocation); [M] comprises at least two metal or metalloid tetracations (for instance $Ge^{4+}$ and $Sn^{4+}$); and [X] comprises at least one halide anion (and typically [X] is a single halide anion or two types of halide anion). In a mixed halide hexahalometallate, [A] comprises at least one monocation (and typically [A] is a single monocation or two types of monocation); [M] comprises at least one metal or metalloid tetracation (and typically [M] is a single metal tetracation); and [X] comprises at least two halide anions, for instance $Br^-$ and $Cl^-$ or $Br^-$ and $I^-$.

[A] may comprise at least one A monocation selected from any suitable monocations, such as those described above for a perovskite. In the case of a hexahalometallate, each A cation is typically selected from $Li^+$, $Na^+$, $K^+$, $Rb^+$, $Cs^+$, $NH_4^+$ and monovalent organic cations. Monovalent organic cations are singly positively charged organic cations, which may, for instance, have a molecular weight of no greater than 500 g/mol. For instance, [A] may be a single A cation which is selected from $Li^+$, $Na^+$, $K^+$, $Rb^+$, $Cs^+$, $NH_4^+$ and monovalent organic cations. [A] preferably comprises at least one A cation which is a monocation selected from $Rb^+$, $Cs^+$, $NH_4^+$ and monovalent organic cations. For instance, [A] may be a single inorganic A monocation selected from $Li^+$, $Na^+$, $K^+$, $Rb^+$, $Cs^+$ and $NH_4^+$. In another embodiment, [A] may be at least one monovalent organic A cation. For instance, [A] may be a single monovalent organic A cation. In one embodiment, [A] is $(CH_3NH_3)^+$. In another embodiment, [A] is $(H_2N-C(H)=NH_2)^+$.

Preferably, [A] comprises two or more types of A cation. [A] may be a single A monocation, or indeed two A monocations, each of which is independently selected from $K^+$, $Rb^+$, $Cs^+$, $NH_4^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N-C(H)=NH_2)^+$ and $(H_2N-C(CH_3)=NH_2)^+$.

[M] may comprise one or more M cations which are selected from suitable metal or metalloid tetracations. Metals include elements of groups 3 to 12 of the Periodic Table of the Elements and Ga, In, Tl, Sn, Pb, Bi and Po. Metalloids include Si, Ge, As, Sb, and Te. For instance, [M] may comprise at least one M cation which is a metal or metalloid tetracation selected from $Ti^{4+}$, $V^{4+}$, $Mn^{4+}$, $Fe^{4+}$, $Co^{4+}$, $Zr^{4+}$, $Nb^{4+}$, $Mo^{4+}$, $Ru^{4+}$, $Rh^{4+}$, $Pd^{4+}$, $Hf^{4+}$, $Ta^{4+}$, $W^{4+}$, $Re^{4+}$, $Os^{4+}$, $Ir^{4+}$, $Pt^{4+}$, $Sn^{4+}$, $Pb^{4+}$, $Po^{4+}$, $Si^{4+}$, $Ge^{4+}$, and $Te^{4+}$. Typically, [M] comprises at least one metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$. For instance, [M] may be a single metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$.

Typically, [M] comprises at least one M cation which is a metal or metalloid tetracation selected from $Sn^{4+}$, $Te^{4+}$, $Ge^{4+}$ and $Re^{4+}$. In one embodiment [M] comprises at least one M cation which is a metal or metalloid tetracation selected from $Pb^4$, $Sn^{4+}$, $Te^{4+}$, $Ge^{4+}$ and $Re^{4+}$.

For instance, [M] may comprise an M cation which is at least one metal or metalloid tetracation selected from $Pb^{4+}$, $Sn^{4+}$, $Te^{4+}$ and $Ge^{4+}$. Preferably, [M] comprises at least one metal or metalloid tetracation selected from $Sn^{4+}$, $Te^{4+}$, and $Ge^{4+}$. As discussed above, the hexahalometallate compound may be a mixed-metal or a single-metal hexahalometallate. Preferably, the hexahalometallate compound is a single-metal hexahalometallate compound. More preferably, [M] is a single metal or metalloid tetracation selected from $Sn^{4+}$, $Te^{4+}$, and $Ge^{4+}$. For instance, [M] may be a single metal or metalloid tetracation which is $Te^{4+}$. For instance, [M] may be a single metal or metalloid tetracation which is $Ge^{4+}$. Most preferably, [M] is a single metal or metalloid tetracation which is $Sn^{4+}$.

[X] may comprise at least one X anion which is a halide anion. [X] therefore comprises at least one halide anion selected from $F^-$, $Cl^-$, $Br^-$ and $I^-$. Typically, [X] comprises at least one halide anion selected from $Cl^-$, $Br^-$ and $I^-$. The hexahalometallate compound may be a mixed-halide hexahalometallate or a single-halide hexahalometallate. If the hexahalometallate is mixed, [X] comprises two, three or four halide anions selected from $F^-$, $Cl^-$, $Br^-$ and $I^-$. Typically, in a mixed-halide compound, [X] comprises two halide anions selected from $F^-$, $Cl^-$, $Br^-$ and $I^-$.

In some embodiments, [A] is a single monocation and [M] is a single metal or metalloid tetracation. Thus, the crystalline material may, for instance, comprise a hexahalometallate compound of formula (IIIA)

$$A_2M[X]_6 \qquad (IIIA)$$

wherein: A is a monocation; M is a metal or metalloid tetracation; and [X] is at least one halide anion. [X] may be one, two or three halide anions selected from F⁻, Cl⁻, Br⁻ and I⁻, and preferably selected from Cl⁻, Br⁻ and I⁻. In formula (IIIA), [X] is preferably one or two halide anions selected from Cl⁻, Br⁻ and I⁻.

The crystalline material may, for instance, comprise, or consist essentially of, a hexahalometallate compound of formula (IIIB)

  (IIIB)

wherein: A is a monocation (i.e. the second cation); M is a metal or metalloid tetracation (i.e. the first cation); X and X' are each independently a (different) halide anion (i.e. two second anions); and y is from 0 to 6. When y is 0 or 6, the hexahalometallate compound is a single-halide compound. When y is from 0.01 to 5.99 the compound is a mixed-halide hexahalometallate compound. When the compound is a mixed-halide compound, y may be from 0.05 to 5.95. For instance, y may be from 1.00 to 5.00.

The hexahalometallate compound may, for instance, be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, $A_2SnBr_{6-y}I_y$, $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, $A_2TeBr_{6-y}I_y$, $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, $A_2GeBr_{6-y}I_y$, $A_2ReF_{6-y}Cl_y$, $A_2ReF_{6-y}Br_y$, $A_2ReF_{6-y}I_y$, $A_2ReCl_{6-y}Br_y$, $A_2ReCl_{6-y}I_y$ or $A_2ReBr_{6-y}I_y$, wherein: A is K⁺, Rb⁺, Cs⁺, $(R^1NH_3)^+$, $(NR^2_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6. Optionally, y is from 0.01 to 5.99. If the hexahalometallate compound is a mixed-halide compound, y is typically from 1.00 to 5.00. A may be as defined above. For instance, A may be Cs⁺, NH₄⁺, $(CH_3NH_3)^+$, $(CH_3CH_2NH_3)^+$, $(N(CH_3)_4)^+$, $(N(CH_2CH_3)_4)^+$, $(H_2N-C(H)=NH_2)^+$ or $(H_2N-C(CH_3)=NH_2)^+$, for instance Cs⁺, NH₄⁺, or $(CH_3NH_3)^+$.

The hexahalometallate compound may typically be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, or $A_2SnBr_{6-y}I_y$, wherein: A is K⁺, Rb⁺, Cs⁺, $(R^1NH_3)^+$, $(NR^2_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^2$ is a substituted or unsubstituted $C_{1-10}$ alkyl group; and y is from 0 to 6.

In another embodiment, the hexahalometallate compound is $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, or $A_2GeBr_{6-y}I_y$, wherein: A is K⁺, Rb⁺, Cs⁺, $(R^1NH_3)^+$, $(NR^2_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6.

The hexahalometallate compound may, for instance, be $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, or $A_2TeBr_{6-y}I_y$, wherein: A is K⁺, Rb⁺, Cs⁺, $(R^1NH_3)^+$, $(NR^2_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6 or y is as defined herein.

Often, y will be from 1.50 to 2.50. For instance, y may be from 1.80 to 2.20. This may occur if the compound is produced using two equivalents of AX' and one equivalent of MX₄, as discussed below.

In some embodiments, all of the ions are single anions. Thus, the crystalline material may comprise, or consist essentially of, a hexahalometallate compound of formula (IIIC)

  (IIIC)

wherein: A is a monocation; M is a metal or metalloid tetracation; and X is a halide anion. A, M and X may be as defined herein.

The hexahalometallate compound may be $A_2SnF_6$, $A_2SnCl_6$, $A_2SnBr_6$, $A_2SnI_6$, $A_2TeF_6$, $A_2TeCl_6$, $A_2TeBr_6$, $A_2TeI_6$, $A_2GeF_6$, $A_2GeCl_6$, $A_2GeBr_6$, $A_2GeI_6$, $A_2ReF_6$, $A_2ReCl_6$, $A_2ReBr_6$ or $A_2ReI_6$, wherein: A is K⁺, Rb⁺, Cs⁺, $(R^1NH_3)^+$, $(NR^2_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group. A may be as defined herein. Preferably, the hexahalometallate compound is $Cs_2SnI_6$, $Cs_2SnBr_6$, $Cs_2SnBr_{6-y}I_y$, $Cs_2SnCl_{6-y}I_y$, $Cs_2SnCl_{6-y}Br_y$, $(CH_3NH_3)_2SnI_6$, $(CH_3NH_3)_2SnBr_6$, $(CH_3NH_3)_2SnBr_{6-y}I_y$, $(CH_3NH_3)_2SnCl_{6-y}I_y$, $(CH_3NH_3)_2SnCl_{6-y}Br_y$, $(H_2N-C(H)=NH_2)_2SnI_6$, $(H_2N-C(H)=NH_2)_2SnBr_6$, $(H_2N-C(H)=NH_2)_2SnBr_{6-y}I_y$, $(H_2N-C(H)=NH_2)_2SnCl_{6-y}I_y$ or $(H_2N-C(H)=NH_2)_2SnCl_{6-y}Br_y$, wherein y is from 0.01 to 5.99. For example, the hexahalometallate compound may be $(CH_3NH_3)_2SnI_6$, $(CH_3NH_3)_2SnBr_6$, $(CH_3NH_3)_2SnCl_6$, $(H_2N-C(H)=NH_2)_2SnI_6$, $(H_2N-C(H)=NH_2)_2SnBr_6$ or $(H_2N-C(H)=NH_2)_2SnCl_6$. The hexahalometallate compound may be $Cs_2SnI_6$, $Cs_2SnBr_6$, $Cs_2SnCl_{6-y}Br_y$, $(CH_3NH_3)_2SnI_6$, $(CH_3NH_3)_2SnBr_6$, or $(H_2N-C(H)=NH_2)_2SnI_6$.

The crystalline A/M/X material may comprise a bismuth or antimony halogenometallate. For instance, the crystalline A/M/X material may comprise a halogenometallate compound comprising: (i) one or more monocations ([A]) or one or more dications ([B]); (ii) one or more metal or metalloid trications ([M]); and (iii) one or more halide anions ([X]). The compound may be a compound of formula $BBiX_5$, $B_2BiX_7$ or $B_3BiX_9$ where B is $(H_3NCH_2NH_3)_2^+$, $(H_3N(CH_2)_2NH_3)_2^+$, $(H_3N(CH_2)_3NH_3)_2^+$, $(H_3N(CH_2)_4NH_3)_2^+$, $(H_3N(CH_2)_5NH_3)_2^+$, $(H_3N(CH_2)_6NH_3)_2^+$, $(H_3N(CH_2)_7NH_3)_2^+$, $(H_3N(CH_2)_8NH_3)_2^+$ or $(H_3N-C_6H_4-NH_3)_2^+$ and X is I⁻, Br or Cl⁻, preferably I⁻.

In yet further embodiments, the crystalline A/M/X materials of the invention may be double perovskites. Such compounds are defined in WO 2017/037448, the entire contents of which is incorporated herein by reference. Typically, the compound is a double perovskite compound of formula (IV):

  (IV);

wherein: [A] comprises one or more A cations which are monocations, as defined herein; [B⁺] and [B³⁺] are equivalent to [M] where M comprises one or more M cations which are monocations and one or more M cations which are trications; and [X] comprises one or more X anions which are halide anions.

The one or more M cations which are monocations comprised in [B⁺] are typically selected from metal and metalloid monocations. Preferably, the one or more M cations which are monocations are selected from Li⁺, Na⁺, K⁺, Rb⁺, Cs⁺, Cu⁺, Ag⁺, Au⁺ and Hg⁺. More preferably, the one or more M cations which are monocations are selected from Cu⁺, Ag⁺ and Au⁺. Most preferably, the one or more M cations which are monocations are selected from Ag⁺ and Au⁺. For instance, [B⁺] may be one monocation which is Ag⁺ or [B⁺] may be one monocation which is Au⁺.

The one or more M cations which are trications comprised in [B$^{3+}$] are typically selected from metal and metalloid trications. Preferably, the one or more M cations which are trications are selected from Bi$^{3+}$, Sb$^{3+}$, Cr$^{3+}$, Fe$^{3+}$, Co$^{3+}$, Ga$^{3+}$, As$^{3+}$, Ru$^{3+}$, Rh$^{3+}$, In$^{3+}$, Ir$^{3+}$ and Au$^{3+}$. More preferably, the one or more M cations which are trications are selected from Bi$^{3+}$ and Sb$^{3+}$. For instance, [B$^{3+}$] may be one trication which is Bi$^{3+}$ or [B$^{3+}$] may be one trication which is Sb$^{3+}$. Bismuth has relatively low toxicity compared with heavy metals such as lead. In some embodiments, the one or more M cations which are monocations (in [B$^+$]) are selected from Cu$^+$, Ag$^+$ and Au$^+$ and the one or more M cations which are trications (in [B$^{3+}$]) are selected from Bi$^{3+}$ and Sb$^3$.

An exemplary double perovskite is Cs$_2$BiAgBr$_6$.

Typically, where the compound is a double perovskite it is a compound of formula (IVa):

$$A_2B^+B^{3+}[X]_6 \qquad (IVa);$$

wherein: the A cation is as defined herein; B$^+$ is an M cation which is a monocation as defined herein; B$^{3+}$ is an M cation which is a trication as defined herein; and [X] comprises one or more X anions which are halide anions, for instance two or more halide anions, preferably a single halide anion.

In yet another embodiment, the compound may be a layered double perovskite compound of formula (V):

$$[A]_4[B^+][B^{3+}][X]_8 \qquad (V);$$

wherein: [A], [B$^+$], [B$^{3+}$] and [X] are as defined above. In some embodiments, the layered double perovskite compound is a double perovskite compound of formula (Va):

$$A_4B^+B^{3+}[X]_8 \qquad (Va);$$

wherein: the A cation is as defined herein; B$^+$ is an M cation which is a monocation as defined herein; B$^{3+}$ is an M cation which is a trication as defined herein; and [X] comprises one or more X anions which are halide anions, for instance two or more halide anions, preferably a single halide anion or two kinds of halide anion.

In yet another embodiment, the compound may be a compound of formula (VI):

$$[A]_4[M][X]_6 \qquad (VI);$$

wherein: [A], [M] and [X] are as defined above (in relation to, for instance, compounds of formula (I) or (II)). However, preferably the compound is not a compound of formula (VI). Where the compound is a compound of formula (VI), the compound may preferably be a compound of formula (VIA)

$$[A^IA^{II}]_4[M][X]_6 \qquad (VIA);$$

that is, a compound wherein [A] comprises two types of A monoacation. In other preferred embodiments, the compound of formula (VI) may be a compound of formula (VIB):

$$[A]_4[M][X^IX^{II}]_6 \qquad (VIB);$$

that is, a compound of formula (VI) wherein [X] comprises two types of X anion. In yet other preferred embodiments, the compound of formula (VI) may be a compound of formula (VIC):

$$[A^IA^{II}]_4[M][X^IX^{II}]_6 \qquad (VIC);$$

that is, a compound of formula (VI) wherein [A] comprises two types of A monoacation and [X] comprises two types of X anion. In formulae (VIa), (VIb) and (VIc), each of: [A], [M] and [X] are as defined above (in relation to, for instance, compounds of formula (I) or (II)).

In another embodiment, a=1, b=1 and c=4. In that embodiment, the crystalline A/M/X material may in that case comprise a compound of formula (VII):

$$[A][M][X]_4 \qquad (VII)$$

wherein: [A] comprises one or more A cations which are monocations; [M] comprises one or more M cations which are metal or metalloid trications; and [X] comprises one or more X anions which are halide anions. The A monocations and M trications are as defined herein. An exemplary compound of formula (VII) is AgBiI$_4$.

It should be understood that the invention also encompasses processes for producing variants of the above-described structures (I), (II), (III), (IV), (V), (VI) and (VII) where one or more of the relevant a, b and c values are non-integer values.

Preferably, the compound of formula [A]$_a$[M]$_b$[X]$_c$ is a compound of formula [A][M][X]$_3$, a compound of formula [A]$_4$[M][X]$_6$ or a compound of formula [A]$_2$[M][X]$_6$. For example, in preferred embodiments the compound of formula [A]$_a$[M]$_b$[X]$_c$ is a compound of formula is a compound of formula (IA), (IB), (IC), (IIIA), (IIIB), (IIIC), (VIA), (VIB), or (VIC).

In some embodiments, the compound of formula [A]$_a$[M]$_b$[X]$_c$ is a compound wherein [A] comprises two or more different A cations. For examples, [A] may contain two types of cation. In some embodiments, the compound of formula [A]$_a$[M]$_b$[X]$_c$ is a compound wherein [X] comprises two or more different X anions. For example, [X] may contain two types of anion, e.g. halide anions. In one aspect of each of these embodiments, the compound of formula [A]$_a$[M]$_b$[X]$_c$ is a compound wherein [A] comprises two or more different A cations and wherein [X] comprises two or more different X anions. For example, [A] may contain two types of A cation and two types of X anion (e.g. two types of halide anion). The process of the invention is particularly useful for preparing compounds and materials having mixed cation or mixed halide sites as the stoichiometry can be more carefully controlled than is possible with conventional methods utilising a single solvent.

In one preferred embodiment, [A] comprises Cs$^+$ and Rb$^+$; for instance, [A] may consist of Cs$^+$ and Rb$^+$. In another preferred embodiment, [X] comprises two halide anions, preferably Br$^-$ and Cl$^-$; for example, [X] may consist of Br$^-$ and Cl$^-$. In a preferred aspect of these embodiments, [A] comprises Cs$^+$ and Rb$^+$ and [X] comprises two halide anions, preferably Br$^-$ and Cl$^-$. In a particularly preferred example, [A] consists of Cs$^+$ and Rb$^+$ and [X] consists of two halide anions, e.g. Br$^-$ and Cl$^-$. In each embodiment in this paragraph, the compound of formula [A]$_a$[M]$_b$[X]$_c$ is preferably a compound of formula [A][M][X]$_3$; [A]$_2$[M][X]$_6$ and [A]$_4$[M][X]$_6$.

Typically, each A cation is selected from an alkali metal cation, C$_{1-10}$ alkylamammonium, C$_{2-10}$ alkenylammonium, C$_{1-10}$ alkyliminium, C$_{3-10}$ cycloalkylamammonium and C$_{3-10}$ cycloalkyliminium optionally substituted with one or more substituents selected from amine, C$_{1-6}$ alkylamine, imine, C$_{1-6}$ alkylimine, C$_{1-6}$ alkyl, C$_{2-6}$ alkenyl, C$_{3-6}$ cycloalkyl and C$_{6-12}$ aryl. Preferably Each A cation is selected from Cs$^+$, Rb$^+$, methylammonium, ethylammonium, propylammonium. butylammonium, pentylammoium, hexylammonium, septylammonium, octylammonium, and guanidinium. Typically, [A] comprises one, two or three A cations; preferably [A] is one A cation. Preferably, each A cation is a monocation.

Generally each metal or metalloid M cation is selected from Li$^+$, Na$^+$, K$^+$, Rb$^+$, Cs$^+$, Cu$^+$, Ag$^+$, Au$^+$, Hg$^+$, Ca$^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$. Usually, each metal or metalloid M cation is selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$, preferably $Sn^{2+}$, $Pb^{2+}$, $Cu^{2+}$, $Ge^{2+}$, and $Ni^{2+}$; particularly preferably $Pb^{2+}$.

Usually each X anion is selected from $F^-$, $Cl^-$, $Br^-$ or $I^-$, preferably $Cl^-$ or $Br^-$.

A and M Precursors

An A precursor is a compound comprising one or more A cations present in [A]. Where [A] comprises one type of A cation, usually one A precursor is utilised in the process of the invention and that A precursor will generally consist of that A cation together with one or more counterions. Where [A] comprises two or more types of A cation, one or more A precursors may be utilised in the process of the invention. Each A precursor may comprise one or more of the two or more A cations present in [A]. Generally, each A precursor comprises one or two A cations. Preferably, each A precursor comprises one type of A cation because such precursors are generally commercially available in high purity.

An A precursor is capable of reacting with one or more M precursors and optionally also with one or more additional A precursors and one or more X precursors to produce a crystalline A/M/X material as defined herein.

Preferably, the or each A precursor is a halide salt of the A cation or one of the A cations. That is, preferably the or each A precursor is a compound comprising:
  (i) the A cation present in [A] or, where [A] comprises two or more A cations, one or more of the A cations present in [A]; and
  (ii) one or more halide anions, preferably selected from $Cl^-$, $Br^-$ and $I^-$.

Typically, the or each A precursor comprises one or two halide anions, preferably one halide anion.

In an exemplary embodiment, therefore, each A precursor contains one or two A cations as defined herein and one or two halide anions preferably selected from $Cl^-$, $Br^-$ and $I^-$; in a particularly preferred embodiment, each A precursor contains one A cation as defined herein and one halide anion preferably selected from $Cl^-$, $Br^-$ and $I^-$.

An M precursor is a compound comprising one or more M cations present in [M]. Where [M] comprises one type of M cation, usually one M precursor is utilised in the process of the invention and that M precursor will generally consist of that M cation together with one or more counterions. Where [M] comprises two or more types of M cation, one or more M precursors may be utilised in the process of the invention. Each M precursor may comprise one or more of the two or more A cations present in [M]. Generally, each M precursor comprises one or two M cations. Preferably, each M precursor comprises one type of M cation because such precursors are generally commercially available in high purity.

An M precursor is capable of reacting with one or more A precursors and optionally also with one or more additional M precursors and one or more X precursors to produce a crystalline A/M/X material as defined herein.

Preferably, the or each M precursor is a halide salt of the M cation or one of the M cations. That is, preferably the or each M precursor is a compound comprising:
  (i) the M cation present in [M] or, where [M] comprises two or more M cations, one or more of the M cations present in [M]; and
  (ii) one or more halide anions, preferably selected from $Cl^-$, $Br^-$ and $I^-$.

Typically, the or each M precursor comprises one or two halide anions, preferably one halide anion.

In an exemplary embodiment, therefore, each M precursor contains one or two M cations as defined herein and one or two halide anions preferably selected from $Cl^-$, $Br^-$ and $I^-$; in a particularly preferred embodiment, each M precursor contains one M cation as defined herein and one halide anion preferably selected from $Cl^-$, $Br^-$ and $I^-$. In exemplary embodiments, the M precursor may be selected from $PbCl_2$, $PbBr_2$ and $PbI_2$.

Aqueous and Organic Solvents and Solutions

The process of the invention involves one or more aqueous solutions. The (or each) aqueous solution comprises an aqueous solvent and an A precursor. Where multiple aqueous solutions are employed, the aqueous solvent present in each aqueous solution may be the same or different.

Typically, the or each aqueous solution consists essentially of or consists only of the A precursor and the aqueous solvent. However, other species such as pH adjusting agents, stabilisers and so on may be present.

The aqueous solvent usually comprises less than 20% by volume of organic solvents, and preferably comprises less than 10% by volume of organic solvents. The aqueous solution usually comprises at least 80% by volume of water, usually at least 90% by volume of water. Preferably, the aqueous solvent consists essentially of water. In some embodiments, the aqueous solvent consists entirely of water.

The process of the invention involves one or more organic solutions. The (or each) organic solution comprises an organic solvent and an M precursor. Where multiple organic solutions are employed, the organic solvent present in each organic solution may be the same or different.

Typically, the or each organic solution consists essentially of or consists only of: the M precursor, the organic solvent, and optionally one or more X precursors (preferably one or more hydrohalic acids). However, other species such as pH adjusting agents, stabilisers and so on may be present.

The organic solution may comprise one or more organic solvents. Usually, the organic solution contains only one organic solvent.

The organic solvent in the organic solution comprises less than 20% by volume of water, preferably less than 10% by volume of water. Typically, the organic solvent in said solution comprises a polar organic solvent. For instance, the said organic solvent may consist essentially of a polar organic solvent. Preferably the organic solvent comprises an organic solvent that is miscible with water, for instance an organic solvent that is miscible with water in all proportions. A particularly preferred example of an organic solvent suitable for the organic solution is dimethylformamide (DMF).

In some embodiments, the process of the invention utilises a further organic solvent to dissolve the precipitate produced in the process of the invention, in order to create a film-forming solution. That organic solvent may be the same or different to any of the solvents present in any organic solutions mentioned in step (a) of the process. The organic solvent used to dissolve the precipitate and create a film-forming solution may be referred to as "the organic solvent of step (d)". The organic solvent of step (d) may contain a single organic solvent or may be a mixture of organic solvents. The organic solvent of step (d) comprises a polar solvent, preferably DMSO and/or DMF. Where the organic solvent of step (d) comprises a mixture of two or more solvents, preferably each organic solvent is a polar solvent.

Crystalline A/M/X Material

The process of the invention produces a crystalline A/M/X material which comprises one or more compounds of formula $[A]_a[M]_b[X]_c$. In some embodiments, the crystalline A/M/X material comprises two or more compounds of formula $[A]_a[M]_b[X]_c$. For instance, the crystalline A/M/X material may comprise one, two, three, four or five compounds of formula $[A]_a[M]_b[X]_c$. Typically, the crystalline A/M/X material contains one, two or three compounds of formula $[A]_a[M]_b[X]_c$. Preferably, the crystalline A/M/X material contains one compound of formula $[A]_a[M]_b[X]_c$.

In one aspect, the invention provides a crystalline A/M/X material obtained or obtainable by the process of the invention. The crystalline A/M/X may be in powder form, for instance as a precipitate obtained directly from the process of the invention.

In a preferred embodiment, the said material is a "blue emitter". By this is meant that the compound of formula $[A]_a[M]_b[X]_c$ (or one of the compounds of formula $[A]_a[M]_b[X]_c$ in the material) is capable of emitting blue light after stimulation by electrical energy or irradiation with blue, violet or ultraviolet light (e.g. light having a wavelength of 500 nm or less). In this embodiment, that compound of formula $[A]_a[M]_b[X]_c$ is capable of emitting light having a wavelength of from 450 to 500 nm, e.g. from 455 to 495 nm, preferably from 460 to 490 nm.

In another aspect, the invention provides a thin film obtainable or obtained by a process as described herein.

The thin film of the invention comprises a crystalline A/M/X material as defined herein. The thin film typically comprises a crystalline or polycrystalline layer, preferably a polycrystalline layer.

The thin film typically consists essentially of, or consists entirely of, the crystalline A/M/X material as defined herein.

The thin film is typically a layer having a thickness of approximately from 1 nm to 10 μm. Usually, the thin film is a layer having a thickness of from 1 nm to 5 μm. The thin film normally has a thickness of at least 1 nm, for instance at least 10 nm or at least 50 nm, or for example a thickness of greater than or equal to 100 nm. The thin film normally has a thickness of less than 10 μm, e.g. 1 μm or less. Preferably, the layer of said photoactive material has a thickness of from 100 nm to 700 nm, for instance from 200 nm to 500 nm.

Photoactive Material

The crystalline A/M/X material is typically a semiconductor, and is typically a strong emitter and a stable emitter of visible light (i.e. light having a wavelength of from about 450 nm to about 700 nm). Accordingly, the crystalline A/M/X material is highly useful in a wide variety of electronic devices. Exemplary optoelectronic devices and their manufacture are described in WO 2013/171517, WO 2013/171518, WO 2013/171520, WO 2014/045021, WO 2017/017441, WO 2017/037448 and WO 2017/089819, the entire contents of which are incorporated herein by reference.

For incorporation into an optoelectronic device, the crystalline A/M/X material is typically provided as a photoactive material. The photoactive material may consist entirely of a A/M/X material as defined herein, or may comprise other components. Accordingly, the invention provides a photoactive material comprising the crystalline A/M/X material, for example a luminescent material comprising the crystalline A/M/X material. The term "photoactive material", as used herein, refers to a material which can absorb and/or emit photons. A photoactive material can do one or more of the following.

(i) Absorb photons, which may then generate free charge carriers e.g. electrons and holes. These materials are referred to as photoabsorbent materials.
(ii) Absorb photons at energies higher than its band gap and re-emit photons at energies of the band gap (these are referred to as photoemissive materials). One type of photoemissive material is a luminescent material, which is a material that emits light following the absorption of photons, i.e. a phosphorescent or a fluorescent material.
(iii) Accept charge, both electrons and holes, which may subsequently recombine and emit light.

Photoactive materials are examples of semiconducting materials. A semiconductor or semiconducting material as used herein refers to a material with electrical conductivity intermediate in magnitude between that of a conductor and a dielectric. A semiconductor may have a band gap of from 0.5 to 3.5 eV, for instance from 0.5 to 2.5 eV or from 1.0 to 2.0 eV (when measured at 300 K). The invention therefore provides a semiconducting material comprising the crystalline A/M/X material described herein.

The photoactive material of the invention is generally capable of absorbing and/or emitting photons in the visible region of the spectrum, for example in the blue region of the visible spectrum. The photoactive material may therefore be described as a photoemissive material (i.e. a material that can emit light) or a photoabsorbent material (i.e. a material that can absorb light). For instance, the photoactive material of the invention can typically emit and/or absorb photons of at least one wavelength of 450 to 700 nm, for example of 450 to 650 nm. In a preferred embodiment, the crystalline A/M/X materials have a peak emission wavelength in the range 450 to 500 nm, preferably 455 to 495 nm, particularly preferably 460 to 490 nm. However, photoactive materials which can absorb and emit photons typically do not show peak absorbance and peak emission at exactly the same wavelength.

By peak absorbance is meant the wavelength at which the photoactive material absorbs photons most efficiently, and by peak emission is meant the wavelength at which the photoactive material emits photons most efficiently. Typically, the peak emission of the photoactive material is 700 nm or less, for example 650 nm or less. In a preferred embodiment, the crystalline A/M/X materials of the invention have a peak emission wavelength in the range 450 to 500 nm, preferably 455 to 495 nm, particularly preferably 460 to 490 nm.

The photoactive material may comprise greater than or equal to 5 wt % of the crystalline A/M/X material. Typically, at least 50% of the weight of the photoactive materials consists of a crystalline A/M/X material as defined herein. The photoactive material may comprise additional components as discussed herein, for example scaffold materials, matrix materials or coatings. Typically, though, the photoactive material comprises greater than or equal to 80 wt % of a crystalline A/M/X material as defined herein. Preferably, the photoactive material comprises greater than or equal to 95 wt % of a crystalline A/M/X material, for instance greater than or equal to 99 wt % of a crystalline A/M/X material. The photoactive material may consist, or consist essentially, of a crystalline A/M/X material.

The photoactive material is typically solid.

The photoactive material may comprise a crystalline A/M/X material as defined herein. Accordingly, in one embodiment the photoactive material comprises a powder of the crystalline A/M/X material. In another embodiment, the photoactive material may comprise a thin film of the crystalline A/M/X material. Often, the crystalline A/M/X material is polycrystalline and accordingly the photoactive material therefore comprises a polycrystalline A/M/X material of the invention. In other embodiments, the photoactive material comprises nanocrystals of the crystalline A/M/X material.

The photoactive material may be in any form. Typically the photoactive material is in the form of a layer. The photoactive material in the form of a layer is typically at least 1 nm thick. The layer of photoactive material may be up to 10 mm thick, for instance where the layer is intended to be a free-standing component of a device. Usually, the layer of photoactive material is from 2 nm to 1 mm thick, more usually from 5 nm to 5 µm thick.

The layer of photoactive material may comprise a crystalline A/M/X material within the said layer. The amount of said material within the said layer may vary, depending upon other components in the layer such as any coatings, or matrix or scaffold materials. In some embodiments, the photoactive material may consist essentially of a layer of a crystalline A/M/X material as defined herein. For example, the photoactive material may consist entirely of a crystalline A/M/X material. However, more typically, the photoactive material may comprise at least 50% of a crystalline A/M/X material by weight, for example at least 70, 80 or 80% of a crystalline A/M/X material by weight. In some embodiments, the photoactive material may comprise at least 95%, of a crystalline A/M/X material by weight. Typically, a layer of photoactive material according to the invention comprises up to 99.9% of a crystalline A/M/X material by weight.

The photoactive material may comprise a plurality of layers. Some or all of such layers may comprise a crystalline A/M/X material.

Where a photoactive material is in the form of a layer, a crystalline A/M/X material may be distributed evenly or unevenly throughout the layer. For instance, the photoactive material may comprise a layer consisting essentially of, or consisting only of, a crystalline A/M/X material. Alternatively or additionally, the photoactive material may comprise a substrate having a crystalline A/M/X material on the said substrate (for instance in powder form or thin film form).

In preferred embodiments, the photoactive material may comprise one or more crystalline A/M/X material(s) of the invention in the form of a thin film. A thin film typically comprises a polycrystalline material disposed on a substrate.

The photoactive material of the invention may comprise one or more crystalline A/M/X material(s) together with one or more of each of a surface layer or coating.

In some embodiments, for example, the photoactive material of the invention may comprise one or more crystalline A/M/X material(s) together with a passivating agent. Passivating agents are described in published application WO 2015/092397, the entire contents of which is incorporated herein by reference. In these embodiments, the photoactive material comprises a crystalline A/M/X material according to the invention, and a passivating agent. The passivating agent is an organic species which can form halogen bonds or chalcogen-metal bonds to under-coordinated moieties in the metal halide perovskite structure, which can lead to a self-assembled layer on a surface of a crystal or crystallite of a crystalline A/M/X material.

Exemplary passivating agents are pyrrolidine, piperidine, morpholine, 2H-pyrrole, 2-pyrroline, 3-pyrroline, pyrrole pyridine, napthelene, anthracene, phenanthrene, pyrene, fluoranthene, thiophene, 3-hexylthiophene or tetrahydrothiophene and iodopentafluorobenzene. Thus, in one embodiment, the photoactive material comprises one or more crystalline A/M/X materials together with a passivating agent selected from one or more of pyrrolidine, piperidine, morpholine, 2H-pyrrole, 2-pyrroline, 3-pyrroline, pyrrole pyridine, napthelene, anthracene, phenanthrene, pyrene, fluoranthene, thiophene, 3-hexylthiophene or tetrahydrothiophene and iodopentafluorobenzene. The passivating agent is typically present on or at the surface of the crystalline material, and may therefore be described as a surface species.

In some embodiments, the photoactive material may comprise a coating. Typically, the coating may be a protective coating which protects the crystalline A/M/X material(s) in the photoactive material from environmental factors such as moisture and oxygen.

A coating is compatible with the powder and with the thin film obtained or obtainable by the process of the invention. For instance, a powder may be deposited onto or into a coating; a coating may be present in the form of a layer over a thin film, or may encompass a thin film.

Suitable coatings include transparent polymers such as polyethylene (PE), poly (methyl methacrylate) (PMMA), polystyrene (PS), polycarbonate (PC), polyvinyl chloride (PVC), poly (vinylidene fluoride), (PVDF), polyurene (PU), polyvinyl alcohol (PVA), cellulose acetate (CA), acrylonitrile-butadiene-styrene (ABS), polyimide (PEI), Polydimethylsiloxane. Preferred polymers are polyethylene or polymethylmethacrylate (PMMA). Other suitable coatings include silicones.

In a particularly preferred embodiment, the coating comprises an oxide or a metal or metalloid cation. Preferably, the coating comprises an oxide of a metal or metalloid cation, which oxide has a band gap of 4 eV or more. In a particularly preferred embodiment, the coating comprises an oxide of one or more of Al, Si, Zr, Ga, Mg, Y, Ti, Ni and Zn, preferably Al or Si, most preferably Al.

In a preferred aspect of the invention, the photoactive material of the invention comprises a thin film of a crystalline A/M/X material as described herein comprising a coating on all or part of the said thin film. Particularly preferably, the coating comprises alumina and/or silica; particularly preferably alumina ($Al_2O_3$).

The photoactive material may comprise a plurality of coatings. A coating comprised in a photoactive material may or may not be directly in contact with a crystalline A/M/X material.

In some embodiments, the photoactive material of the invention comprises a matrix material. That is, the photoactive material of the invention may comprise one or more crystalline A/M/X materials together with a matrix material.

Where the photoactive material of the invention comprises a matrix material, the photoactive material typically comprises a crystalline A/M/X material(s) of the invention suspended in one or more matrix materials. The crystalline A/M/X material in this embodiment may be in powder form, for instance in the form of nanocrystals. The crystalline A/M/X material in this embodiment may be a precipitate obtained directly from the process of the invention, for instance a washed precipitate. Alternatively, it may be obtained by processing a thin film obtained or obtainable by the process of the invention. For example, the thin film may be scraped off a substrate and optionally ground to a produce crystals of a smaller size before it is combined with a matrix material.

Suitable matrix materials are described in WO 2017/017441, the entire contents of which is incorporated by reference herein. A matrix material is any suitable material in which a plurality of nanoparticles can be suspended. The matrix material is typically solid. The matrix material is typically non-reactive in that it does not undergo a chemical reaction with the nanoparticles or any other part of the light emitting device (e.g. a metal component). The matrix material typically has a high transparency to light across a large proportion of the visible spectrum.

The matrix material may be an inorganic material or an organic material. The matrix material is usually stable at temperatures up to 150° C. or up to 100° C. Typically, the matrix material comprises a polymeric matrix material.

A polymeric matrix material is a matrix material comprising a polymer. The polymeric matrix material typically comprises a polymer which is a polyalkene (e.g. polyethene, polypropene, polybutene, polymethylmethacrylate or polystyrene), a polyester (e.g. polyethylene terephthalate, polyhydroxybutyrate or polyethylene apidate), a polyurethane, a polycarbonate, a polyimide, a polyamide (e.g. polyamide 6 or polyamide 66), or an epoxy resin. Preferably, the polymeric matrix material comprises a polymer selected from polymethylmethacrylate, polystyrene, polyurethane, a polycarbonate, a polyimide, a polyamide or an epoxy resin.

An inorganic matrix material is typically an inorganic oxide, for example a metal oxide. Examples of inorganic matrix materials include ZnO, NiO and $SnO_2$.

In some embodiments, the matrix material is a semiconducting material. Suitable examples of semiconducting matrix materials include poly vinyl carbazole, a polyfluorene derivative, and CBP (4,4'-Bis(N-carbazolyl)-1,1'-biphenyl).

Thus, in some embodiments, the photoactive material comprises nanoparticles of one or more crystalline A/M/X material(s) of the invention together with a matrix material selected from polymethylmethacrylate, polystyrene, polyurethane, a polycarbonate, a polyimide, a polyamide, an epoxy resin, ZnO, NiO and $SnO_2$, poly vinyl carbazole, a polyfluorene derivative, and CBP (4,4'-Bis(N-carbazolyl)-1, 1'-biphenyl).

Where the photoactive material comprises a matrix material, the photoactive material typically comprises up to 50% by weight of the matrix material. For example, the photoactive material typically comprises up to 40% by weight, up to 30% by weight or up to 20% by weight of the matrix material. In such embodiments, the photoactive material typically comprises at least 50% by weight of a crystalline A/M/X material(s).

Where the photoactive material comprises a matrix material, the photoactive material is typically present in the form of a layer. The thickness of the said layer is typically from 100 nm to 4 mm, for instance from 1 m to 1000 m or from 50 m to 500 m. In some cases the layer may have a thickness of from 1 to 4 mm, for instance if a free-standing layer is to be constructed.

In some embodiments, the photoactive material comprises a scaffold material. A scaffold material is typically a solid material. A scaffold material is typically a solid support on which one or more crystalline A/M/X material(s) are distributed.

In some embodiments, the photoactive material of the invention comprises a porous scaffold together with one or more crystalline A/M/X material(s). Typically, the said porous scaffold material is in contact with the said one or more crystalline A/M/X material(s). Suitable examples of a porous scaffold material are described in WO 2013/171518, the entire contents of which is incorporated by reference.

Typically, a crystalline A/M/X material is disposed on the surface of the scaffold material. Typically, where the scaffold is a porous scaffold, a crystalline A/M/X material is disposed on the surface of the porous scaffold material, so that it is supported on the surfaces of pores within the scaffold. In such embodiments, the crystalline A/M/X material(s) are distributed on an internal surface or surfaces of the scaffold material so that the said material(s) may be said to be distributed within the scaffold material. The crystalline A/M/X material(s) in this situation typically act as a light-absorbing, photosensitising materials, as well as charge-transporting materials. A photoactive material comprising a crystalline A/M/X material and a scaffold material, e.g. a porous scaffold material, can advantageously rapidly transport charge carriers through the photoactive material. The crystalline A/M/X material(s) may typically be deposited on the scaffold material by a process for producing a thin film as described herein wherein the scaffold material is a thin layer present upon the substrate.

A scaffold material is typically a dielectric scaffold material or an n-type scaffold material. Preferably, a scaffold material is a porous dielectric scaffold material or a porous n-type scaffold material.

By "dielectric material" is meant an insulating material. A dielectric scaffold material may comprise a material having a band gap greater than or equal to 3.6 eV, or greater than or equal to 4 eV. A dielectric scaffold material is often a dielectric oxide. A dielectric scaffold material typically comprises one or more oxides of aluminium, germanium, zirconium, silicon, yttrium or ytterbium. However, a dielectric scaffold material may comprise one or more of polymethylmethacrylate (PMMA), polystyrene, polycarbonate, or polyimide. A dielectric scaffold material may be preferably be selected from aluminasilicate, zirconia, alumina and silica, for instance alumina ($Al_2O_3$).

An n-type scaffold may be selected from any n-type material described herein, for instance titania ($TiO_2$). By "n-type material" is meant an electron-transporting material.

A suitable n-type material is typically an inorganic material. A suitable n-type inorganic material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. More typically, the n-type material is selected from a metal oxide, a metal sulphide, a metal selenide, and a metal telluride. The n-type material may comprise an inorganic material selected from oxide of titanium, tin, zinc, niobium, tantalum, tungsten, indium, gallium, neodinium, palladium, or cadmium, or an oxide of a mixture of two or more of said metals. For instance, the n-type material may comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO. Other suitable n-type materials that may be employed include sulphides of cadmium, tin, copper, or zinc, including sulphides of a mixture of two or more of said metals. For instance, the sulphide may be $FeS_2$, CdS, ZnS or $Cu_2ZnSnS_4$. The n-type material may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be CdTe. The n-type material may for instance comprise an inorganic material selected from oxide of titanium, tin, zinc, niobium, tantalum, tungsten, indium, gallium, neodinium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals. Examples of other semiconductors that may be suitable n-type materials, for instance if they are n-doped, include group IV compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide). Typically, the n-type material comprises $TiO_2$.

Thus, in some embodiments the photoactive material of the invention may comprise a crystalline A/M/X material together with a porous scaffold material, preferably wherein the dielectric scaffold material is selected from one or more of alumina, silica and titania.

Where the photoactive material comprises a scaffold material, the photoactive material is typically present in the form of a layer. Typically, the thickness of the said layer is from 200 nm to 1000 nm, for instance the thickness may be from 400 nm to 800 nm. Often, thickness of the said layer is from 400 nm to 600 nm.

A layer of the photoactive material of the invention may be without open porosity. The layer of the photoactive material may comprise a layer of a crystalline A/M/X material, which layer of a crystalline A/M/X material is without open porosity. Alternatively, the layer of the photoactive material may be porous, or the layer of the photoactive material may be deposited on a porous scaffold as described herein.

Optoelectronic Device

The invention further provides an optoelectronic device comprising a photoactive material as defined herein. Thus, the invention provides an optoelectronic device comprising a crystalline A/M/X material obtainable or obtained by a process as defined herein. In a particularly preferred embodiment, the invention provides an optoelectronic device comprising a thin film of a crystalline A/M/X material obtainable or obtained by a process as defined herein.

The term "optoelectronic device" as used herein, refers to devices which source, control, detect or emit light. Typically, the light is visible light, e.g. light having a wavelength of about 450 to 700 nm. In a preferred embodiment, the device is capable of emitting blue light (i.e. light having a wavelength of about 450 to 500 nm, preferably about 455 to 495 nm, more preferably about 460 to 490 nm). The optoelectronic device of the invention comprises the photoactive material of the invention and is therefore capable of one or more of:

(i) absorbing photons, which may then generate free charge carriers e.g. electrons and holes;
(ii) absorbing photons at energies higher than its band gap and re-emit photons at energies of the band gap; and
(iii) accepting charge, both electrons and holes, which may subsequently recombine and emit light.

In one preferred embodiment, the invention provides an optoelectronic device which is a photovoltaic device, comprising a photoactive material as defined herein. By "photovoltaic device" is meant herein a device that is capable of converting electrical energy into light, particularly visible light. In a preferred embodiment the said photovoltaic device is capable of converting electrical energy into blue light (i.e. light having a wavelength of about 450 to 500 nm, preferably about 455 to 495 nm, more preferably about 460 to 490 nm).

In another preferred embodiment, the invention provides an optelectronic device which is a light-emitting device, comprising a photoactive material as defined herein. The light-emitting device may be a light-emitting diode (LED). The light-emitting device of the invention is typically capable of emitting visible light. In a preferred embodiment the light-emitting device is capable of emitting blue light (i.e. light having a wavelength of about 450 to 500 nm, preferably about 455 to 495 nm, more preferably about 460 to 490 nm).

In some preferred embodiments, the optoelectronic device of the invention comprises a photoactive material, wherein the photoactive material is disposed in a layer. A layer of photoactive material is defined herein. Usually, the said layer of photoactive material has a thickness of at least 2 nm. However, in some embodiments where the layer is intended to stand alone, the layer may be considerably thicker (for example up to 10 mm thick, more usually up to 5 mm thick).

In some embodiments, the optoelectronic device of the invention comprises a layer of photoactive material which is a thin sensitising layer, for instance having a thickness of from 5 nm to 50 nm.

In devices wherein the layer of said photoactive material forms a planar heterojunction with an n-type or p-type region, the layer of said photoactive material may have a thickness of at least 1 nm, for instance at least 10 nm or at least 50 nm, or for example a thickness of greater than or equal to 100 nm. Preferably, the layer of said photoactive material has a thickness of from 100 nm to 700 nm, for instance from 200 nm to 500 nm. The term "planar heterojunction", as used herein, means that surface defining junction between the semiconducting material and the n- or p-type region is substantially planar and has a low roughness, for instance a root mean squared roughness of less than 20 nm over an area of 25 nm by 25 nm, for instance a root mean squared roughness of less than 10 nm, or less than 5 nm, over an area of 25 nm by 25 nm.

The photoactive material often acts as a photoactive component (e.g. a photoabsorbent component or a photoemissive component) within the optoelectronic device. In other embodiments, the semiconducting material may form a layer of a p-type or n-type semiconductor in an optoelectronic device, e.g. a solar cell or an LED.

Typically, the optoelectronic device of the invention (which may be a light emitting device or a photovoltaic device) comprises:
  (a) an n-type region comprising at least one n-type layer;
  (b) a p-type region comprising at least one p-type layer; and, disposed between the n-type region and the p-type region:
  (c) the layer of the photoactive material.

Preferred examples of the optoelectronic device of the invention (which may be a light emitting device or a photovoltaic device) include an LED, a photodiode, a solar cell, a photodetector, or a photosensor; particularly preferable are an LED, a photodiode or a solar cell.

For instance, the optoelectronic device may comprise:
  an n-type region comprising at least one n-type layer;
  a p-type region comprising at least one p-type layer; and, disposed between the n-type region and the p-type region:

said layer of a photoactive material which comprises (or consists essentially of) a crystalline A/M/X material as defined herein.

The n-type region comprises at least one n-type layer. The n-type region typically comprises one or two n-type layers. Each layer may be porous or compact. A compact layer is typically a layer without open porosity (e.g. absent of any meso- or macroporosity). The p-type region comprises at least one p-type layer. The p-type region typically comprises one or two p-type layers. Each layer may be porous or compact. A compact layer is typically a layer without open porosity. It may be a non-porous layer. The n-type and p-type materials, in these layers, may be as further defined herein.

In some cases, the optoelectronic device comprises a layer of said photoactive material without open porosity. The layer of said photoactive material without open porosity is typically a crystalline layer of a crystalline A/M/X material (typically a thin film, preferably a perovskite) according to the invention without open porosity. Thus, the layer of said photoactive material may comprise greater than or equal to 95 volume % of one or more crystalline A/M/X material(s) (and thus less than 5 volume % of absence pore volume). The layer without open porosity typically does not comprise macropores or mesopores.

The layer of the photoactive material typically forms a planar heterojunction with the n-type region or the p-type region. The layer of the photoactive material typically forms a first planar heterojunction with the n-type region and a second planar heterojunction with the p-type region. This forms a planar heterojunction device, of the kind described in WO 2014/045021. The term "planar heterojunction" as used herein refers to a junction between two regions where one region does not infiltrate the other. This does not require that the junction is completely smooth, just that one region does not substantially infiltrate pores in the other region.

When the layer of the photoactive material forms a planar heterojunction with both the p-type and the n-type region, this typically forms a thin film device. The thickness of the layer of the photoactive material may be greater than or equal to 50 nm.

In some embodiments, it is desirable to have a porous scaffold material present, wherein the porous scaffold is as defined herein. The scaffold material may aid charge transport from the photoactive material to an adjacent region. The scaffold material may also, or alternatively, aid formation of the layer of the photoactive material during device construction. Thus, in some embodiments, the optoelectronic device comprises:

an n-type region comprising at least one n-type layer;
a p-type region comprising at least one p-type layer; and, disposed between the n-type region and the p-type region, a layer of photoactive material comprising:
(i) a porous scaffold material; and
(ii) a crystalline A/M/X material in contact with the scaffold material.

The architecture of such devices is described in more detail in WO 2014/045021, whose entire contents are incorporated herein by reference.

The layer of photoactive material comprising a porous scaffold material and a crystalline A/M/X material may form a sensitizing layer of the photoactive material. Thus, the optoelectronic device may be a sensitized device.

Further details of the architecture of optoelectronic devices such as solar cells and suitable materials therefor are described in published application WO 2017/037448, the entire contents of which is incorporated herein by reference.

The crystalline A/M/X material of the present invention may be used in place of the semiconducting material therein.

In some embodiments, the optoelectronic device comprises:
an n-type region comprising at least one n-type layer;
a p-type region comprising at least one p-type layer; and, disposed between the n-type region and the p-type region:
(i) a first layer which comprises a porous scaffold material and said crystalline A/M/X material; and
(ii) a capping layer disposed on said first layer, which capping layer is a layer of said crystalline A/M/X material without open porosity,
wherein crystalline A/M/X material in the capping layer is in contact with the crystalline A/M/X material in the first layer.

The first layer comprises said porous scaffold material and said crystalline A/M/X material disposed on the surface of the scaffold material. The term "scaffold material" as used herein refers to a material whose function(s) include acting as a physical support for another material. In the present case, the scaffold material acts as a support for the crystalline A/M/X material present in the first layer. The crystalline A/M/X material is disposed, or supported on, the surface of the scaffold material. The porous scaffold material typically has an open porous structure. Accordingly, the "surface" of the porous scaffold material here typically refers to the surfaces of pores within the scaffold material. Thus, the crystalline A/M/X material in the first layer is typically disposed on the surfaces of pores within the scaffold material.

In some embodiments, the scaffold material is porous and the crystalline A/M/X material in the first layer is disposed in pores of the scaffold material. The effective porosity of said scaffold material is usually at least 50%. For instance, the effective porosity may be about 70%. In one embodiment, the effective porosity is at least 60%, for instance at least 70%.

Typically, the crystalline A/M/X material (or photoactive material) in the first layer contacts one of the p-type and n-type regions, and the crystalline A/M/X material in the capping layer contacts the other of the p-type and n-type regions. The crystalline A/M/X material in the capping layer typically forms a planar heterojunction with the p-type region or the n-type region.

In one embodiment, the crystalline A/M/X material in the capping layer contacts the p-type region, and the crystalline A/M/X material in the first layer contacts the n-type region. In another embodiment, the crystalline A/M/X material in the capping layer contacts the n-type region, and the crystalline A/M/X material in the first layer contacts the p-type region (for instance in an inverted device).

In one embodiment, the crystalline A/M/X material in the capping layer contacts the p-type region, and the crystalline A/M/X material in the first layer contacts the n-type region. Usually, in this embodiment, the scaffold material is either an electron-transporting scaffold material or a dielectric scaffold material. Typically, the crystalline A/M/X material in the capping layer forms a planar heterojunction with the p-type region.

In another embodiment, however, the crystalline A/M/X material in the capping layer contacts the n-type region, and the crystalline A/M/X material in the first layer contacts the p-type region. Typically, in this embodiment, the scaffold material is a hole-transporting scaffold material or a dielectric scaffold material. Typically, the crystalline A/M/X material in the capping layer forms a planar heterojunction with the n-type region.

The thickness of the capping layer is usually greater than the thickness of the first layer. The majority of any photoactivity (e.g. light absorption or light emission) therefore usually occurs in a capping layer. The thickness of the capping layer is typically from 10 nm to 100 µm. More typically, the thickness of the capping layer is from 10 nm to 10 µm. Preferably, the thickness of the capping layer is from 50 nm to 1000 nm, or for instance from 100 nm to 700 nm. The thickness of the capping layer may be greater than or equal to 100 nm. The thickness of the first layer, on the other hand, is often from 5 nm to 1000 nm. More typically, it is from 5 nm to 500 nm, or for instance from 30 nm to 200 nm.

The n-type region is typically an n-type layer. The n-type region may alternatively comprise an n-type layer and an n-type exciton blocking layer. Such an n-type exciton blocking layer is typically disposed between the n-type layer and the layer(s) comprising the crystalline A/M/X material. The n-type region may have a thickness of from 50 nm to 1000 nm. For instance, the n-type region may have a thickness of from 50 nm to 500 nm, or from 100 nm to 500 nm.

Preferably, the n-type region comprises a compact layer of an n-type semiconductor. The n-type region may further comprise a porous layer of an n-type semiconductor which may be the porous scaffold material as described above (wherein the porous scaffold material is an electron-transporting material).

The n-type region in the optoelectronic device of the invention comprises one or more n-type layers. Often, the n-type region is an n-type layer, i.e. a single n-type layer. In other embodiments, however, the n-type region may comprise an n-type layer and an n-type exciton blocking layer. In cases where an n-type exciton blocking layer is employed, the n-type exciton blocking layer is usually disposed between the n-type layer and the layer(s) comprising the crystalline A/M/X material.

An exciton blocking layer is a material which is of wider band gap than the crystalline A/M/X material, but has either its conduction band or valance band closely matched with those of the crystalline A/M/X material. If the conduction band (or lowest unoccupied molecular orbital energy levels) of the exciton blocking layer are closely aligned with the conduction band of the crystalline A/M/X, then electrons can pass from the crystalline A/M/X material into and through the exciton blocking layer, or through the exciton blocking layer and into the crystalline A/M/X material, and we term this an n-type exciton blocking layer. An example of such is bathocuproine, as described in P. Peumans, A. Yakimov, and S. R. Forrest, "Small molecular weight organic thin-film photodetectors and solar cells" J. Appl. Phys. 93, 3693 (2001) and Masaya Hirade, and Chihaya Adachi, "Small molecular organic photovoltaic cells with exciton blocking layer at anode interface for improved device performance" Appl. Phys. Lett. 99, 153302 (2011)}.

An n-type layer is a layer of an electron-transporting (i.e. an n-type) material. The n-type material may, for instance, be a single n-type compound or elemental material, which may be undoped or doped with one or more dopant elements.

The n-type layer employed in the optoelectronic device of the invention may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

The n-type material may be selected from a metal oxide, a metal sulphide, a metal selenide, a metal telluride, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

More typically, the n-type material is selected from a metal oxide, a metal sulphide, a metal selenide, and a metal telluride.

Thus, the n-type layer may comprise an inorganic material selected from oxide of titanium, tin, zinc, niobium, tantalum, tungsten, indium, gallium, neodymium, palladium, or cadmium, or an oxide of a mixture of two or more of said metals. For instance, the n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Other suitable n-type materials that may be employed include sulphides of cadmium, tin, copper, or zinc, including sulphides of a mixture of two or more of said metals. For instance, the sulphide may be $FeS_2$, $CdS$, $ZnS$, $SnS$, $BiS$, $SbS$, or $Cu_2ZnSnS_4$.

The n-type layer may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be CdTe.

The n-type layer may for instance comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals. Examples of other semiconductors that may be suitable n-type materials, for instance if they are n-doped, include group IV elemental or compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

Typically, the n-type layer comprises $TiO_2$.

When the n-type layer is an inorganic material, for instance $TiO_2$ or any of the other materials listed above, it may be a compact layer of said inorganic material. Preferably the n-type layer is a compact layer of $TiO_2$.

Other n-type materials may also be employed, including organic and polymeric electron-transporting materials, and electrolytes. Suitable examples include, but are not limited to a fullerene or a fullerene derivative (for instance $C_{60}$ or Phenyl-C61-butyric acid methyl ester (PCBM)), an organic electron transporting material comprising perylene or a derivative thereof, or poly{[N,N0-bis(2-octyldodecyl)- naphthalene-1,4,5,8-bis(dicarboximide)-2,6-diyl]-alt-5,5ʹ-(2,2ʹ-bithiophene)} (P(NDI2OD-T2)).

The p-type region is typically a p-type layer. The p-type region may alternatively comprise an p-type layer and a p-type exciton blocking layer. Such a p-type exciton blocking layer is typically disposed between the p-type layer and the layer(s) comprising the crystalline A/M/X material. The p-type region may have a thickness of from 50 nm to 1000 nm. For instance, the p-type region may have a thickness of from 50 nm to 500 nm, or from 100 nm to 500 nm.

The p-type region in the optoelectronic device of the invention comprises one or more p-type layers. Often, the p-type region is a p-type layer, i.e. a single p-type layer. In other embodiments, however, the p-type region may comprise a p-type layer and a p-type exciton blocking layer. In cases where a p-type exciton blocking layer is employed, the p-type exciton blocking layer is usually disposed between the p-type layer and the layer(s) comprising the crystalline A/M/X material. If the valence band (or highest occupied molecular orbital energy levels) of the exciton blocking layer is closely aligned with the valence band of the crystalline A/M/X material, then holes can pass from the crystalline A/M/X material into and through the exciton blocking layer, or through the exciton blocking layer and into the crystalline A/M/X material, and we term this a p-type exciton blocking layer. An example of such is tris[4-(5-phenylthiophen-2-yl)phenyl]amine, as described in Masaya Hirade, and Chihaya Adachi, "Small molecular organic photovoltaic cells with exciton blocking layer at anode interface for improved device performance" Appl. Phys. Lett. 99, 153302 (2011).

A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements.

The p-type layer employed in the optoelectronic device of the invention may comprise an inorganic or an organic p-type material. Typically, the p-type region comprises a layer of an organic p-type material.

Suitable p-type materials may be selected from polymeric or molecular hole transporters. The p-type layer employed in the optoelectronic device of the invention may for instance comprise spiro-OMeTAD (2,2ʹ,7,7ʹ-tetrakis-(N,N-di-p-methoxyphenylamine)9,9ʹ-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-bʹ]dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). The p-type region may comprise carbon nanotubes. Usually, the p-type material is selected from spiro-OMeTAD, P3HT, PCPDTBT and PVK. Preferably, the p-type layer employed in the optoelectronic device of the invention comprises spiro-OMeTAD.

The p-type layer may for example comprise spiro-OMeTAD (2,2ʹ,7,7ʹ-tetrakis-(N,N-di-p-methoxyphenylamine)-9,9ʹ-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-bʹ]dithiophene-2,6-diyl]]), or PVK (poly(N-vinylcarbazole)).

Suitable p-type materials also include molecular hole transporters, polymeric hole transporters and copolymer hole transporters. The p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, the p-type layer employed in the optoelectronic device of the invention may for instance comprise any of the aforementioned molecular hole transporting materials, polymers or copolymers.

Suitable p-type materials also include m-MTDATA (4,4ʹ,4″-tris(methylphenylphenylamino)triphenylamine), Me-OTPD (N,N,Nʹ,Nʹ-tetrakis(4-methoxyphenyl)-benzidine), BP2T (5,5ʹ-di(biphenyl-4-yl)-2,2ʹ-bithiophene), Di-NPB (N,Nʹ-Di-[(1-naphthyl)-N,Nʹ-diphenyl]-1,1ʹ-biphenyl)-4,4ʹ-diamine), α-NPB (N,Nʹ-di(naphthalen-1-yl)-N,Nʹ-diphenyl-benzidine), TNATA (4,4ʹ,4″-tris-(N-(naphthylen-2-yl)-N-phenylamine)triphenylamine), BPAPF (9,9-bis[4-(N,N-bis-biphenyl-4-yl-amino)phenyl]-9H-fluorene), spiro-NPB (N2,N7-Di-1-naphthalenyl-N2,N7-diphenyl-9,9ʹ-spirobi[9H-fluorene]-2,7-diamine), 4P-TPD (4,4-bis-(N,N-diphenylamino)-tetraphenyl), PEDOT:PSS and spiro-OMeTAD.

The p-type layer may be doped, for instance with tertbutyl pyridine and LiTFSI. The p-type layer may be doped to increase the hole-density. The p-type layer may for instance be doped with $NOBF_4$ (Nitrosonium tetrafluoroborate), to increase the hole-density.

In other embodiments, the p-type layer may comprise an inorganic hole transporter. For instance, the p-type layer may comprise an inorganic hole transporter comprising an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may be a compact layer of said inorganic hole transporter.

The p-type layer may for instance comprise an inorganic hole transporter comprising an oxide of nickel, vanadium, copper or molybdenum; CuI, CuBr, CuSCN, $Cu_2O$, CuO or CIS; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may for instance comprise an inorganic hole transporter selected from CuI, CuBr, CuSCN, $Cu_2O$, CuO and CIS. The p-type layer may be a compact layer of said inorganic hole transporter.

Typically, the p-type layer comprises a polymeric or molecular hole transporter, and the n-type layer comprises an inorganic n-type material. The p-type polymeric or molecular hole transporter may be any suitable polymeric or molecular hole transporter, for instance any of those listed above. Likewise, the inorganic n-type material may be any suitable n-type inorganic, for instance any of those listed above. In one embodiment, for instance, the p-type layer comprises spiro-OMeTAD and the n-type layer comprises $TiO_2$. Typically, in that embodiment, the n-type layer which comprises $TiO_2$ is a compact layer of $TiO_2$.

In other embodiments, both the n-type layer and the p-type layer comprise inorganic materials. Thus, the n-type layer may comprise an inorganic n-type material and the p-type layer may comprise an inorganic p-type material. The inorganic p-type material may be any suitable p-type inorganic, for instance any of those listed above. Likewise, the inorganic n-type material may be any suitable n-type inorganic, for instance any of those listed above. In other embodiments, the p-type layer comprises an inorganic p-type material (i.e. an inorganic hole transporter) and the n-type layer comprises a polymeric or molecular hole transporter. The inorganic p-type material may be any suitable p-type inorganic, for instance any of those listed above. Likewise, the n-type polymeric or molecular hole transporter may be any suitable n-type polymeric or molecular hole transporter, for instance any of those listed above.

For instance, the p-type layer may comprise an inorganic hole transporter and the n-type layer may comprise an electron transporting material, wherein the electron transporting material comprises a fullerene or a fullerene derivative, an electrolyte, or an organic electron transporting material, preferably wherein the organic electron transporting material comprises perylene or a derivative thereof, or poly{[N,N0-bis(2-octyldodecyl)-naphthalene-1,4,5,8-bis(dicarboximide)-2,6-diyl]-alt-5,50-(2,20-bithiophene)} (P(NDI2OD-T2)). The inorganic hole transporter may for instance comprise an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. More typically, the inorganic hole transporter comprises an oxide of nickel, vanadium, copper or molybdenum; CuI, CuBr, CuSCN, $Cu_2O$, CuO or CIS; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. Thus, the inorganic hole transporter may comprise an oxide of nickel, vanadium, copper or molybdenum; CuI, CuBr, CuSCN, $Cu_2O$, CuO or CIS.

The optoelectronic device device typically further comprises one or more first electrodes and one or more second electrodes. The one or more first electrodes are typically in contact with the n-type region, if such a region is present. The one or more second electrodes are typically in contact with the p-type region, if such a region is present. Typically: the one or more first electrodes are in contact with the n-type region and the one or more second electrodes are in contact with the p-type region; or the one or more first electrodes are in contact with the p-type region and the one or more second electrodes are in contact with the n-type region. The first and second electrode may comprise any suitable electrically conductive material. The first electrode typically comprises a transparent conducting oxide. The second electrode typically comprises one or more metals. Typically, the first electrode comprises a transparent conducting oxide and the second electrode typically comprises one or more metals.

The transparent conducting oxide may be as defined above and is often FTO, ITO, or AZO, and typically ITO. The metal may be any metal. Generally the second electrode comprises a metal selected from silver, gold, copper, aluminium, platinum, palladium, or tungsten. The electrodes may form a single layer or may be patterned.

An optoelectronic device according to the invention, for instance a light emitting device or a photovoltaic device, may comprise the following layers in the following order:

I. one or more first electrodes as defined herein;
II. optionally a compact n-type layer as defined herein;
III. a porous layer of an n-type material as defined herein;
IV. a layer of said crystalline A/M/X material (e.g. as a sensitizer), preferably a thin film of said crystalline A/M/X material;
V. a p-type region as defined herein;
VI. optionally a further compact p-type layer as defined herein; and
VII. one or more second electrodes as defined herein.

An optoelectronic device according to the invention, for instance a light emitting device or a photovoltaic device may comprise the following layers in the following order:

I. one or more first electrodes as defined herein;
II. an n-type region comprising at least one n-type layer as defined herein;
III. a layer of the material comprising the crystalline A/M/X material (preferably a thin film of the crystalline A/M/X material) as defined herein;
IV. a p-type region comprising at least one p-type layer as defined herein; and
V. one or more second electrodes as defined herein.

An optoelectronic device according to the invention may comprise the following layers in the following order:

I. one or more first electrodes which comprise a transparent conducting oxide, preferably FTO;
II. an n-type region comprising at least one n-type layer as defined herein;
III. a layer of the crystalline A/M/X material (preferably a layer comprising a thin film of the crystalline A/M/X material) as defined herein;
IV. a p-type region comprising at least one p-type layer as defined herein; and
V. one or more second electrodes which comprise a metal, preferably silver or gold.

An optoelectronic device (for instance an inverted device) according to the invention may comprise the following layers in the following order:

I. one or more second electrodes as defined herein;
II. an n-type region comprising at least one n-type layer as defined herein;
III. a layer of the crystalline A/M/X material (preferably a layer comprising a thin film of the crystalline A/M/X material) as defined herein;
IV. a p-type region comprising at least one p-type layer as defined herein; and
V. one or more first electrodes as defined herein.

An optoelectronic device according to the invention, for instance a light emitting device or a photovoltaic device, may comprise the following layers in the following order I. one or more second electrodes which comprises a metal;
II. an n-type region comprising at least one mesoporous n-type layer as defined herein;
III. a sensitising layer of the crystalline A/M/X material (preferably a sensitising layer comprising a thin film of the crystalline A/M/X material) as defined herein;
IV. a p-type region comprising at least one p-type layer as defined herein; and
V. one or more first electrodes which comprise a transparent conducting oxide.

The one or more first electrodes may have a thickness of from 100 nm to 700 nm, for instance of from 100 nm to 400 nm. The one or more second electrodes may have a thickness of from 10 nm to 500 nm, for instance from 50 nm to 200 nm or from 10 nm to 50 nm. The n-type region may have a thickness of from 50 nm to 500 nm. The p-type region may have a thickness of from 50 nm to 500 nm.

Many of the above-described optoelectronic devices comprise a layer of a crystalline A/M/X material (preferably a layer comprising a thin film of the crystalline A/M/X material) disposed on a preceding layer in the device (for example a layer of semiconducting material, a layer of an n-type semiconductor, a layer of a p-type semiconductor, a scaffold material etc.). In these cases, the layer of crystalline A/M/X material in the device may be prepared as described herein. The optoelectronic devices may also further comprise subsequent layers disposed on the layer of crystalline A/M/X material. Subsequent layers disposed on the layer of crystalline A/M/X material may be prepared as described in WO 2017/037448.

In other embodiments, the photoactive material functions as a phosphor in the optoelectronic device. In such embodiments, the optoelectronic device typically comprises a light source and a photoactive material as defined herein. Typically, the photoactive material comprises a nanocrystals of a crystalline A/M/X material as defined herein, obtainable directly from the precipitate formed by the process of the invention or obtainable from a thin film produced by a process as defined herein. Also typically, the photoactive material comprises a matrix material as defined herein.

By "functions as a phosphor" is meant that the photoactive material functions by absorbing a first wavelength of light and subsequently re-emitting a different, larger wavelength of light.

The light source is typically a white, blue or UV light source. That is, the light source is typically a source of electromagnetic radiation which emits at wavelengths of 500 nm or less, more usually 480 nm or less. For example, the light source typically emits electromagnetic radiation with a wavelength of from 400 to 480 nm.

Examples of optoelectronic devices wherein the photoactive material functions as a phosphor include display screens, such as LED display screens, and solid-state lighting devices. Such devices represent a further aspect of the invention.

Use

In a further aspect, the invention provides uses of the crystalline A/M/X materials of the invention and the photoactive materials of the invention comprising said compounds.

In a first embodiment, the invention provides the use of a crystalline A/M/X material or photoactive material as defined herein as a photo-emitter, preferably a photo-emitter which emits light, preferably visible light (i.e. light having a wavelength in the region 450 to 700 nm). In a preferred embodiment, the photo-emitter emits blue light, i.e. light in the wavelength range 450 to 500 nm, more preferably 455 to 495 nm, further preferably 460 to 490 nm.

In a second embodiment, the invention provides the use of a crystalline A/M/X material or a photoactive material as defined herein in the manufacture of an optoelectronic device, preferably wherein said optoelectronic device emits light, preferably visible light and more preferably wherein said optoelectronic device emits blue light in the wavelength range 450 to 500 nm, more preferably 455 to 495 nm, further preferably 460 to 490 nm.

In a third embodiment, the invention provides the use of a crystalline A/M/X material or a photoactive material as defined herein as a phosphor. For example, the invention provides the use of a photoactive material as defined herein in the manufacture of a screen, in particular an LED screen, or a solid-state lighting device.

In a fourth embodiment, the invention further provides the use of a crystalline A/M/X material or an optoelectronic device as defined herein in a method of generating light, preferably visible light, more preferably in a method of generating light in the wavelength range 450 to 500 nm, more preferably 455 to 495 nm, further preferably 460 to 490 nm. For example, the invention provides a method of generating light comprising irradiating a crystalline A/M/X material or a photoactive material as defined herein with a light source; and thus generating emission of light from said photoactive material in the wavelength range 450 to 500 nm, more preferably 455 to 495 nm, further preferably 460 to 490 nm.

EXAMPLES

The advantages of the invention will hereafter be described with reference to some specific examples.

1. Materials Used in the Examples

CsBr (99.9%), CsCl (99.9%), RbBr (99.9%), RbCl (99.9%), Formamidine acetate salt (FAAc: 99%), $PbBr_2$ (≥98%), $PbCl_2$ (≥98%), Pb acetate ($Pb(Ac)_2$: ≥99.99%), Hydrobromic acid (HBr: 48 wt % in water, or 47% in water where indicated), N,N-dimethylformamide (DMF: anhydrous 99.8%), dimethyl sulfoxide (DMSO: anhydrous 99.9%), ethanol (laboratory reagent, 96%), methanol (anhydrous, 99.8%), isopropanol (anhydrous 99.5%) toluene (anhydrous 99.8%), methyl acetate (anhydrous 99.5%), acetic acid (≥99%), Poly(methyl methacrylate) (PMMA: average Mw 97,000 (Typical), average Mn 46,000 (Typical)) were purchased from Sigma-Aldrich. $Cs_2CO_3$ (99%) and Hydriodic acid (HI: 57% w/w aq. soln., stab with 1.5% hypophosphorous acid) were purchased from Alfa Aesar. Hydrochloric Acid (HCl: 32% in $H_2O$) was purchased from Fisher Scientific.

2. Fabrication of $Cs_{1-x}Rb_xPbBr_3$ Crystalline Powders $Cs_{1-x}Rb_xPbBr_3$ was prepared by mixing CsBr and RbBr (in variable molar ratio) combined with $PbBr_2$ in stoichiometric amounts. For example, $Cs_{0.5}Rb_{0.5}PbBr_3$ was prepared with 1.064 g (5 mmol) of CsBr and 0.827 g (5 mmol) of RbBr, which were dissolved into 5 mL of deionized (DI) water and the solution was mixed with a vortex mixer at room temperature until becoming a clear solution. 3.670 g (10 mmol) of $PbBr_2$ was dissolved into 12.6 mL of DMF and 2.4 mL of HBr and the solution was mixed with a magnetic stir bar at 100° C. for 10 min.

The aqueous $Cs_{0.5}Rb_{0.5}Br$ solution was slowly added to the $PbBr_2$ solution whilst stirring with a magnetic stir bar at room temperature (19-21° C.). At a certain point, an orange-yellow precipitate appears in the solution. Optionally, 10 mL of ethanol was added into the solution holding the precipitate and mixed with a vortex mixer for 10-20 seconds. The precipitate was collected on an alpha-cellulose filter paper (Advantec) and washed with ethanol a few times. Then it was dried in a vacuum oven at 70° C. for 10 h.

3. Preparation of $Cs_{1-x}Rb_xPbBr_3$ Precursor Solution (Conventional Method) $Cs_{1-x}Rb_xPbBr_3$ was prepared by mixing of $CsPbBr_3$ and $RbPbBr_3$ precursor solutions. A $CsPbBr_3$ solution was prepared from CsBr and $PbBr_2$. An $RbPbBr_3$ solution was prepared from RbBr and $PbBr_2$. To make said $CsPbBr_3$ solution, the aforementioned halide salts (CsBr and $PbBr_2$) were dissolved in a solvent mixture of DMF and DMSO in 1:9 volume ratio, to obtain a perovskite solution with desired composition of 0.1 M of lead halide concentration. The solution was mixed with a magnetic stir bar at 40° C. for more than 30 min. The solution was filtered with PTFE (pore size 0.45 μm). The $RbPbBr_3$ solution was made by a corresponding method.

To produce the mixed cation perovskites $Cs_{1-x}Rb_xPbBr_3$, the $CsPbBr_3$ and $RbPbBr_3$ precursor solutions were mixed to prepare a $Cs_{1-x}Rb_xPbBr_3$ mixed solution where x=0, 0.1, 0.2, 0.3, 0.4, 0.5, 0.6, 0.7, 0.8 and 0.9.

4. Fabrication of $CsPb(Br_{1-x}Cl_x)_3$ Crystalline Powders $CsPb(Br_{1-x}Cl_x)_3$ was prepared by mixing CsBr and CsCl (Aldrich 99.9%) in various molar ratios, combined with the same molar ratio of $PbBr_2$ and $PbCl_2$ in stoichiometric amounts. For example, $CsPb(Br_{0.7}Cl_{0.3})_3$ was prepared with 1.490 g (7 mmol) of CsBr and 0.504 g (3 mmol) of CsCl, which were dissolved into 5 mL of DI water and the solution was mixed with a vortex mixer until becoming clear. 2.569 g (7 mmol) of $PbBr_2$ and 0.834 g (3 mmol) of $PbCl_2$ were dissolved into 8.82 mL of DMF and 1.68 mL of HBr and 3.15 mL of DMF and 1.35 mL of HCl, respectively. The $PbBr_2$ solution and $PbCl_2$ solution were mixed with a magnetic stir bar at 100° C. for 10 min and 5 min, respectively, and then the two solutions were combined and mixed with a magnetic stir bar at 18-20° C. for 5 min.

The aqueous $CsBr_{0.7}Cl_{0.3}$ solution was slowly added into the $Pb(Br_{0.7}Cl_{0.3})_2$ solution whilst stirring with a magnetic stir bar at 18-20° C. At a certain point, a bright yellow precipitate appears in the solution. 10 mL of ethanol was added into the solution holding the precipitate and mixed with a vortex mixer for 10-20 seconds. The precipitate was taken out on an alpha-cellulose filter paper (Advantec) and washed with ethanol a few times, and then it was dried in a vacuum oven at 70° C. for 10 h.

5. Fabrication of $Cs_{1-x}Rb_xPb(Br_{1-x}Cl_x)_3$ Crystalline Powders $Cs_{1-x}Rb_xPb(Br_{1-x}Cl_x)_3$ was prepared by mixing various molar ratios of CsBr, RbBr, CsCl and RbCl combined with the same molar ratio of $PbBr_2$ and $PbCl_2$ in stoichiometric amounts. For the synthesis of $Cs_{0.6}Rb_{0.4}Pb(Br_{0.7}Cl_{0.3})_3$, 0.745 g (3.5 mmol) of CsBr, 0.579 g (3.5 mmol) of RbBr, 0.252 g (1.5 mmol) of CsCl and 0.181 g (1.5 mmol) of RbCl were dissolved into 5 mL of DI water and the solution was mixed with a vortex mixer until becoming clear. 2.569 g (7 mmol) of $PbBr_2$ and 0.834 g (3 mmol) of $PbCl_2$ were dissolved into 6.3 mL of DMF and 1.2 mL of HBr and 5.25 mL of DMF and 2.25 mL of HCl, respectively. The $PbBr_2$ solution and $PbCl_2$ solution were mixed with a magnetic stir bar at 100° C. for 10 min and 5 min, respectively, and then the two solutions were combined and mixed with a magnetic stir bar at 18-20° C. for 5 min.

The aqueous $CsBr_{0.5}Cl_{0.5}$ solution was slowly added into the PbBrCl solution whilst stirring with a magnetic stir bar at 18-20° C. At a certain point, a bright yellow precipitate appears in the solution. 10 mL of ethanol was added into the solution holding the precipitate and mixed with a vortex mixer for 10-20 seconds. The precipitate was taken out on an alpha-cellulose filter paper (Advantec) and washed with ethanol a few times, and then it was dried in a vacuum oven at 70° C. for 10 h.

6. Fabrication of $CsPb(Br_{0.7}Cl_{0.3})_3$ Crystalline Powders with Excess Cs Cation $CsPb(Br_{0.7}Cl_{0.3})_3$ with excess cesium halide was prepared by varying the molar ratio of cesium halides and lead halides. $CsPb(Br_{0.7}Cl_{0.3})_3$ in 2:1 molar ratio of Cs:Pb was prepared with 2.8 g (14 mmol) of CsBr and 1.008 g (6 mmol) of CsCl, which were dissolved into 5 mL of DI water and mixed with a vortex mixer until becoming clear. 2.569 g (7 mmol) of $PbBr_2$ and 0.834 g (3 mmol) of $PbCl_2$ were dissolved into 8.82 mL of DMF and 1.68 mL of HBr and 3.15 mL of DMF and 1.35 mL of HCl, respectively. The $PbBr_2$ solution and $PbCl_2$ solution were mixed with a magnetic stir bar at 100° C. for 10 min and 5 min, respectively, and then combined and mixed with a magnetic stir bar at 18-20° C. for 5 min.

The aqueous $CsBr_{0.7}Cl_{0.3}$ solution was slowly added into the $Pb(Br_{0.7}Cl_{0.3})_2$ solution whilst stirring with a magnetic stir bar at 18-20° C. At a certain point, a bright yellow precipitate appears in the solution. 10 mL of ethanol was added into the solution holding precipitate and mixed with a vortex mixer for 10-20 seconds. The precipitate was taken out on an alpha-cellulose filter paper (Advantec) and washed with ethanol a few times, and then it was dried in a vacuum oven at 70° C. for 10 h.

7. Fabrication of $(Cs_{1-x}Rb_x)_4PbBr_6$ Crystalline Powders $(Cs_{1-x}Rb_x)_4PbBr_6$ was prepared by varying the molar ratio of CsBr and RbBr combined with $PbBr_2$ in 10:1 molar ratio for $Cs_{1-x}Rb_x$:Pb. For example, $(Cs_{0.9}Rb_{0.1})_4PbBr_6$ was prepared with 383 mg (1.8 mmol) of CsBr and 33.1 mg (0.2 mmol) of RbBr, which were dissolved into 600 μL of DI water and 300 μL of HBr. The salts were dissolved with a vortex mixer until becoming clear. 73.4 mg (0.2 mmol) of $PbBr_2$ was dissolved in 1 mL of DMSO. The $PbBr_2$ solution was mixed with a magnetic stir bar at 100° C. for a few minutes.

The aqueous $Cs_{1-x}Rb_xBr$ solution was slowly added into the $PbBr_2$ solution whilst stirring with a magnetic stir bar at 18-20° C. At a certain point, a bright yellow precipitate appears in the solution. After addition of the entire $Cs_{1-x}Rb_xBr$ solution into the $PbBr_2$ solution, the solution was transferred to a stirring hot plate to complete the reaction at 100° C. for 15 minutes. 2 mL of ethanol was then added into the solution holding the precipitate and mixed with a vortex mixer for 10-20 seconds. The precipitate was taken out on an alpha-cellulose filter paper (Advantec) and washed with ethanol a few times, and then it was dried in a vacuum oven at 70° C. for 10 h.

For comparative purposes, in some instances $(Cs_{1-x}Rb_x)_4PbBr_6$ was also synthesised using an aqueous solvent, rather than an organic solvent, as the solvent in the solution comprising the M precursor (Pb). In these experiments, the $PbBr_2$ was dissolved in 47 wt % HBr in water, rather than being dissolved in DMSO. Thus, $(Cs_{1-x}Rb_x)_4PbBr_6$ was prepared by varying the molar ratio of CsBr and RbBr combined with $PbBr_2$ in 4:1 molar ratio for $Cs_{1-x}Rb_x$:Pb using either HBr 47% in water or DMSO as solvent for $PbBr_2$. For example, $(Cs_{0.55}Rb_{0.45})_4PbBr_6$ was prepared with 93 mg (0.44 mmol) of CsBr and 59 mg (0.36 mmol) of RbBr, which were dissolved into 400 μL of DI water and 50 μL of HBr. The salts were dissolved with a vortex mixer until becoming clear. For the HBr route, 73.4 mg (0.2 mmol) of $PbBr_2$ was dissolved in 1 mL of HBr. The $PbBr_2$ solution was mixed with a magnetic stir bar at 20° C. for a few minutes. For the DMSO route, 73.4 mg (0.2 mmol) of $PbBr_2$ was dissolved in 1 mL of DMSO. The $PbBr_2$ solution was mixed with a magnetic stir bar at 100° C. for a few minutes.

The aqueous $Cs_{1-x}Rb_xBr$ solution was slowly added into the $PbBr_2$ solution whilst stirring with a magnetic stir bar at 18-20° C. At a certain point, a yellow precipitate appears in the solution. 2 mL of iso-propanol was then added into the solution holding the precipitate and mixed with a vortex mixer for 10-20 seconds. The precipitate was taken out on an alpha-cellulose filter paper (Advantec) and washed with iso-propanol a few times, and then it was dried in a vacuum oven at 70° C. for 10 h.

$Cs_4PbBr_6$ and $Rb_4PbBr_6$ powders (where x=0 or 1) were also prepared by providing "A" (Cs or Rb) and "M" (Pb) in a 4:1 molar ratio. An aqueous solution containing $Cs^+$ or $Rb^+$ was provided, and an organic solution containing $Pb^{2+}$. The organic solvent present in the precursor solution comprising Pb$^{2+}$ was DMSO. For comparative purposes, in some cases 47 wt % HBr was used as the solvent for the precursor solution comprising Pb$^{2+}$.

For instance, Rb$_4$PbBr$_6$ was prepared from RbBr combined with PbBr$_2$ in 4:1 molar ratio for Rb:Pb using either HBr 47% in water or DMSO as solvent for PbBr$_2$. Rb$_4$PbBr$_6$ was prepared with 132 mg (0.8 mmol) of RbBr, which were dissolved into 400 µL of DI water and 50 µL of HBr. The salts were dissolved with a vortex mixer until becoming clear. For the HBr route, 73.4 mg (0.2 mmol) of PbBr$_2$ was dissolved in 1 mL of HBr. The PbBr$_2$ solution was mixed with a magnetic stir bar at 20° C. for a few minutes. For the DMSO route, 73.4 mg (0.2 mmol) of PbBr$_2$ was dissolved in 1 mL of DMSO. The PbBr$_2$ solution was mixed with a magnetic stir bar at 100° C. for a few minutes.

The aqueous RbBr solution was slowly added into the PbBr$_2$ solution whilst stirring with a magnetic stir bar at 18-20° C. At a certain point, a white precipitate appears in the solution. 2 mL of iso-propanol was then added into the solution holding the precipitate and mixed with a vortex mixer for 10-20 seconds. The precipitate was taken out on an alpha-cellulose filter paper (Advantec) and washed with iso-propanol a few times, and then it was dried in a vacuum oven at 70° C. for 10 h.

8. Fabrication of (Cs$_{1-x}$FA$_x$)$_4$PbI$_3$Br$_3$ Crystalline Powders (Cs$_{1-x}$FA$_x$)$_4$PbI$_3$Br$_3$ was prepared by varying the molar ratio of Cs$_2$CO$_3$ and Formamidine acetic acid (FAAC) combined with lead acetate (PbAC) in 10:1 molar ratio for Cs$_{1-x}$Rb$_x$:Pb. For example, (FA$_{0.5}$Cs$_{0.5}$)$_4$PbI$_3$Br$_3$ was prepared with 81.5 mg (250 mmol) of Cs$_2$CO$_3$, 52.1 mg (500 mmol) of FAAC and 40.7 mg (125 mmol) of PbAC which were dissolved into 1 mL of methanol and 100 µL of acetic acid. The salts were mixed with a magnetic stir bar at 19-21° C. for more than 5 minutes until becoming clear.

The aqueous HI/HBr (1:1 molar ratio) solution was slowly added into the salts solution whilst stirring with a magnetic stir bar at 18-20° C. At a certain point, a bright yellow precipitate appears in the solution and then the color of the precipitate changed from yellow to red-orange by increasing the amount of HI/HBr. After addition of all HI/HBr solution, 3 mL of iso-propanol was immediately added into the mixed solution holding the precipitate and mixed with a vortex mixer for 5-10 seconds. The precipitate was taken out on an alpha-cellulose filter paper (Advantec) and washed with iso-propanol a few times, and then it was dried in a vacuum oven at 70° C. for 10 h.

9. Fabrication of Perovskite Thin Films with Stoichiometric Perovskite Materials Perovskite crystals were dissolved in a mixed solvent of DMF and DMSO in 1:9 volume ratio to obtain a perovskite solution with desired composition and molar concentration of 0.125-0.3 M. The perovskite precursor solution was coated onto the glass substrate by spin-coating at 3000 rpm (acceleration 500 rpm) for 50 sec in a normal lab atmosphere (18-20° C., humidity 40-60%), and then the perovskite films were dried at 100° C. for 5 min in the same atmosphere.

10. Fabrication of Thin Films of Polycrystalline Perovskites Dispersed in a Polymer Matrix, with Excess A Site Perovskite The crystals were grinded in a mortar for 5 minutes and added into a poly(methyl methacrylate) solution (PMMA, 200 mg/mL in toluene) to obtain a perovskite crystal dispersion. The mixed perovskite/polymer solution was coated on glass substrate using the doctor blade method. The film was dried on a hot plate at 70° C. for a few minutes.

11. Characterization

UV-vis absorption spectra were measured by a commercial spectrophotometer (Varian Cary 300 UV-Vis). Photoluminescence (PL) spectra were recorded using an excitation wavelength of 365-405 nm and slit widths of 1-3 mm on a commercial spectrofluorometer (Horiba, Fluorolog). Photoluminescence quantum yield (PLQY) values were determined using a 405 nm CW laser (RLTMDL-405, Roithner Lasertechnik GmbH) to illuminate a sample in an integrating sphere (Oriel Instruments 70682NS), and the laser scattered and PL collected using a fiber-coupled detector (Ocean Optics MayaPro). PLQY calculations were carried out using established techniques. The laser intensity was adjusted using neutral density filters. Powder X-ray reflection diffraction (PXRD) patterns were obtained with a Panalytical X'pert powder diffractometer (Cu-Kα1 radiation; λ=154.05 µm) at room temperature.

12. Results and Discussion

Thin films of Cs$_{1-x}$Rb$_x$PbBr$_3$ with x=0 to x=1 were fabricated as in sections (2) and (9). This type of mixed cation lead halide perovskites is of interest for blue and green light emitters. In FIGS. 1 (*a*) and (*b*), X-ray diffraction (XRD) patterns of Cs$_{1-x}$Rb$_x$PbBr$_3$ for synthesized powders and thin films, respectively, are shown. It was observed that the synthesized Cs$_{1-x}$Rb$_x$PbBr$_3$ powders up to x=0.3 show similar peak positions than neat CsPbBr$_3$ in the orthorhombic structure (space group: pnma). When further increasing Rb concentration in Cs$_{1-x}$Rb$_x$PbBr$_3$, a diffraction peak at ~11.8 degree appears, which is related to non-perovskite NH$_4$CdCl$_3$ like structure. However, in Cs$_{1-x}$Rb$_x$PbBr$_3$ thin films, a highly ordered perovskite phase up to x=0.9 was observed. The peak positions at 15.2° and 30.7° on CsPbBr$_3$ composition shift to higher angle with increasing Rb concentration as expected from the reduction of the lattice size due to the smaller ionic radius of Rb with respect to Cs.

This illustrates the improvement in stoichiometric control (up to x=0.9) that can be obtained by fabricating thin films according the method of the invention.

Figure 2:
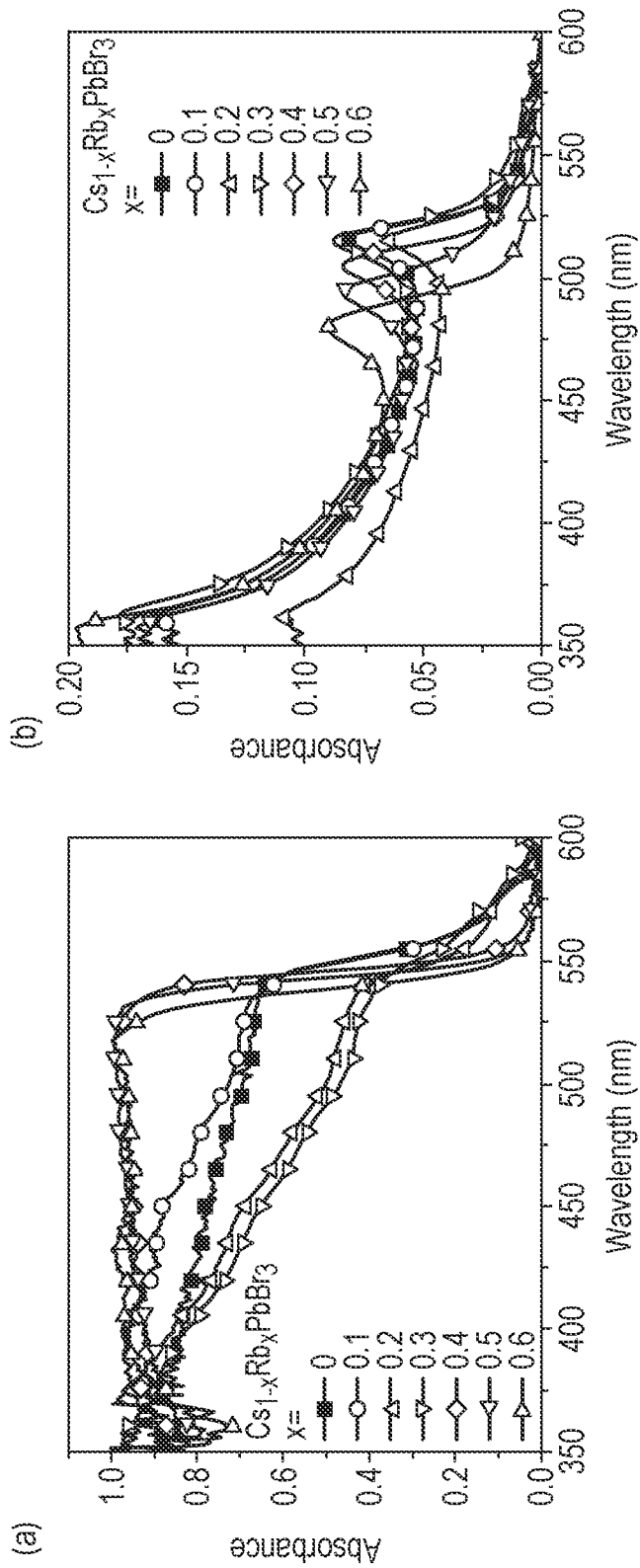
FIG. 2(a) shows the absorption spectra of $Cs_{1-x}Rb_xPbBr_3$ powders (with varying x).
FIG. 2(b) shows the absorption spectra of thin films of the corresponding materials.

Similarly, FIGS. 2 (*a*) and 2 (*b*) show UV-Vis absorption spectra of Cs$_{1-x}$Rb$_x$PbBr$_3$ for synthesized powders and thin films, respectively. For powders, the absorption onset of Cs$_{1-x}$Rb$_x$PbBr$_3$ shows a slight shift in onset towards 550 nm as x varies from 0 (filled squares) to 0.6 (right-facing triangle). This illustrates the change in optical properties achieved by fabricating different products according to the method of the invention. However, even more marked shifts are shown in the data for thin films in FIG. 2(*b*): the absorption onset of Cs$_{1-x}$Rb$_x$PbBr$_3$ demonstrates a significant shift towards the blue as x increases from 0. The shift in absorption wavelength is visible when x is as low as 0.3. The observation of a steady shift in absorption onset is consistent with the formation of a stoichiometric mixture of cations in the perovskite lead bromide structure. The steady shift also illustrates that materials with finely tunable optical properties are obtainable by the method of the invention.

Figure 3:
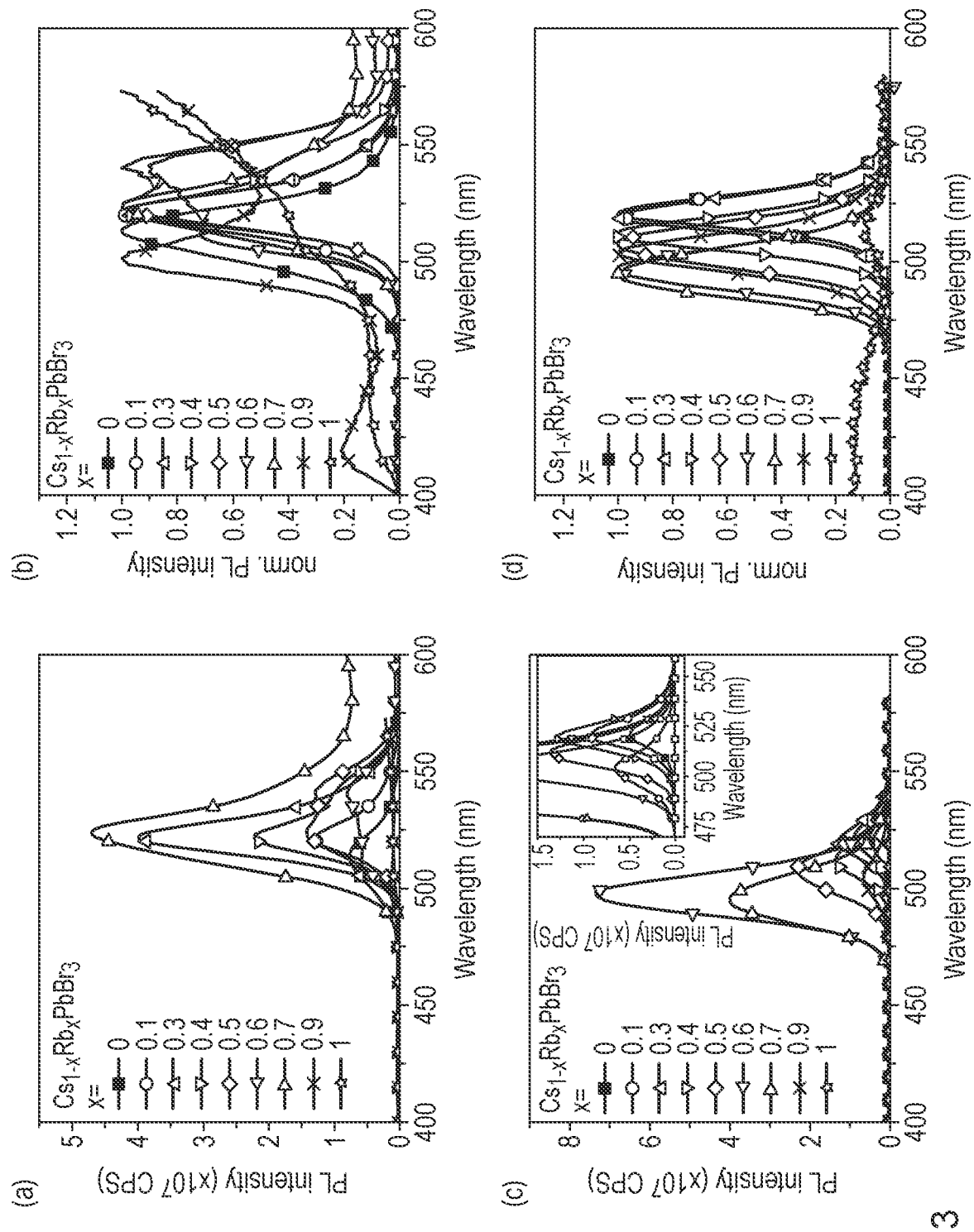
FIGS. 3 (c) and (d) show steady-state photoluminescence spectra for their corresponding thin films.

FIGS. 3 (*a*) and (*b*) show steady-state photoluminescence (SSPL) spectra and normalized photoluminescence (PL) spectra, respectively, of Cs$_{1-x}$Rb$_x$PbBr$_3$ for synthesized crystalline powders. The PL intensity shows a considerable increase where x is in the range 0.2 to 0.7, and the normalised PL emission peak clearly moves (albeit without a clear trend with increasing Rb content), similar to the absorption spectra in FIG. 2 (*a*). In FIGS. 3 (*c*) and (*d*), SSPL spectra and normalized PL spectra, respectively, of Cs$_{1-x}$Rb$_x$PbBr$_3$ thin films are shown. The PL intensity of the thin films is significantly enhanced with the incorporation of Rb into neat CsPbBr$_3$ and the largest PL intensity is reached with x=0.6 (FIG. 3 (*c*)). Photoluminescence quantum yields (PLQY) for the thin films for x=0 and x=0.6 are found to be 3.1% and 18.3%, respectively. In FIG. 3 (d), the PL peak position of $Cs_{1-x}Rb_xPbBr_3$ does not demonstrate a significant shift up to x=0.3, in agreement with the shift of the absorption edge shown in FIG. 2 (b). With further increase of Rb concentration, a clear shift towards shorter wavelengths is observed.

The structural and optical properties of mixed $Cs_{1-x}Rb_xPbBr_3$ thin films shown in FIGS. 1-3 demonstrate that the invented method is beneficial for the synthesis of ordered and homogeneously mixed lead bromide perovskites. In order to further assess the advantages of the method of the invention, $Cs_{1-x}Rb_xPbBr_3$ thin films were prepared using a conventional method. The optical properties of the thin films obtained from both methods were compared (see FIG. 4).

Figure 4:
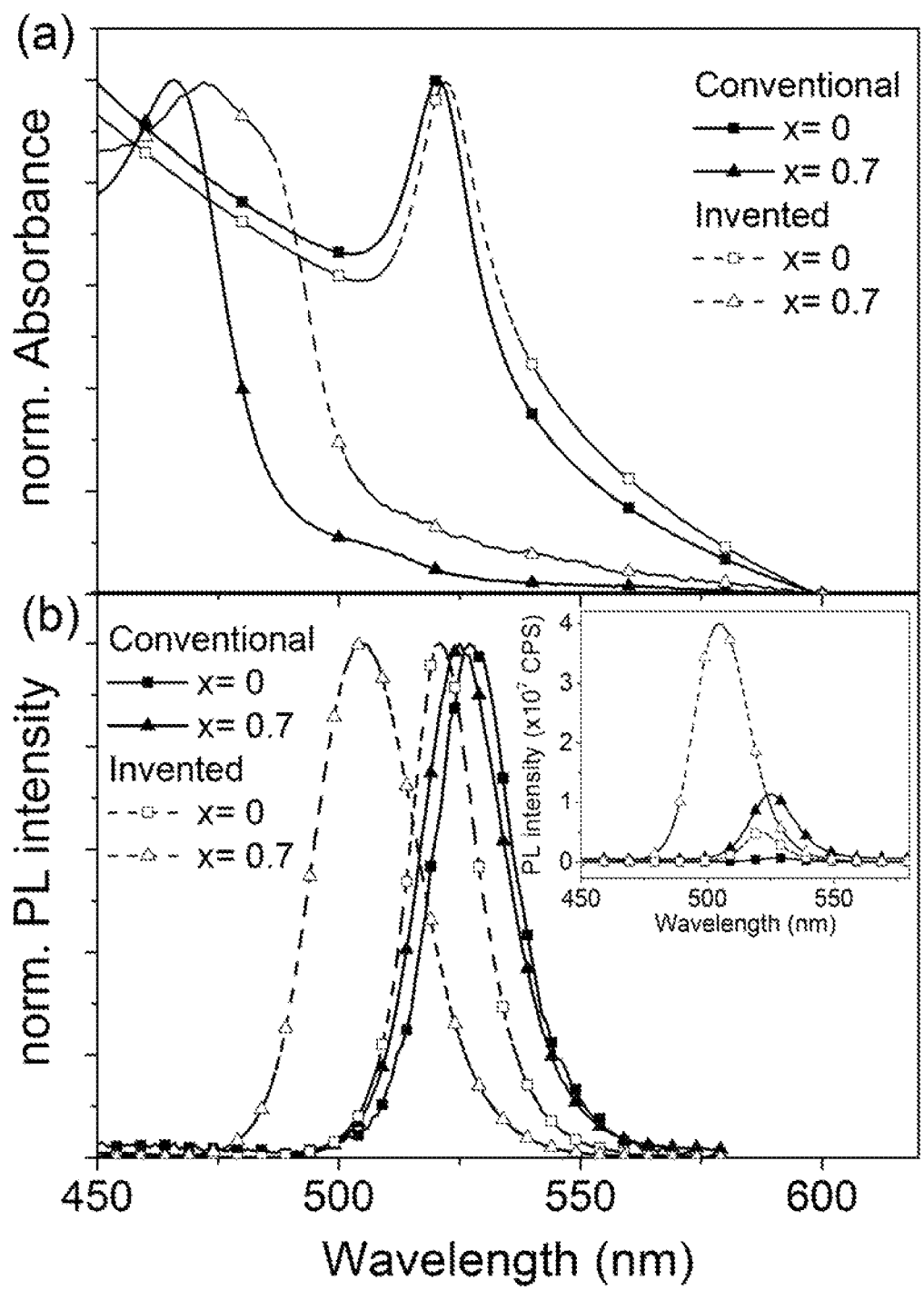
FIG. 4 (a) shows absorption spectra and FIG. 4 (b) shows normalized steady-state photoluminescence spectra (the insert in 4(b) shows non-normalised steady-state photoluminescence spectra) of $Cs_{1-x}Rb_xPbBr_3$ thin films fabricated from both a conventional method and a method according to the invention ("invented method").

It was observed that for x=0 and x=0.7 (FIG. 4 (a)), the absorption onset of films cast from the conventional method (i.e. dissolved CsBr/RbBr and $PbBr_2$ in DMF:DMSO) is located at a lower wavelength compared to the films obtained with the method of the invention ("invented method", i.e. formation of thin films from powders fabricated from two solutions and redissolved in DMSO to form a thin film). For high Rb content (x=0.7), films obtained from the conventional method show a large shift between the absorption onset and the PL peak, centered at ~525 nm. In contrast, the PL peak position of the x=0.7 thin film fabricated with the invented method is at ~500 nm with almost no Stokes shift. Additionally, the PL intensity of the thin films obtained with the invented method is much higher than that of the thin film obtained with the conventional method. The large shift between the absorption onset and the PL peak in the films obtained with the conventional method is due to inhomogeneous mixing of the cations in the perovskite structure. PL emission at 525 nm, indicates the presence of nearly neat cesium lead bromide regions, indicative of poor mixing. In contrast, the PL emission of the films obtained with the method of the invention is consistent with a single phase, homogeneous material.

Figure 5:
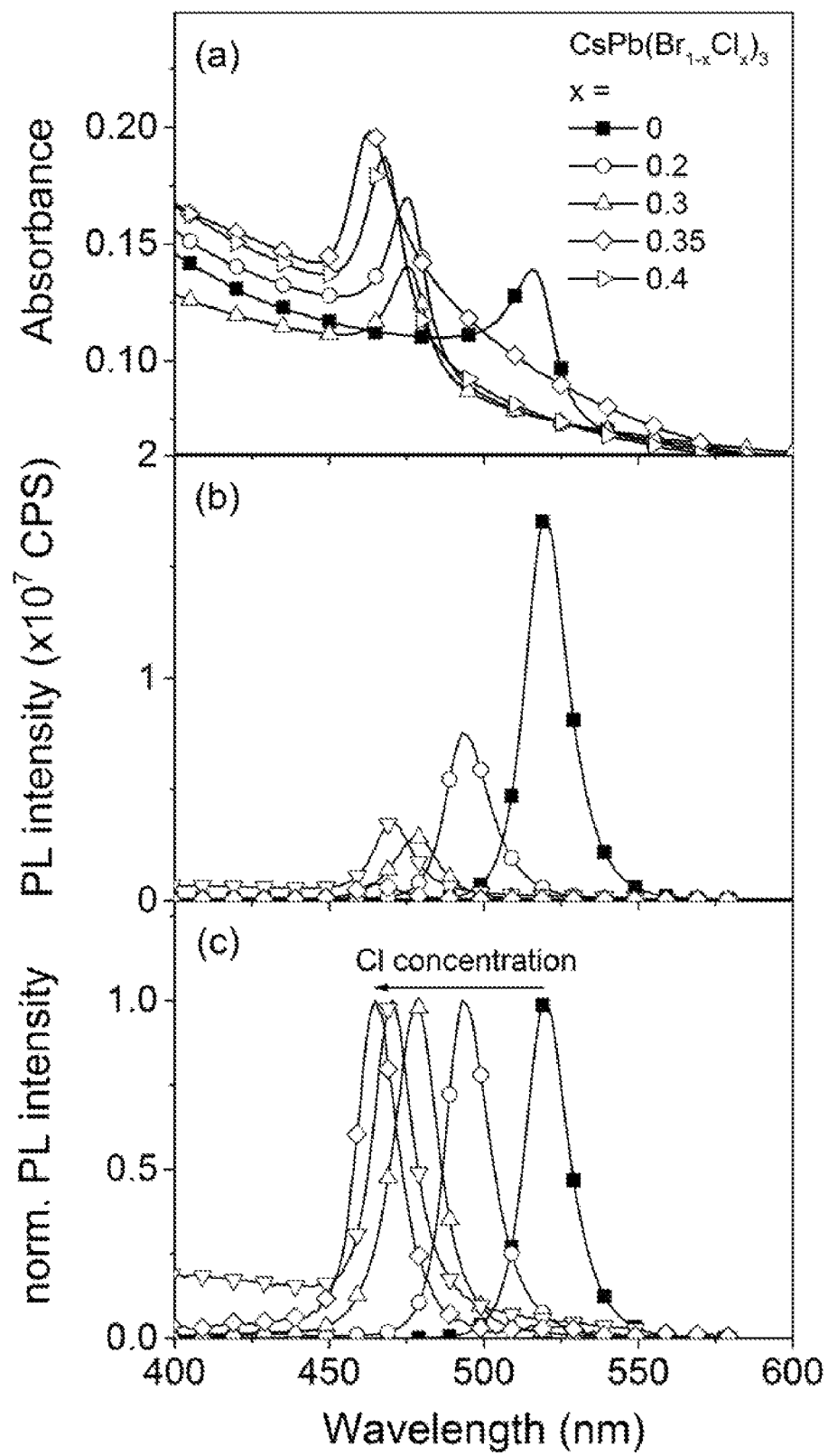
FIG. 5 shows (a) absorption spectra, (b) steady-state photoluminescence spectra, and (c) normalized photoluminescence ("PL") spectra of $CsPb(Br_{1-x}Cl_x)_3$ thin films.
Figure 6:
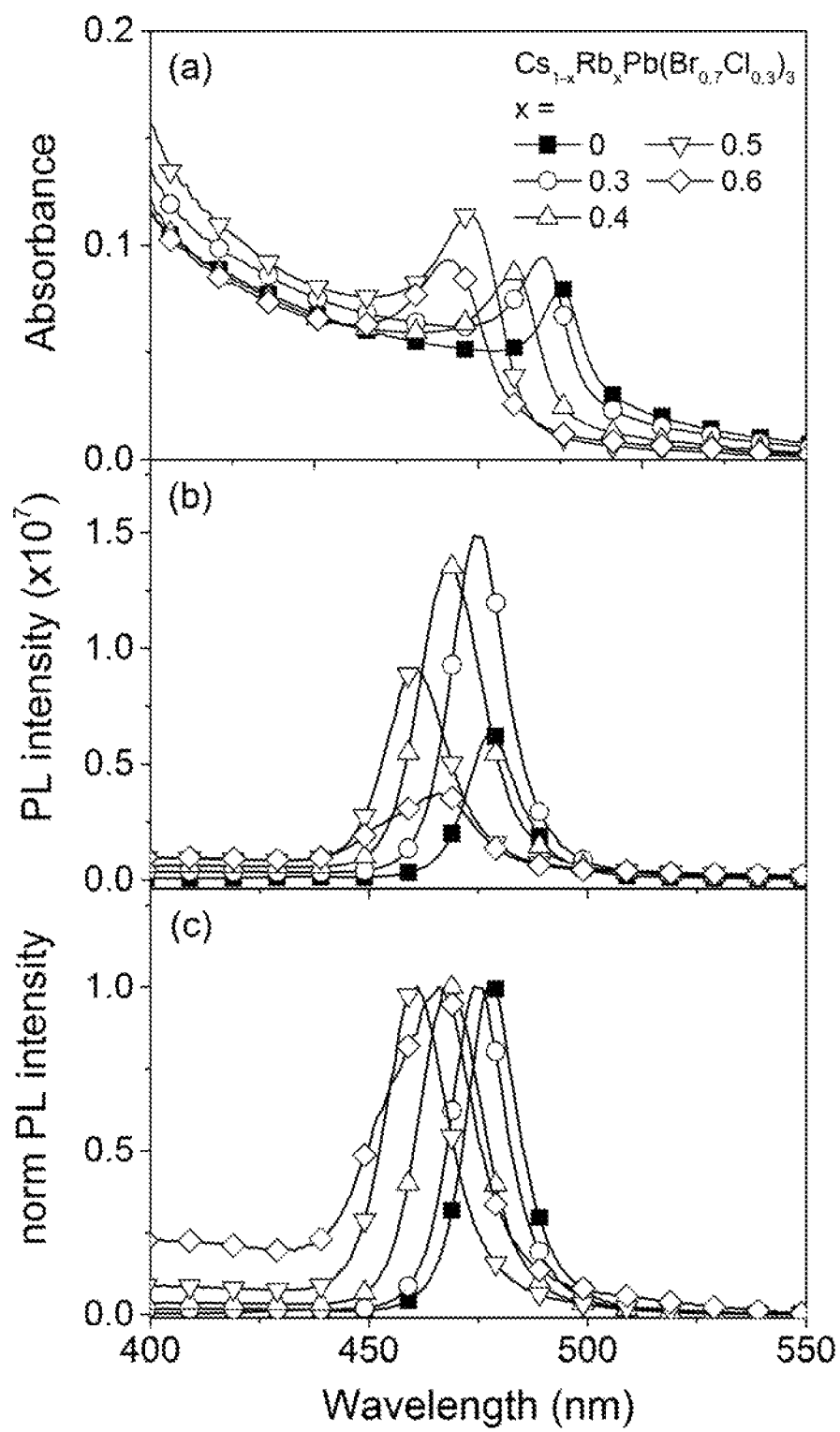
FIG. 6 shows (a) absorption spectra, (b) steady-state photoluminescence spectra, and (c) normalized photoluminescence spectra of $Cs_{1-x}Rb_xPb(Br_{0.7}Cl_{0.3})_3$ thin films.

It is also demonstrated herein that the method of the invention is particularly beneficial for the fabrication of stoichiometrically-homogeneous mixed halide and mixed cation perovskites. In FIGS. 5 and 6, an increase of the semiconductor bandgap is shown with addition of chloride and rubidium, respectively. A decrease in the PL intensity was observed with addition of chloride ion the bromide-based perovskite. The PLQY of the films with x=0 and x=0.3 is determined to be 3-4% and <1%, respectively.

FIG. 6 shows that the PL intensity increases with the addition of rubidium ions for a given Br/Cl ratio ($CsPb(Br_{0.7}Cl_{0.3})_3$). The PLQY of the films with x=0 and x=0.3 is determined to be <1% and 1-2%, respectively.

Figure 7:
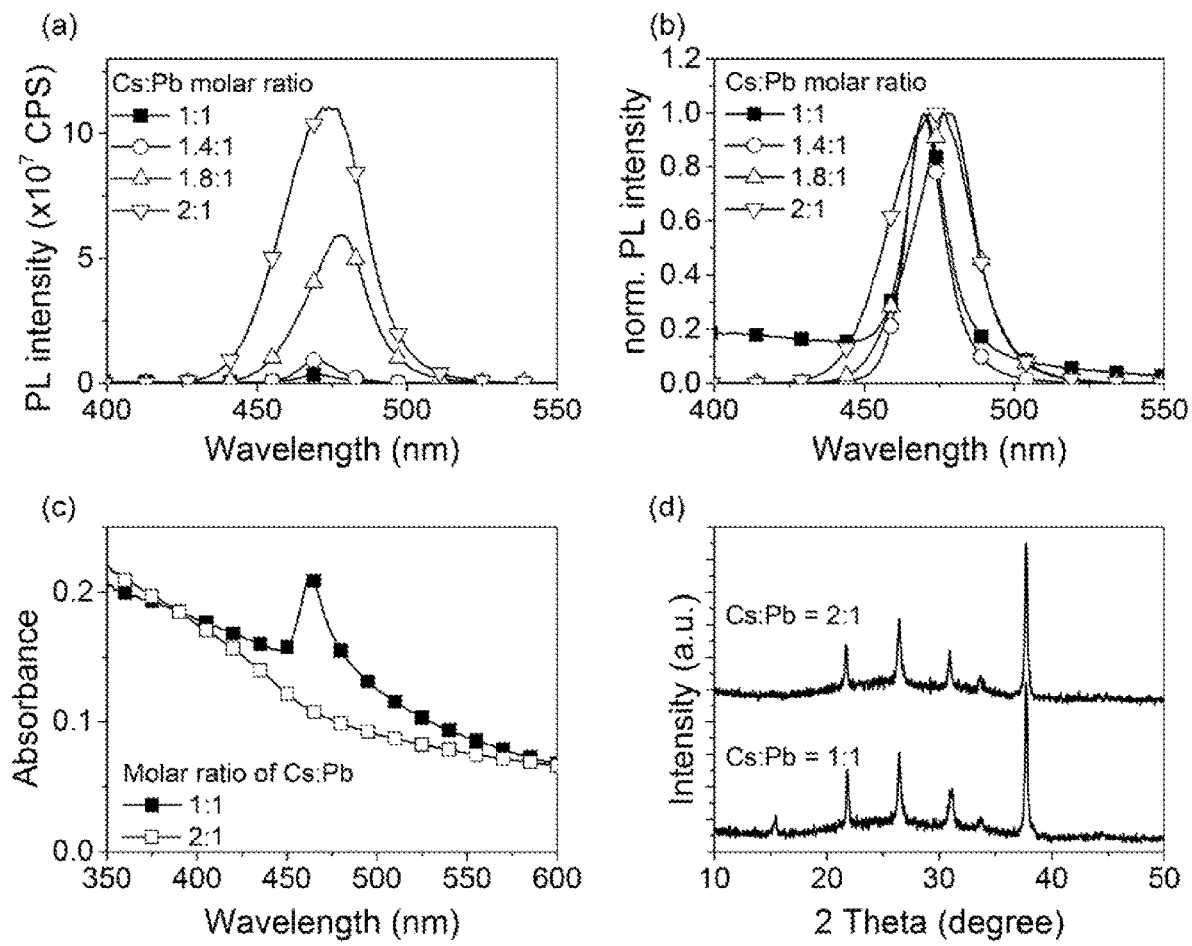
FIG. 7 shows (a) steady-state photoluminescence spectra, and (b) normalized PL spectra, (c) absorption spectra and (d) X-ray diffraction patterns of $CsPb(Br_{0.7}Cl_{0.3})_3$ thin films with different Cs/Pb ratios.

In another example, the method of the invention was used to generate highly emissive lead bromide perovskites with an excess of A cation (that is, a perovskite wherein the Cs:Pb ratio is greater than 1). FIG. 7 shows the effect of increasing the molar ratio of Cs:Pb in a $CsPb(Br_{0.7}Cl_{0.3})_3$ composition. A significant enhancement of the PL intensity with increasing Cs content is observed. The PL peak position varies slightly, is attributed to optical effects (e.g. reabsorption) rather than changes of the emitter bandgap. The PLQY of 2:1 composition is determined to be 6.6±0.8%. The excitonic absorption peak in the film with 1:1 disappears with increasing Cs content (FIG. 7 (c)). Powder X-ray diffraction (PXRD) data shown in FIG. 7 (d) that the 2:1 thin film shows different orientation on the thin film as compared with 1:1 composition.

Figure 8:
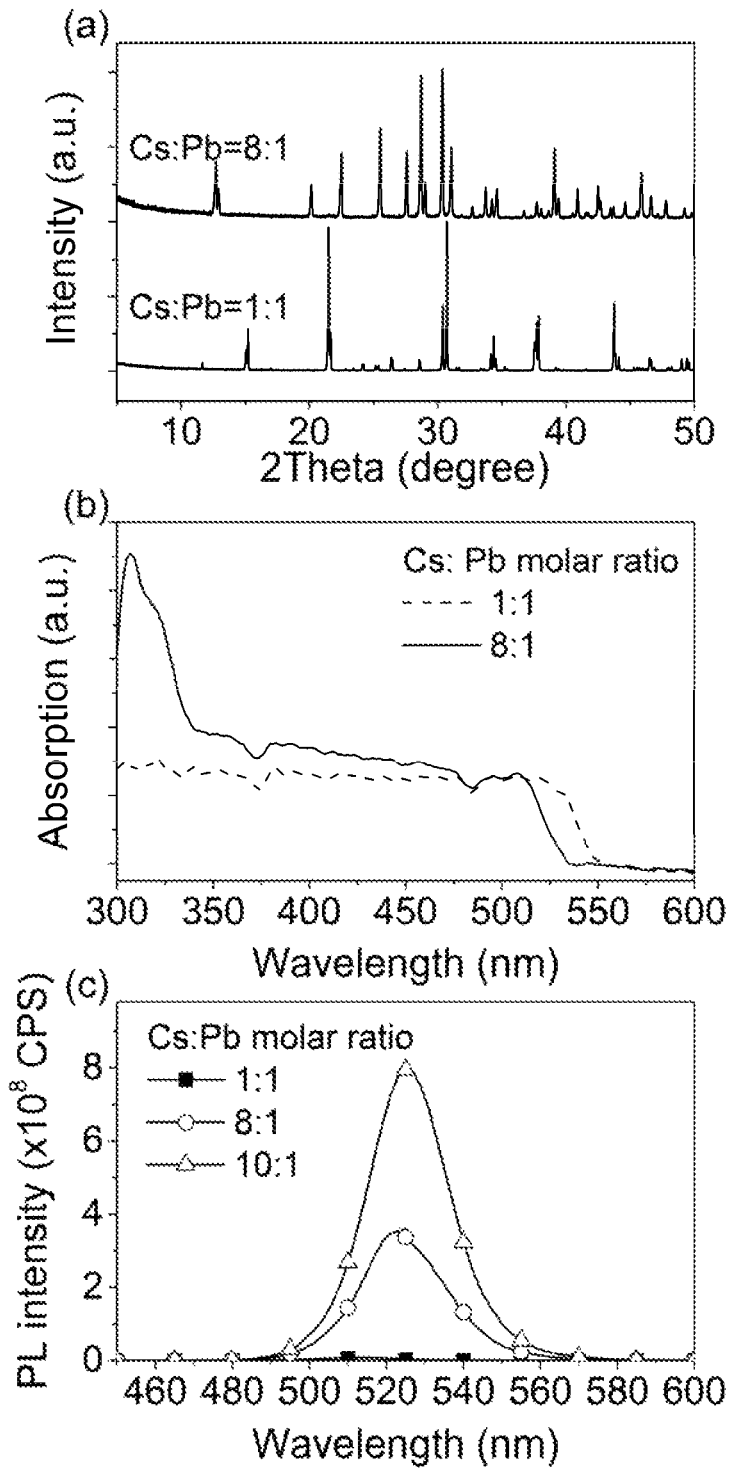
FIG. 8 shows (a) powder X-ray diffraction patterns, (b) absorption patterns and (b) steady-state photoluminescence spectra of $Cs_xPbBr_y$ produced using different Cs/Pb ratios in the A and M precursor solutions.

From these experiments, it is concluded that excess Cs (i.e. "A" site in perovskite structure) changes positively the optical properties but also modifies the crystallographic properties. FIG. 8 shows PXRD of $Cs_xPbBr_y$ crystals with different Cs:Pb molar ratios in the starting solutions, where x and y depend on CsBr content. With high Cs:Pb ratio (8:1), we clearly observe the presence of a unique diffraction peak at 2 theta=12.7° in the PXRD pattern, corresponding to a low-dimensional perovskite (zero dimensional or 0D structure) with a $K_4CdCl_6$-like structure [Saidaminov et al., *ACS Energy Letters*, 2016, 1(4), pp. 840-845]. FIG. 8 (b), shows that an excess Cs content increases the light absorption around 310 nm, which relates to a formation of 0-D $Cs_4PbBr_6$ [Yang et al., Chem. Mater. 2017, 29, pp 8978-8982], although the absorption onset regarding to three dimensional (3-D) $CsPbBr_3$ structure remains. Meanwhile, the excess Cs content enhances dramatically the photoluminescence intensity at 520 nm and the PLQY of the powders of 8:1 and 10:1 Cs:Pb ratio are determined to be 19.5±1.18% and 24.6±1.21%, respectively (FIG. 8 (c)). These results indicate that the excess Cs composition contains small 3-D $CsPbBr_3$ regions in the 0-D $Cs_4PbBr_6$ matrix [Quan et al., Adv. Mater. 2017, 29, 1605945].

Figure 9:
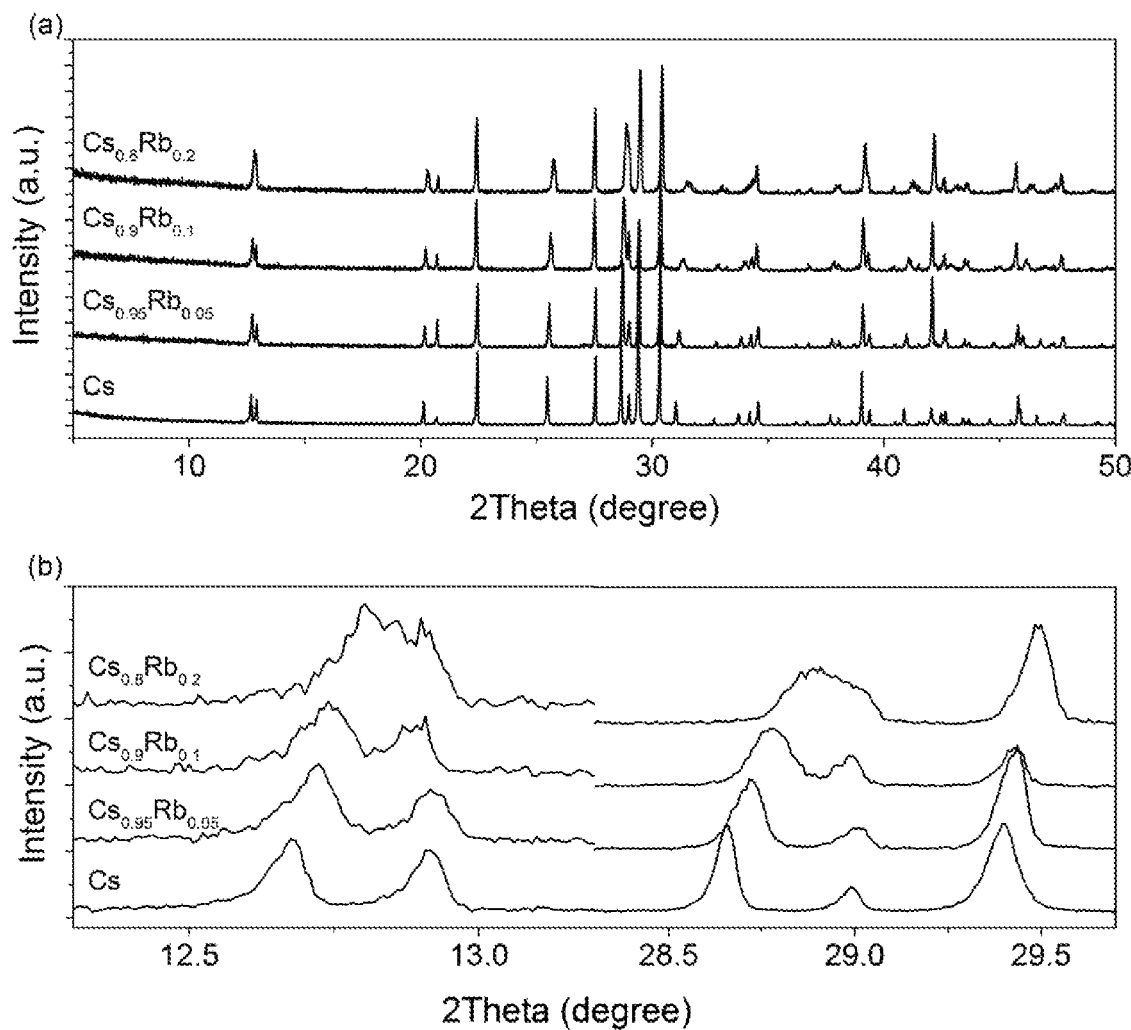
FIG. 9 shows (a) whole range powder X-ray diffraction patterns and (b) a sub-range of the X-ray reflections from $2\theta=12°$ to $13.3°$ and $28°$ to $30°$ of $(Cs_{1-x}Rb_x)_4PbBr_6$ with different Rb to Cs fractions, x.
Figure 10:
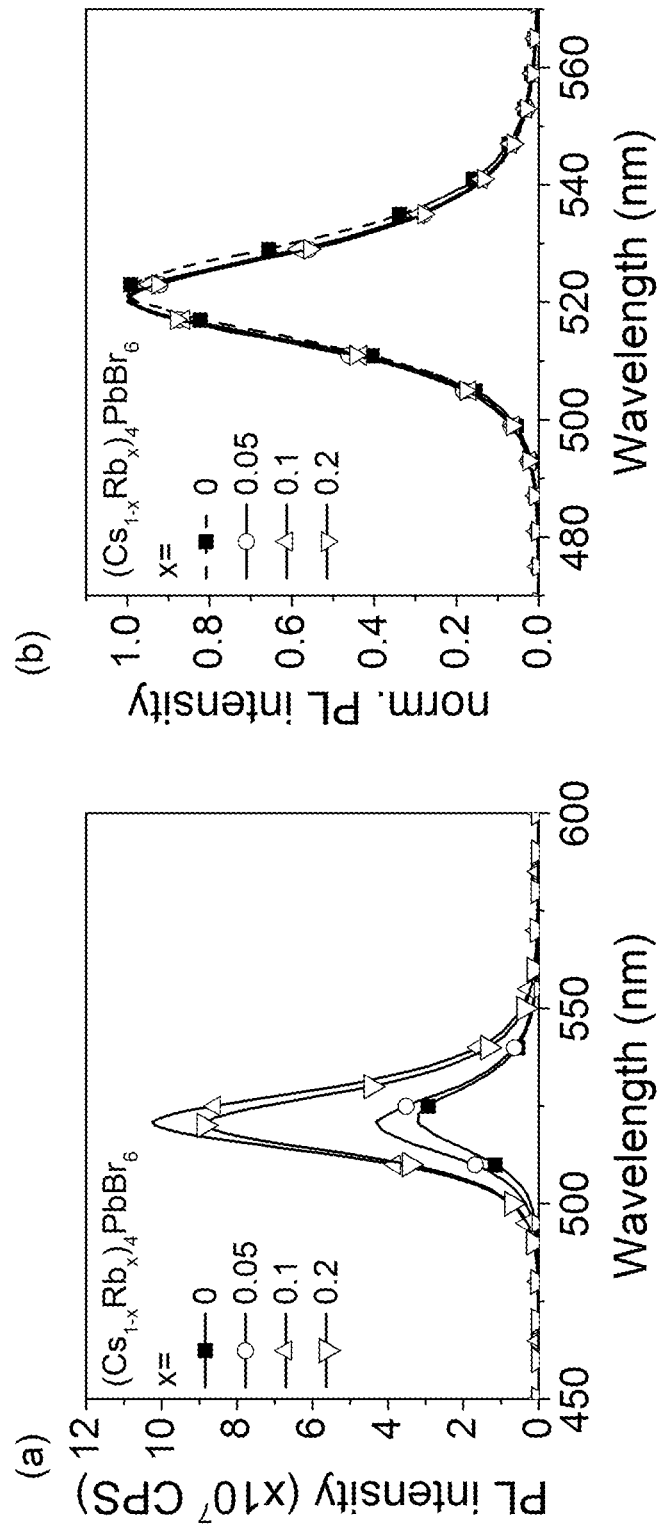
FIG. 10 shows (a) steady-state photoluminescence spectra and (b) the corresponding normalised photoluminescence spectra of $(Cs_{1-x}Rb_x)_4PbBr_6$ with different Rb concentrations.

The method of the invention was used to synthesize highly emissive perovskite crystalline powders with generic composition $(Cs_{1-x}Rb_x)_4PbBr_6$. FIG. 9 shows PXRD of $(Cs_{1-x}Rb_x)_4PbBr_6$ with low Rb content (x=0.05 to x=0.2). With incorporation of Rb into the $Cs_4PbBr_6$ crystals, the XRD pattern is seen to move to a higher 2 theta angle due to the smaller ionic radius of Rb as compared to Cs. These powders are were dispersed in a thin film (as described in 10) and their optical properties examined. FIG. 10 shows the PL emission spectra of $(Cs_{1-x}Rb_x)_4PbBr_6$ powders dispersed in a PMMA matrix. An increase in the PL intensity is seen with increasing Rb content, but no significant shift of the PL peak position. The PLQY of the dispersed films with x=0, 0.05, 0.1, and 0.2 was determined to be 78.0±4.19%, 77.6±4.88%, 92.3±4.65% and 94.3±4.88% respectively. Thus, the presence of Rb significantly increases the PLQY of the dispersed films.

Figure 16:
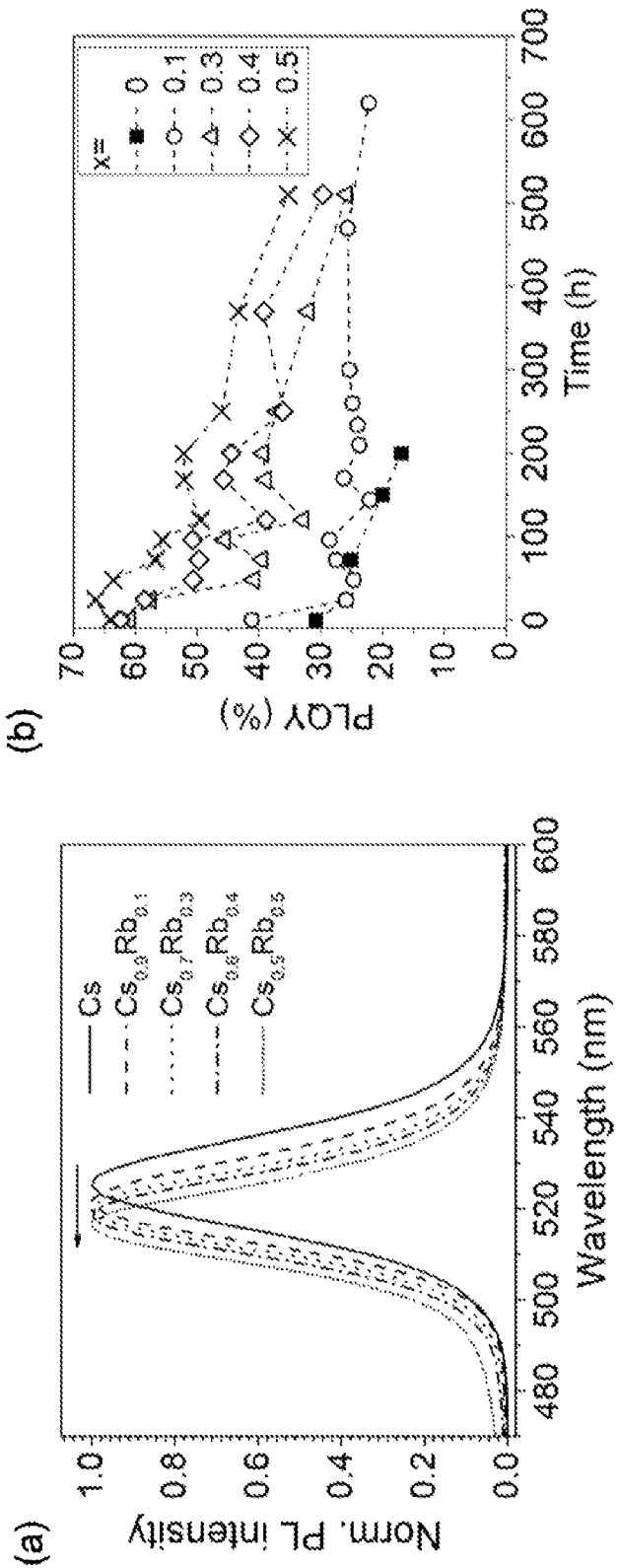
FIG. 16(a) shows the normalised steady-state photoluminescence spectra of $(Cs_{1-x}Rb_x)_4PbBr_6$ powders with differing Rb content.
FIG. 16(b) shows the PLQY of those powders, as function of exposure time under simulated sun light (76 mW·cm$^{-2}$ at 60° C.).

Although no significant shift of the photoluminescence peak is seen in the initial photoluminescence spectrum, a small shift in the photoluminescence peak position can be observed with varying Rb content in the steady state photoluminescence spectrum. FIG. 16, graph (a) shows the normalised steady-state photoluminescence spectra of $(Cs_{1-x}Rb_x)_4PbBr_6$ powders with different Rb content. As x increases from 0 to 0.5, a slight blue shift is observed.

The photostability and PLQY of the $(Cs_{1-x}Rb_x)_4PbBr_6$ powders was also tested. FIG. 16, graph (b) shows the PLQY of $(Cs_{1-x}Rb_x)_4PbBr_6$ powders, as function of exposure time under simulated sun light (76 mW·cm$^{-2}$ at 60° C.) for exposures of up to 600 hours. It is clear from this figure that the inclusion of Rb enhances dramatically the PLQY of the powders produced. Where x=0.1, the initial PLQY increases from around 30% (where x=0) to around 40%. Further, where x=0.4 or 0.5, the PLQY increases to ~65%, No drastic difference in photostability is observed for these powders, as can be seen from their similar decay over 600 hours. However, it is clear that the enhanced PLQY of the rubidium-containing powders is stable for very extended periods. For instance, after 500 hours, the PLQY of the x=0.4 and x=0.5 powders appears to still be over 30%; better than any PLQY observed in the absence of rubidium.

Figure 17:
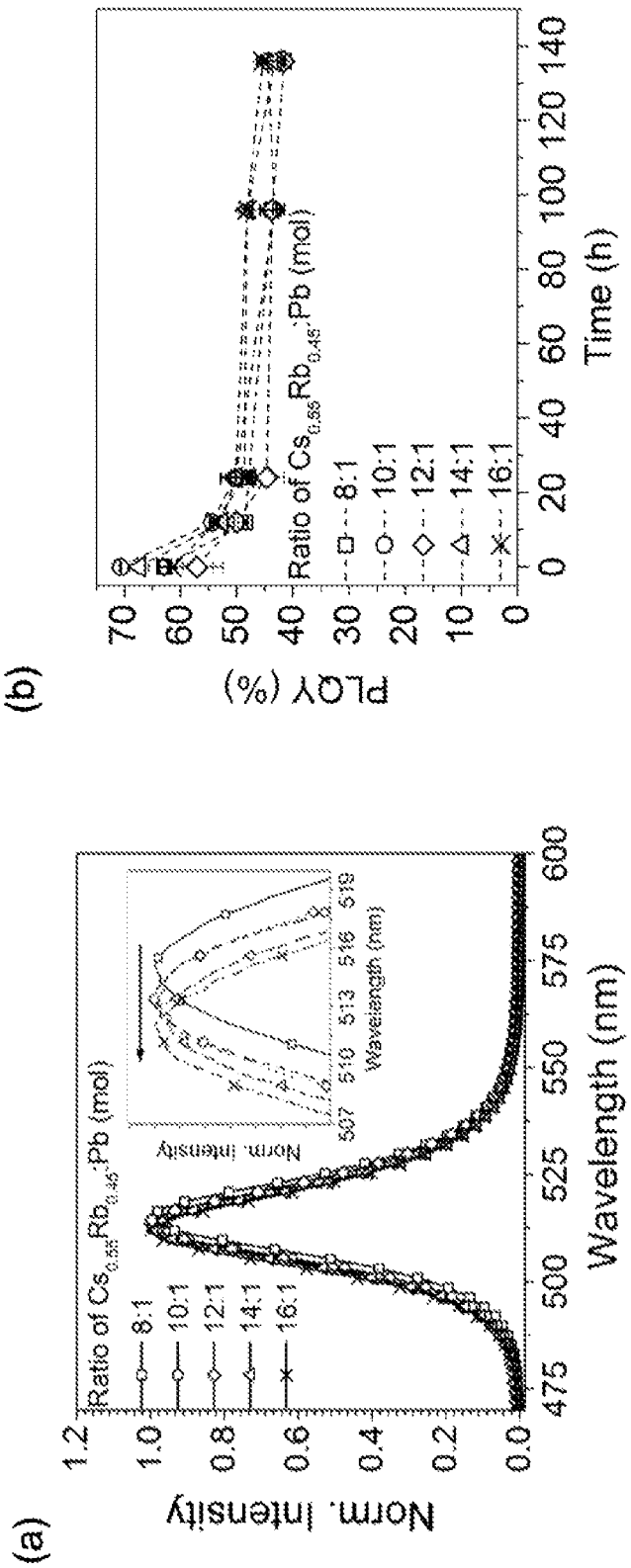
FIG. 17(a) shows the normalised steady-state photoluminescence spectra of $(Cs_{0.55}Rb_{0.45})_4PbBr_6$ powders with a differing molar ratio between [A] ($Cs^+$ and $Rb^+$) and [M] ($Pb^{2+}$).
FIG. 17(b) shows the PLQY of those powders as function of exposure time under simulated sun light (76 mW·cm$^{-2}$ at 60° C.).

The effect of varying the ratio of "A" to "M" in the $(Cs_{1-x}Rb_x)_4PbBr_6$ powders was also tested. FIG. 17, graph (a), shows the normalised steady-state photoluminescence spectra of $(Cs_{0.55}Rb_{0.45})_4PbBr_6$ powders as the molar ratio between [A] (that is, $Cs^+$ and $Rb^+$) and [M] (that is, $Pb^{2+}$) varies. It is observed that the presence of excess $(Cs_{0.55}Rb_{0.45})$ (which occupies the "A" site in perovskite structure) shifts the photoluminescence peak position to the blue, i.e. to higher energy wavelengths.

The photostability under irradiation of these structures was also tested. FIG. 17, graph (b) shows the PLQY of $(Cs_{0.55}Rb_{0.45})_4PbBr_6$ powders having differing molar ratio between [A] and [M], as function of exposure time under simulated sun light (76 mW·cm$^{-2}$ at 60° C.) for exposures of up to 140 hours. The powder with an [A]:[M] ratio of 10:1 shows the highest PLQY (~70%). This is exceptionally high. Moreover, the powders of formula $(Cs_{0.55}Rb_{0.45})_4PbBr_6$ all have very good stability under exposure to simulated sunlight. All tested powders have a PLQY exceeding about 40% even after 120 hours of exposure to simulated sunlight. The powders did not show a significant difference in photostability as the [A]:[M] ratio varied.

Figure 11:
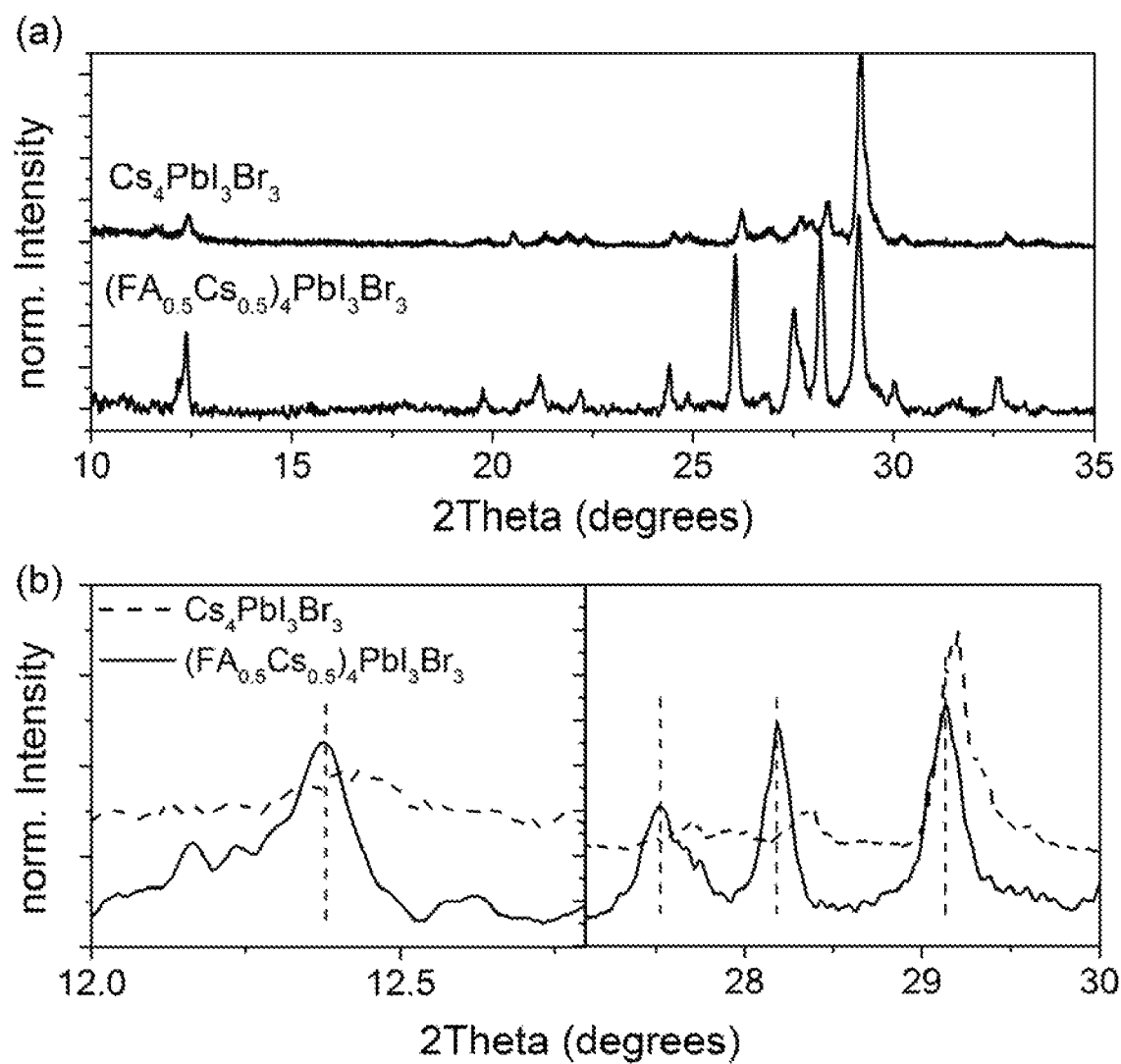
FIG. 11 shows (a) whole range powder X-ray diffraction patterns and (b) a sub-range of the X-ray reflections from $2\theta=12°$ to $13°$ and $27°$ to $30°$ of $(Cs_{1-x}FA_x)_4PbI_3Br_3$.

In another example, the method of the invention was used to prepare mixed iodide/bromide lead perovskites. These are promising semiconducting materials for both light-emitting and photovoltaic devices. $(Cs_{1-x}FA_x)_4PbI_3Br_3$ compositions (where FA is formamidinium $CH_2(NH_2)_2^+$) were fabricated in this instance. These materials present a bandgap in the red region of the visible spectrum. FIG. 11 shows the PXRD patterns of $(Cs_{1-x}FA_x)_4PbI_3Br_3$. Similar to $Cs_4PbBr_6$, it was observed that the iodide-containing compositions also form vacancy-ordered perovskites with a $K_4CdCl_6$-like structure. On incorporation of FA into $Cs_4PbI_3Br_3$, a shift in the PXRD pattern shift towards lower angles was observed, which is consistent with the incorporation of the larger ionic radius cation (i.e. FA) into the lattice to form an homogeneous material.

Figure 12:
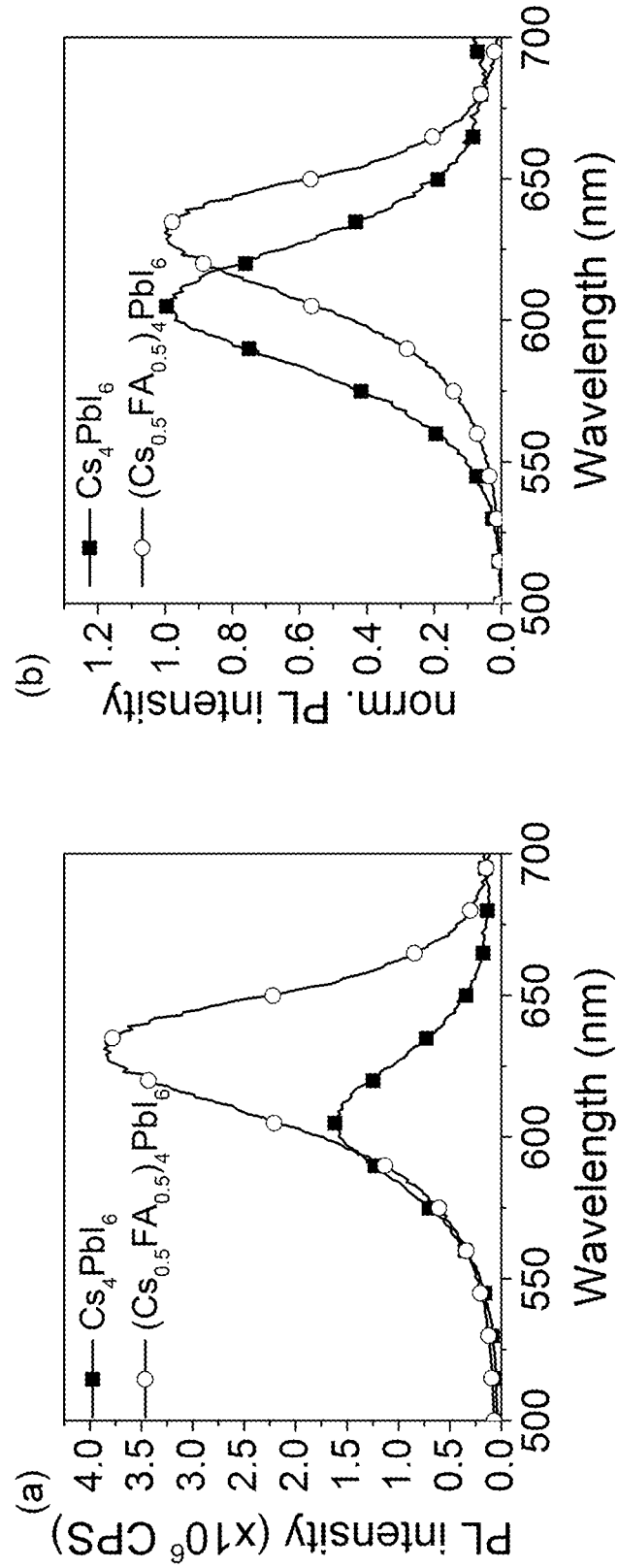
FIG. 12 shows (a) steady-state photoluminescence spectra and (b) the corresponding normalised photoluminescence spectra of $(Cs_{1-x}FA_x)_4PbI_3Br_3$.

FIG. 12 shows the PL emission spectra of $(Cs_{1-x}FA_x)_4PbI_3Br_3$ crystalline powders dispersed in a PMMA matrix. Incorporating FA increases the PL intensity and induces is a red shift in the PL peak position consistent with the decrease of the bandgap related to the increase of the crystalline lattice.

The method of the invention can produce crystalline A/M/X material of formula $[A]_a[M]_b[X]_c$, with excellent control over the stoichiometry of the product. This method therefore has the advantages of producing reduced side-products, and hence a purer product. To illustrate this, various products of formula $[A]_4[M][X]_6$ were produced by the method of the invention, and also by a corresponding method wherein the M precursor was provided in an aqueous solvent rather than an organic solvent. The resulting products were analysed and compared.

Figure 18:
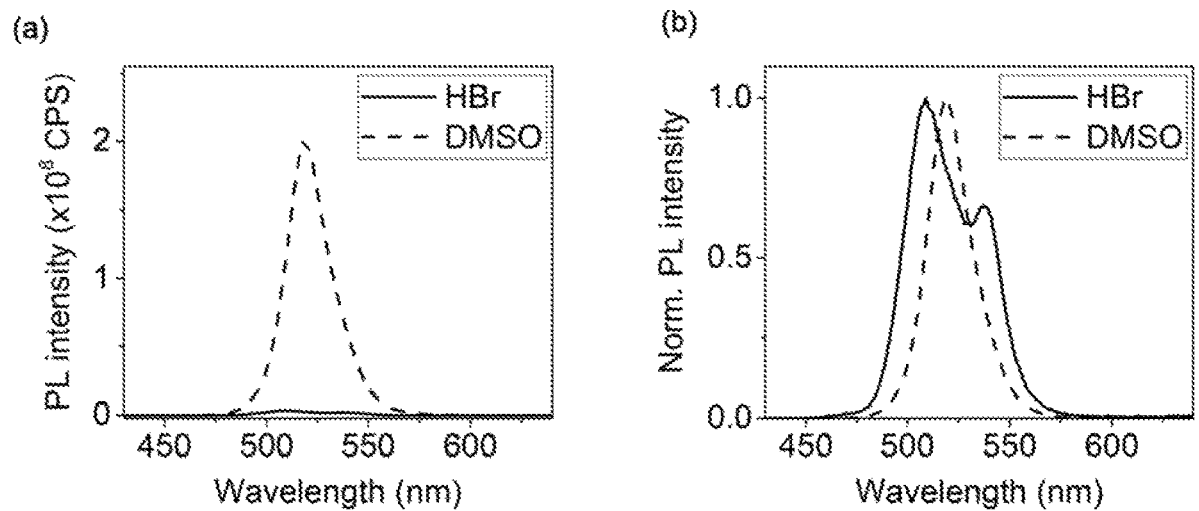
FIG. 18 shows steady-state photoluminescence spectra of $Cs_4PbBr_6$ powders obtained via different synthetic routes.

FIG. 18 (graph (a)) shows steady-state photoluminescence spectra of $Cs_4PbBr_6$ powders obtained via the method of the invention and by an alternative method as mentioned above. FIG. 18 (graph (b)) shows the same spectra, normalised. It is clear from FIG. 18(a) that the method of the invention leads to a product with a much higher photoluminescence intensity. The normalised spectrum of $Cs_4PbBr_6$ powders synthesised by the alternative method shows that the spectrum of the product produced by the alternative method in fact presents a split peak. One maximum is seen at 510 nm and another at 540 nm. By contrast, $Cs_4PbBr_6$ powders synthesised by the method of the invention show a single peak. It is clear therefore that the method of the invention permits finer control over the stoichiometry of the product, and hence a product with improved optical properties.

Figure 19:
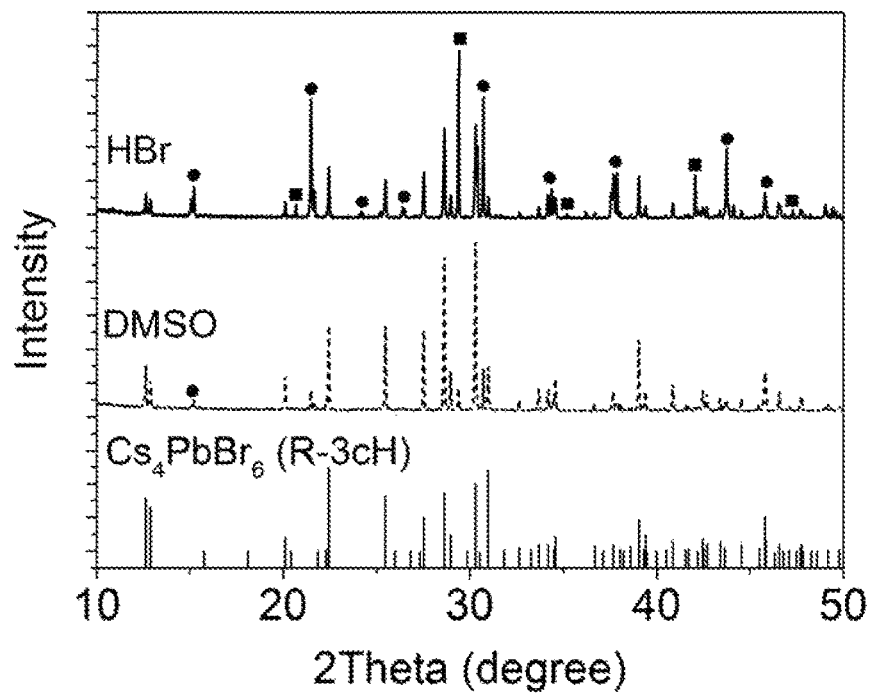
FIG. 19 shows X-ray diffraction patterns of $Cs_4PbBr_6$ powders. The middle spectrum is the spectrum of a $Cs_4PbBr_6$ powder obtained by the method of the invention wherein DMSO was used as the solvent for the lead precursor; the top spectrum is the spectrum of a $Cs_4PbBr_6$ powder obtained by a method wherein hydrobromic acid was used as the solvent for the lead precursor; and the bottom spectrum is the calculated X-ray diffraction spectrum of $Cs_4PbBr_6$ in space group R-3cH.

The products of the differing synthesis were also analysed by X-ray diffraction, as shown in FIG. 19. The uppermost trace shows the X-ray diffraction pattern of $Cs_4PbBr_6$ powders synthesised by the alternative method, wherein the M precursor was initially provided in aqueous hydrobromic acid. The middle trace shows the X-ray diffraction of the product produced by the method of the invention, wherein the M precursor was provided in an organic solvent, DMSO. The bottom trace is the calculated trace for $Cs_4PbBr_6$ in space group R-3cH. In each trace, circles represent an X-Ray diffraction peak position of $CsPbBr_3$ in orthorhombic structure while squares represent an X-ray diffraction peak position of CsBr.

Both synthetic routes generate $Cs_4PbBr_6$. However, powders synthesised by the method of the invention contain mainly $Cs_4PbBr_6$, but there is a small peak, which can be assigned to $CsPbBr_3$. On the other hand, $Cs_4PbBr_6$ powders synthesised using a hydrobromic acid solution containing lead additionally contain X-ray diffraction peaks which can be assigned to CsBr and $CsPbBr_3$. In particular, the peak intensity and number of peaks related to $CsPbBr_3$ observed in the powder product synthesised by the alternative method increase drastically in comparison with that synthesised by the method of the invention.

Figure 20:
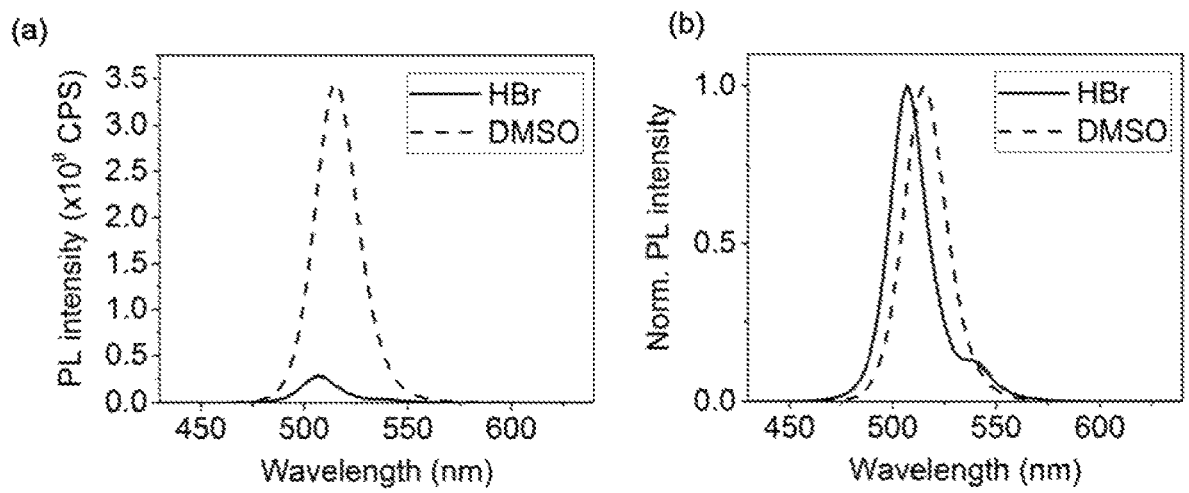
FIG. 20 shows steady-state photoluminescence spectra of $(Cs_{0.55}Rb_{0.45})_4PbBr_6$ powders obtained by different synthetic routes.

Powders of formula $[A]_4[M][X]_6$ containing both Rb and Cs A species were also synthesised by the method of the invention and by an alternative method using a hydrobromic acid solvent in place of DMSO. The steady-state photoluminescence spectra of the products, $(Cs_{0.55}Rb_{0.45})_4PbBr_6$ powders, are shown in FIG. 20. The spectra in FIG. 20(b) are normalised; those in FIG. 20(a) are not. It is clear from FIG. 20(a) that the method of the invention leads to a substantial increase in the photoluminescence intensity of the product, compared to the product produced by the alternative method. The normalised steady-state photoluminescence spectra of $(Cs_{0.55}Rb_{0.45})_4PbBr_6$ powders synthesised by the alternative method presents a split peak with maxima at 510 nm and 540 nm, whereas $Cs_4PbBr_6$ powders synthesised by the method of the invention present a single peak at 515 nm.

Figure 21:
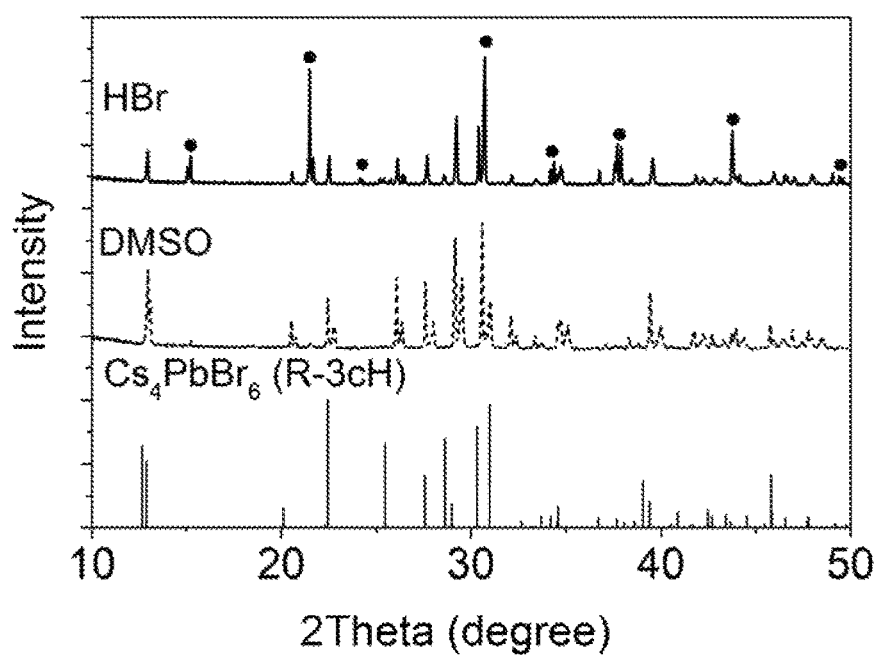
FIG. 21 shows X-ray diffraction patterns of $(Cs_{0.55}Rb_{0.45})_4PbBr_6$ powders. The middle spectrum is the spectrum of a $(Cs_{0.55}Rb_{0.45})_4PbBr_6$ powder obtained by the method of the invention wherein DMSO was used as the solvent for the lead precursor; the top spectrum is the spectrum of a $(Cs_{0.55}Rb_{0.45})_4PbBr_6$ powder obtained by a method wherein hydrobromic acid was used as the solvent for the lead precursor; and the bottom spectrum is the calculated X-ray diffraction spectrum of $Cs_4PbBr_6$ in space group R-3cH.

The X-ray diffraction patterns of $(Cs_{0.55}Rb_{0.45})_4PbBr_6$ powders synthesised using the method of the invention, and an alternative method, were also obtained. These are shown in FIG. 21. The powder produced by the method of the invention appears in the middle spectrum, and the powder produced by the alternative method using an aqueous hydrobromic acid solvent for the lead species is shown in the top spectrum. Also marked, in the bottom spectrum, is the X-ray diffraction pattern calculated for $Cs_4PbBr_6$ (bottom) in space group R-3cH. Also marked are the X-ray diffraction peak positions of $CsPbBr_3$ in orthorhombic structure, marked with filled-in circles.

It is clear from comparing the two experimental spectra in FIG. 21 that both synthetic routes generate $(Cs_{0.55}Rb_{0.45})_4PbBr_6$. $(Cs_{0.55}Rb_{0.45})_4PbBr_6$ powders synthesised by the method of the invention (with DMSO as the solvent of the M precursor) shows the diffraction pattern attributed to $Cs_4PbBr_6$ only, indicating that the product is produced with very few side-reactions and side-products. On the other hand, $(Cs_{0.55}Rb_{0.45})_4PbBr_6$ powders synthesised by the alternative method contain diffraction peaks which can be assigned as $CsPbBr_3$. Notably, the diffraction peak for the "excess" A site (low dimensional perovskites) is absent on the powders synthesised by the alternative method.

Figure 22:
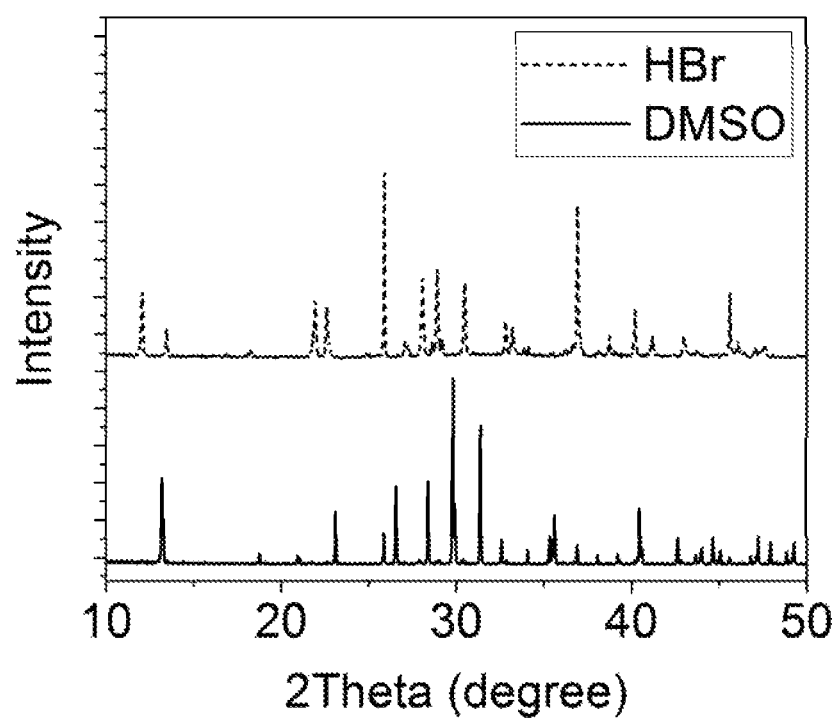
FIG. 22 shows X-ray diffraction patterns of $Rb_4PbBr_6$ powders. The top spectrum is the spectrum of an $Rb_4PbBr_6$ powder obtained by the method of the invention wherein DMSO was used as the solvent for the lead precursor; the bottom spectrum is the spectrum of a $Rb_4PbBr_6$ powder obtained by a method wherein hydrobromic acid was used as the solvent for the lead precursor.

Powders of formula $Rb_4PbBr_6$ containing were also synthesised by the method of the invention and by an alternative method using a hydrobromic acid solvent in place of DMSO. The X-ray diffraction patterns of powders synthesised by each method are shown in FIG. 22. The X-ray diffraction pattern of the powder produced by the method of the invention can be attributed to $Rb_4PbBr_6$. The X-ray diffraction pattern of the product of the alternative method could not be fitted. However, it differs significantly from the $Rb_4PbBr_6$ pattern observed in the product of the method of the invention.

The inventors have appreciated that the stoichiometry of the A/M/X material produced by the method of the invention may depend not only on the molar ratio of [A], [M] and [X] initially supplied but may also be influenced by the choice of solvent in the [M] precursor. This is illustrated by FIGS. 19 and 21, which show that the solvent used in the method of the invention may have an effect on the specific A/M/X crystalline material produced. For instance, it is clear from the above that $[A][M][X]_3$ readily forms when DMF is used as the organic solvent for the M precursor in the formation of lead halide perovskites containing Rb and/or Cs as [A]. However, where DMSO is used, and the appropriate molar ratio of [A]:[M] is provided, the method of the invention favours the $[A]_4[M][X]_6$ structure. That is clear from the "DMSO" traces in FIGS. 19 and 21, which show that little $[A][M][X]_3$ is present and that $[A]_4[M][X]_6$ is the major product. Thus, the stoichiometry of the A/M/X material produced by the method of the invention may be tuned by the choice of solvent. The skilled person is readily able to select different solvents for the purpose of tuning stoichiometry, and producing particular desired A/M/X materials, in light of the information presented herein.

The invention claimed is:

1. A process for producing a crystalline A/M/X material, which crystalline A/M/X material comprises a compound of formula:

$$[A]_a[M]_b[X]_c$$

wherein:
[A] comprises one or more A cations, wherein each A cation is selected from $(H_2N-C(H)=NH_2)^+$, an alkali metal cation, $C_{1-10}$ alkylammonium, $C_{2-10}$ alkenylammonium, $C_{1-10}$ alkyliminium, $C_{3-10}$ cycloalkylammonium and $C_{3-10}$ cycloalkyliminium optionally substituted with one or more substituents selected from amine, $C_{1-6}$ alkylamine, imine, $C_{1-6}$ alkylimine, $C_{1-6}$ alkyl, $C_{2-6}$ alkenyl, $C_{3-6}$ cycloalkyl and $C_{6-12}$ aryl;
[M] comprises one or more M cations which are metal or metalloid cations, wherein each M cation is selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Li^+$, $Na^+$, $K^+$, $Rb^+$, $Cs^+$, $Cu^+$, $Ag^+$, $Au^+$, $Hg^+$, $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$;
[X] comprises one or more X anions, wherein each X anion is selected from $F^-$, $Cl^-$, $Br^-$ and $I^-$;
a is a number from 1 to 6;
b is a number from 1 to 6; and
c is a number from 1 to 18,
the process comprising:
a) contacting an aqueous solution comprising an A precursor and an aqueous solvent with an organic solution comprising an M precursor and an organic solvent, wherein the organic solution comprises a hydrohalic acid; and
b) allowing a precipitate to form when the said aqueous and organic solutions are contacted,
wherein the process further comprises producing an optoelectronic device comprising the crystalline A/M/X material, and wherein the optoelectronic device is a light-emitting device.

2. A process according to claim 1 which is a process for preparing a thin film of said crystalline A/M/X material, the process further comprising:
c) optionally washing the precipitate;
d) dissolving the precipitate in an organic solvent to form a film-forming solution; and
e) dispersing the film-forming solution on a substrate,
wherein said optoelectronic device is an optoelectronic device comprising the thin film of the crystalline A/M/X material.

3. A process according to claim 1 which is a process for preparing a thin film of said crystalline A/M/X material, the process further comprising:
c') optionally washing the precipitate;
d') vapourising the precipitate; and
e') depositing the vapourised precipitate on a substrate,
wherein said optoelectronic device is an optoelectronic device comprising the thin film of the crystalline A/M/X material.

4. A process according to claim 1 wherein said one or more A cations are monocations and said one or more M cations are dications.

5. A process according to claim 1 wherein the compound of formula $[A]_a[M]_b[X]_c$ is a compound of formula $[A][M][X]_3$ or $[A]_2[M][X]_6$.

6. A process according to claim 1 wherein the crystalline A/M/X material comprises two or more compounds of formula $[A]_a[M]_b[X]_c$.

7. A process according to claim 1 wherein [A] comprises two or more different A cations.

8. A process according to claim 7 wherein the process comprises, prior to step (a), preparing the aqueous solution by combining a solution of a first A precursor with a solution of a second A precursor,
wherein:
the first A precursor comprises a first A cation; and
the second A precursor comprises a second A cation.

9. A process according to claim 1 wherein [X] comprises two or more different X anions.

10. A process according to claim 9 wherein the process comprises, prior to step (a), preparing the organic solution by combining a solution of a first M precursor with a solution of a second M precursor,
wherein:
the first M precursor comprises a first X anion; and
the second M precursor comprises a second X anion.

11. A process according to claim 1 wherein the organic solution comprises a hydrohalic acid of formula HX', wherein X' is one of the X anions.

12. A process according to claim 1 wherein each A cation is selected from $Cs^+$, $Rb^+$, $(H_2N-C(H)=NH_2)^+$, methylammonium, ethylammonium, propylammonium, butylammonium, pentylammoium, hexylammonium, septylammonium, octylammonium, and guanidinium.

13. A process according to claim 1 wherein each A precursor is a halide salt of the A cation or one of the A cations, and/or each M precursor is a halide salt of the M cation or one of the M cations.

14. A process according to claim 1 wherein each metal or metalloid M cation is selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$.

15. A process according to claim 1 wherein each X anion is selected from $I^-$ and $Br^-$.

16. A process according to claim 1 wherein the organic solvent in the organic solution comprises a polar organic solvent.

17. A process according to claim 1 wherein the organic solvent of step (d) comprises a polar solvent.

18. A process according to claim 2 wherein the process further comprises:
   f) removing the organic solvent from the film-forming solution on the substrate.

19. A process according to claim 1 wherein the optoelectronic device is a light emitting diode or a charge injection laser.

20. A process according to claim 1 wherein the optoelectronic device is an optoelectronic device wherein the crystalline A/M/X material functions as a phosphor.

21. A process according to claim 20 wherein the optoelectronic device is a display screen or a solid-state lighting device.

22. A process for producing a crystalline A/M/X material, which crystalline A/M/X material comprises a compound of formula:

$$[A]_a[M]_b[X]_c$$

wherein:
   [A] comprises one or more A cations, wherein each A cation is selected from $(H_2N-C(H)=NH_2)^+$, an alkali metal cation, $C_{1-10}$ alkylamammonium, $C_{2-10}$ alkenylammonium, $C_{1-10}$ alkyliminium, $C_{3-10}$ cycloalkylamammonium and $C_{3-10}$ cycloalkyliminium optionally substituted with one or more substituents selected from amine, $C_{1-6}$ alkylamine, imine, $C_{1-6}$ alkylimine, $C_{1-6}$ alkyl, $C_{2-6}$ alkenyl, $C_{3-6}$ cycloalkyl and $C_{6-12}$ aryl;
   [M] comprises one or more M cations which are metal or metalloid cations, wherein each M cation is selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Li^+$, $Na^+$, $K^+$, $Rb^+$, $Cs^+$, $Cu^+$, $Ag^+$, $Au^+$, $Hg^+$, $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Ir^{3+}$ and $Au^{3+}$;
   [X] comprises one or more X anions, wherein each X anion is selected from $F^-$, $Cl^-$, $Br^-$ and $I^-$;
   a is a number from 1 to 6;
   b is a number from 1 to 6; and
   c is a number from 1 to 18,
   the process comprising:
   a) contacting an aqueous solution comprising an A precursor and an aqueous solvent with an organic solution comprising an M precursor and an organic solvent, wherein the organic solution comprises a hydrohalic acid; and
   b) allowing a precipitate to form when the said aqueous and organic solutions are contacted,
   and wherein the process further comprises using the crystalline A/M/X material as a photo-emitter or as a phosphor.

23. A process according to claim 1 wherein each metal or metalloid M cation is $Pb^{2+}$.

24. A process according to claim 1 wherein the organic solvent in the organic solution comprises DMF.

25. A process according to claim 1 wherein the organic solvent of step (d) comprises DMSO and/or DMF.

* * * * *